United States Patent [19]

Ready et al.

[11] Patent Number: 4,597,107
[45] Date of Patent: Jun. 24, 1986

[54] MODULATION DETECTOR AND CLASSIFIER

[75] Inventors: Patrick J. Ready, Woodland Hills; Douglas R. Anderson, Van Nuys, both of Calif.

[73] Assignee: PSR Products, Inc., Los Angeles, Calif.

[21] Appl. No.: 481,236

[22] Filed: Apr. 1, 1983

[51] Int. Cl.$^4$ .................................................. H04B 17/00
[52] U.S. Cl. .................................... 455/226; 364/484
[58] Field of Search ............... 364/484, 485; 73/579, 73/602, 659; 324/77 B, 77 E, 77 R; 455/226, 67; 375/10

[56] References Cited

U.S. PATENT DOCUMENTS

| | | | |
|---|---|---|---|
| 3,112,452 | 11/1963 | Kirkpatrick | 328/167 |
| 3,688,197 | 8/1972 | Kahn | 455/142 |
| 3,746,180 | 7/1973 | Spiroch et al. | 211/113 |
| 3,829,132 | 8/1974 | Willeme | 281/31 |
| 3,876,946 | 4/1975 | La Clair et al. | 364/485 |
| 3,883,726 | 5/1975 | Schmidt | 324/77 B |
| 3,987,422 | 10/1976 | Yanagidaira et al. | 375/10 |
| 4,045,796 | 8/1977 | Kline, Jr. | 343/6.5 |
| 4,054,881 | 10/1977 | Raab | 343/112 |
| 4,057,756 | 11/1977 | Ley et al. | 324/77 B |
| 4,058,713 | 11/1977 | DiTere | 354/728 |
| 4,085,367 | 4/1978 | Williams et al. | 325/67 |
| 4,085,368 | 4,1978 | Yeh | 325/304 |
| 4,086,504 | 4/1978 | Exell et al. | 340/15.5 |
| 4,137,497 | 1/1979 | Lowenschuss | 364/484 |
| 4,166,980 | 9/1979 | Apostolos et al. | 455/226 |
| 4,167,529 | 9/1979 | Wideman | 585/274 |
| 4,204,165 | 5/1980 | Ready | 364/485 |
| 4,217,586 | 8/1980 | McGuffin | 343/100 |
| 4,227,255 | 10/1980 | Carrick et al. | 455/226 |
| 4,238,744 | 12/1980 | Iwahara | 324/77 E |
| 4,247,939 | 1/1981 | Stromswold et al. | 375/1 |
| 4,247,949 | 1/1981 | Watanabe et al. | 307/264 |
| 4,253,067 | 2/1981 | Caples et al. | 329/110 |
| 4,255,791 | 3/1981 | Martin | 364/514 |
| 4,270,209 | 5/1981 | Albanese | 364/485 |
| 4,287,475 | 9/1981 | Eaton et al. | 328/167 |
| 4,290,140 | 9/1981 | Malm | 375/46 |
| 4,303,979 | 12/1981 | Kato et al. | 364/485 |
| 4,309,769 | 1/1982 | Taylor, Jr. | 375/1 |
| 4,312,251 | 2/1982 | Raab | 343/112 |
| 4,313,183 | 1/1982 | Saylors | 367/128 |
| 4,313,197 | 1/1982 | Maxemchuk | 370/111 |
| 4,317,204 | 2/1982 | Gordy | 375/1 |
| 4,320,514 | 3/1982 | Haskell | 375/1 |
| 4,325,138 | 4/1982 | Zschelle, Jr. | 375/1 |
| 4,328,548 | 5/1982 | Crow | 364/449 |
| 4,328,591 | 5/1982 | Baghdady | 328/165 |
| 4,330,687 | 5/1982 | Foulkes | 179/2 |
| 4,333,080 | 6/1982 | Collins | 343/17.2 |
| 4,333,150 | 6/1982 | Matty et al. | 364/484 |
| 4,338,579 | 7/1982 | Rhodes | 332/21 |
| 4,344,675 | 8/1982 | Shi-Kay Yao | 350/353 |
| 4,346,384 | 8/1982 | Raab | 343/112 |
| 4,346,475 | 8/1982 | Alexis | 375/1 |
| 4,351,064 | 9/1982 | Ewanus | 455/29 |
| 4,355,399 | 10/1982 | Timor | 375/1 |
| 4,355,407 | 10/1982 | Mueller | 375/91 |
| 4,355,869 | 10/1982 | Yao | 350/358 |
| 4,357,610 | 11/1982 | Klagston | 343/12 |
| 4,357,709 | 11/1982 | Butler | 455/20 |
| 4,358,844 | 11/1982 | Pirani | 370/18 |
| 4,361,891 | 11/1982 | Lobenstein | 375/1 |
| 4,363,138 | 12/1982 | Franklin | 455/226 |
| 4,365,327 | 12/1982 | Caelt | 370/18 |
| 4,369,443 | 1/1983 | Giallanza | 340/825.47 |
| 4,383,323 | 5/1983 | Timor | 375/1 |
| 4,426,648 | 1/1984 | Tsui et al. | 327/77 B |
| 4,438,504 | 3/1984 | Favin | 364/484 |

OTHER PUBLICATIONS

IEEE Transactions, Communications.
Viterbi, Principles of Digital Communication and Coding.
Dixon, Spread Spectrum Systems.
Hellstrom, Statistical Theory of Signal Detection.

Primary Examiner—Parshotam S. Lall
Assistant Examiner—Heather R. Herndon
Attorney, Agent, or Firm—John E. Wagner

[57] ABSTRACT

A signal detector and classifier for signals having inherent event periodicity such as digital modulations. Basically, the invention involves passing a band of frequencies through a plurality of paths of different or variable delay, combining pairs of bands having different delay, Fourier transforming or filtering the results of the combining to produce signals having magnitudes and phases related to received signal content. Frequency, symbol rate, and symbol phase are determined. Similar stages may be cascaded to detect higher orders of modulation. The invention also detects hybrid modulation. Interstage filtering of decreasing bandwidth enhances the performance of this invention. Novel ambiguity transform circuits are disclosed.

62 Claims, 18 Drawing Figures

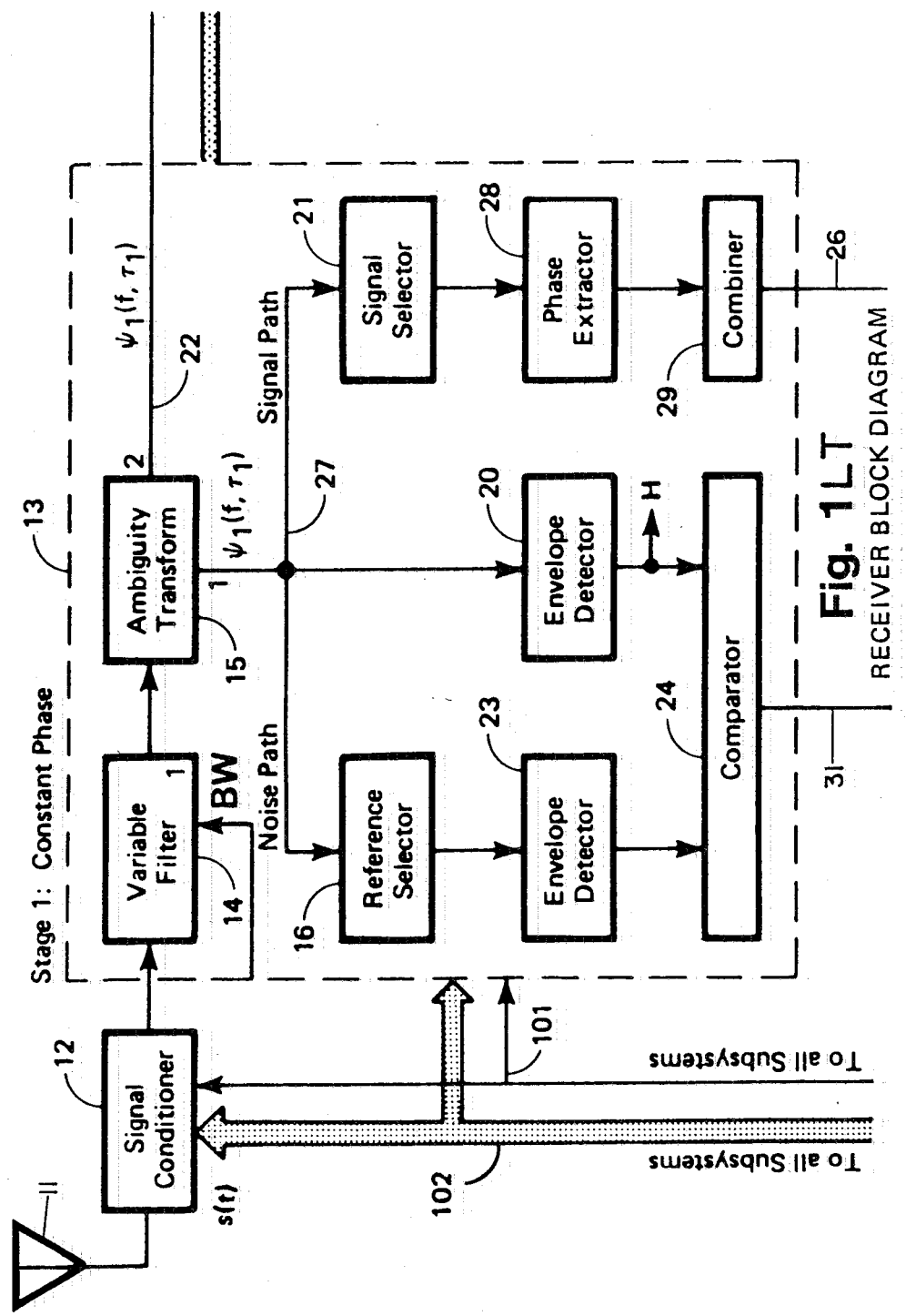

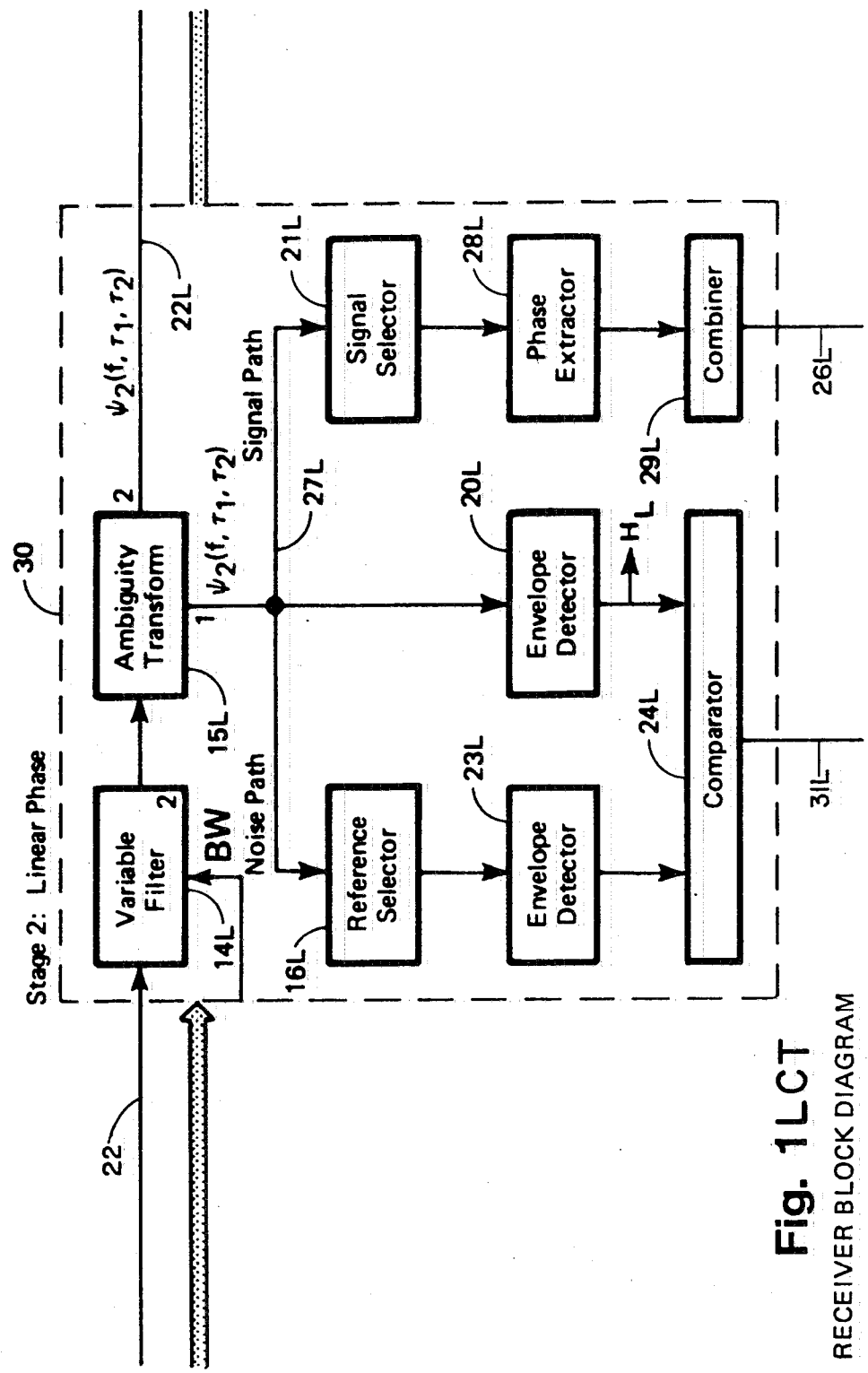
Fig. 1LCT RECEIVER BLOCK DIAGRAM

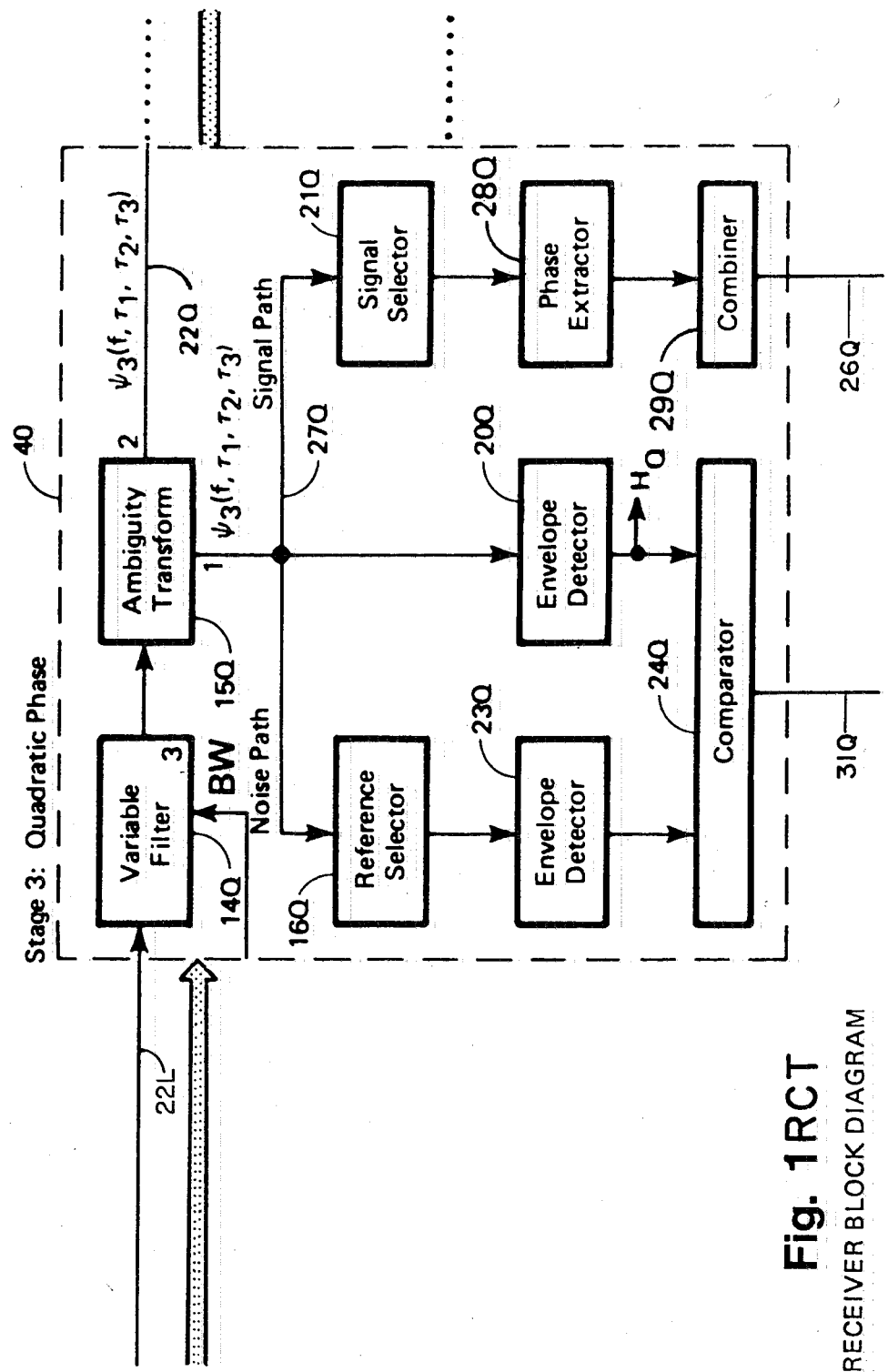
Fig. 1RCT
RECEIVER BLOCK DIAGRAM

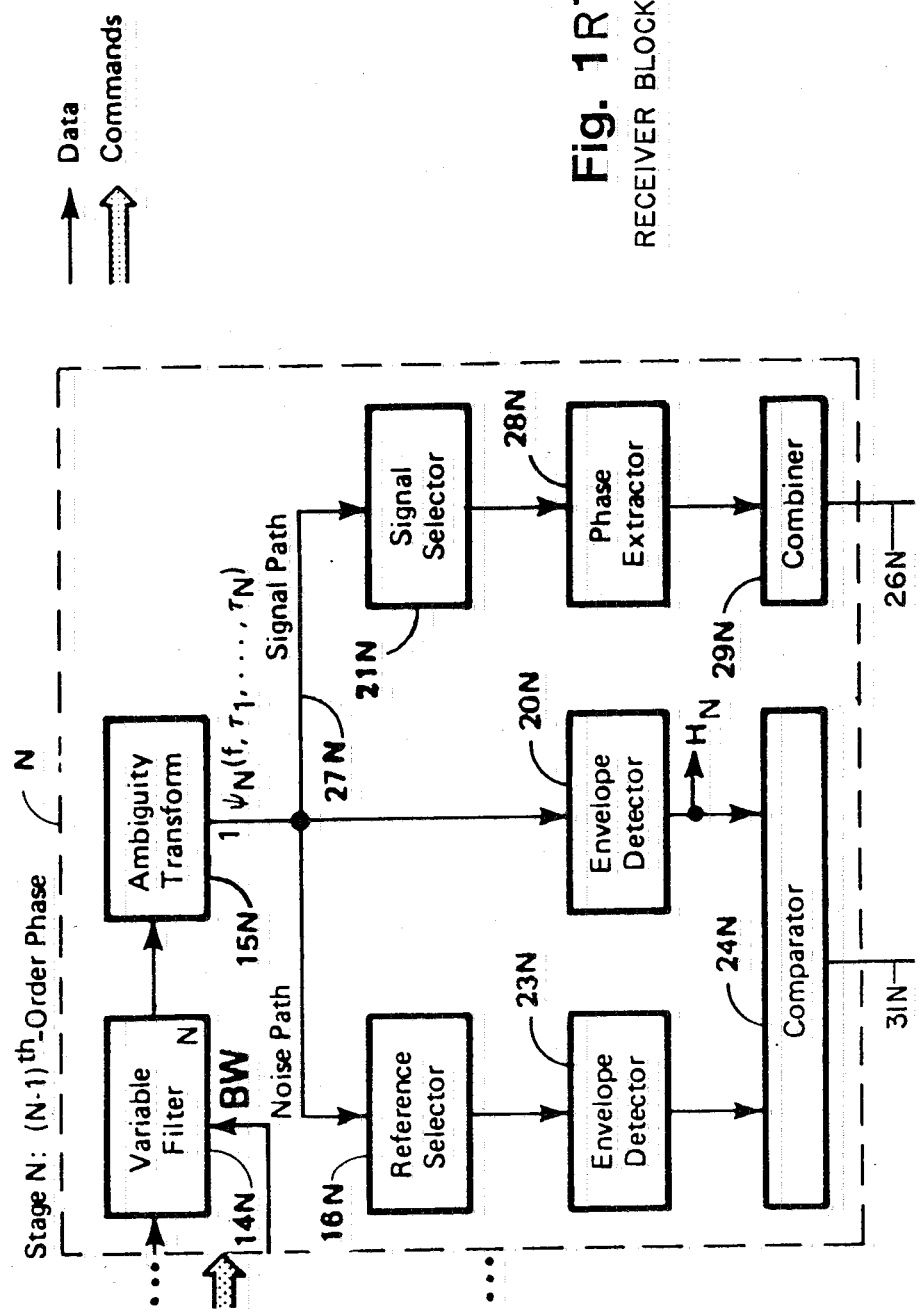
Fig. 1RT  RECEIVER BLOCK DIAGRAM

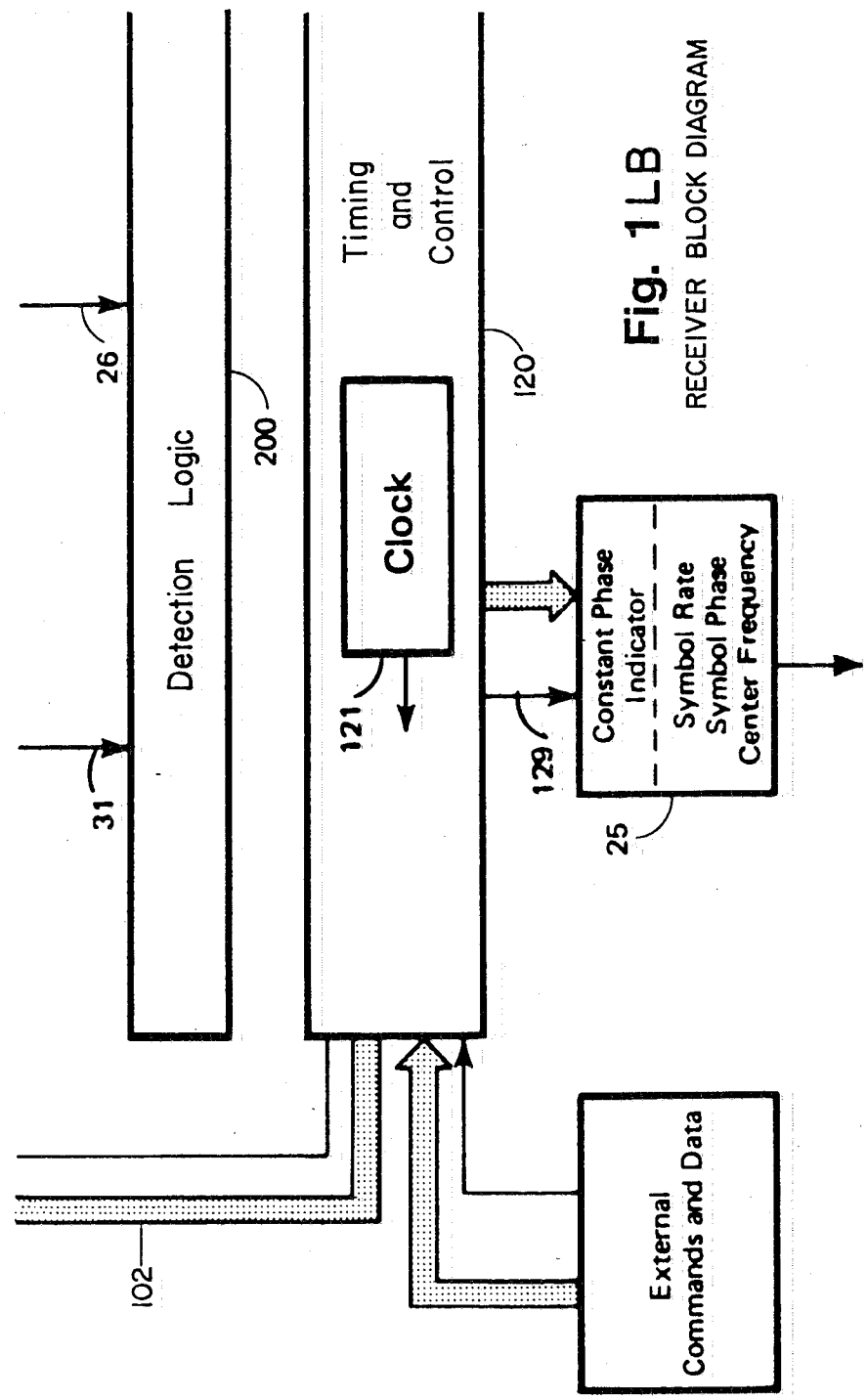
Fig. 1LB RECEIVER BLOCK DIAGRAM

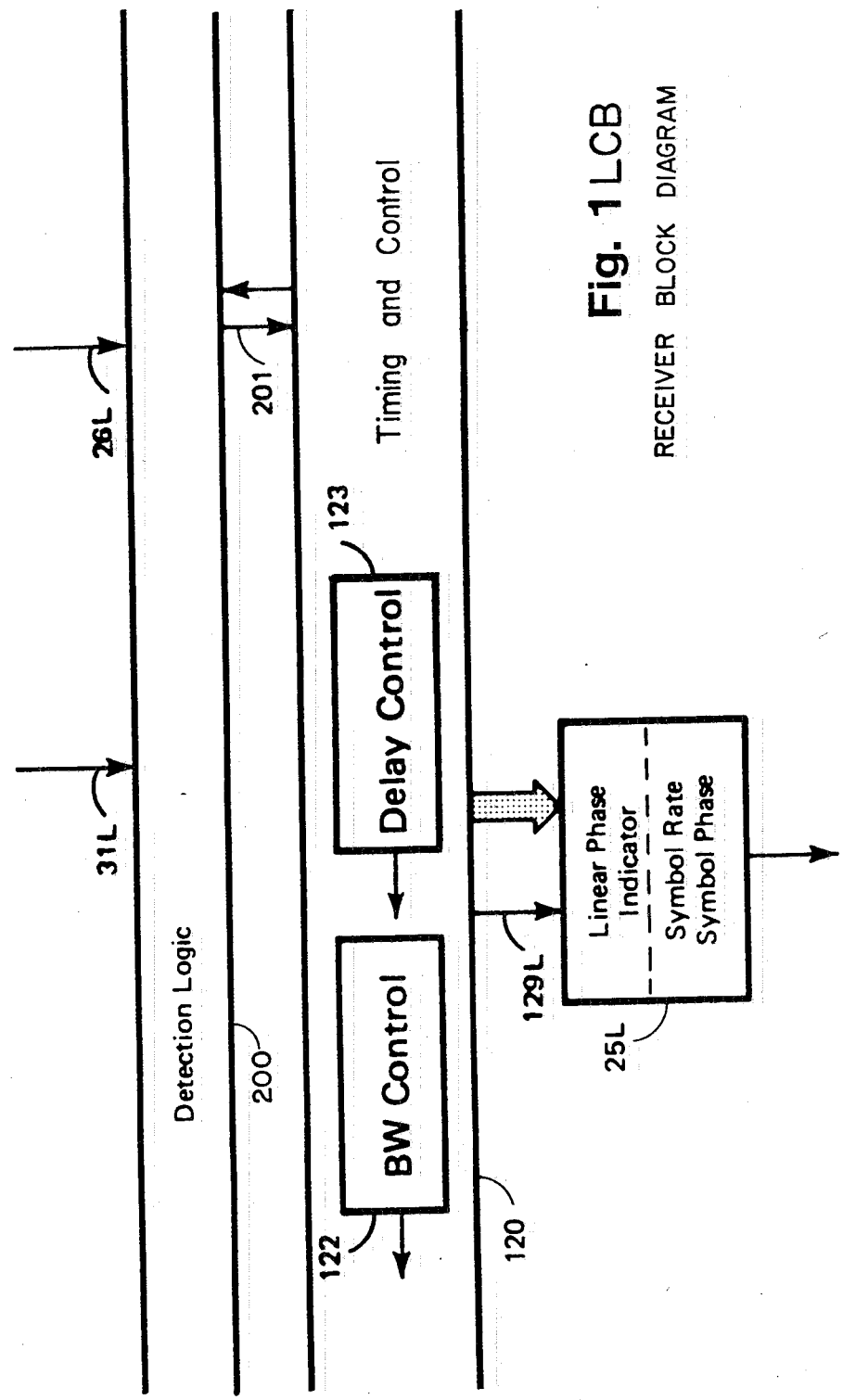

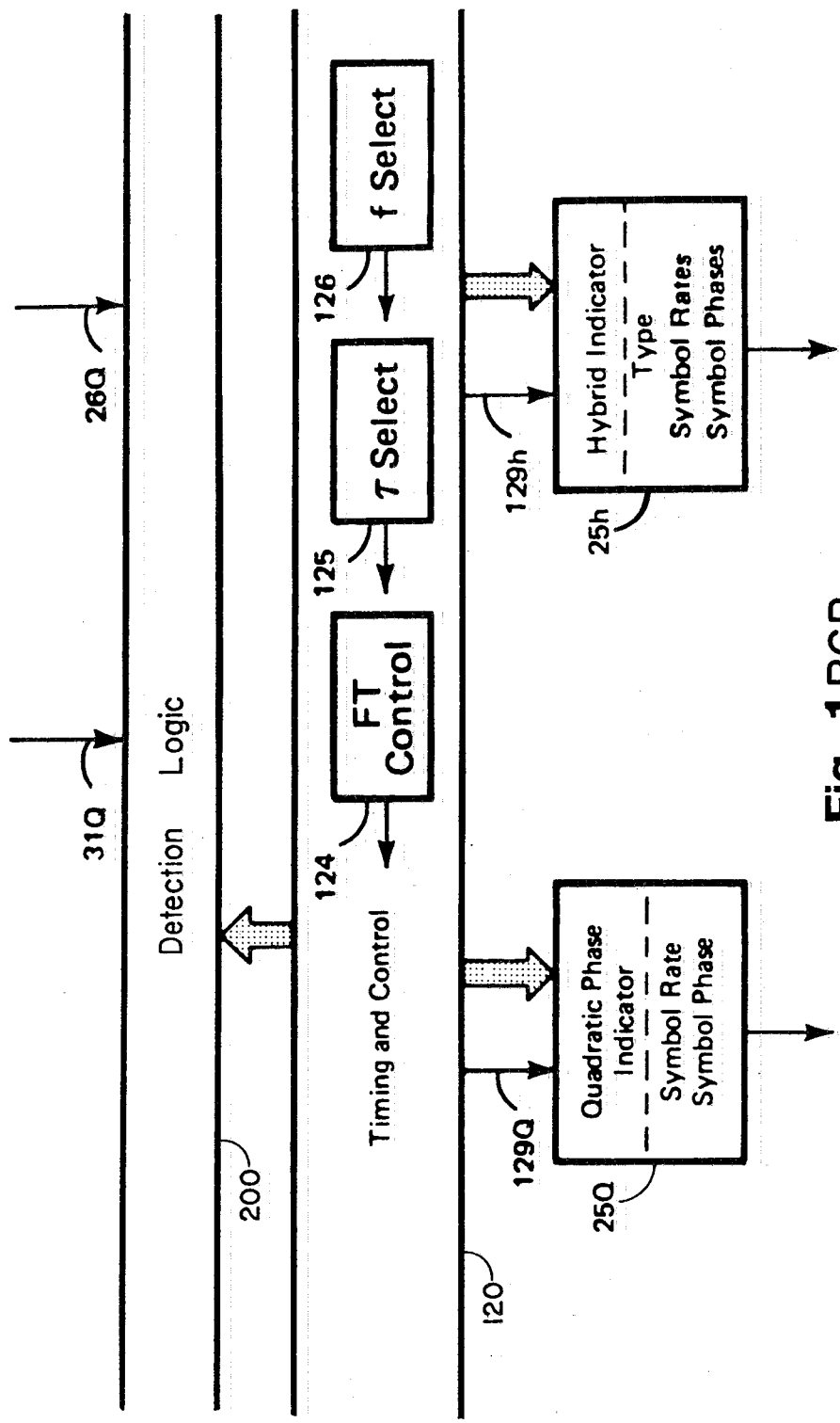
Fig. 1RCB
RECEIVER BLOCK DIAGRAM

RECEIVER BLOCK DIAGRAM

AMBIGUITY TRANSFORM CONFIGURATION NO. 1

AMBIGUITY TRANSFORM CONFIGURATION NO. 2

AMBIGUITY TRANSFORM CONFIGURATION NO. 3

AMBIGUITY TRANSFORM CONFIGURATION NO. 4

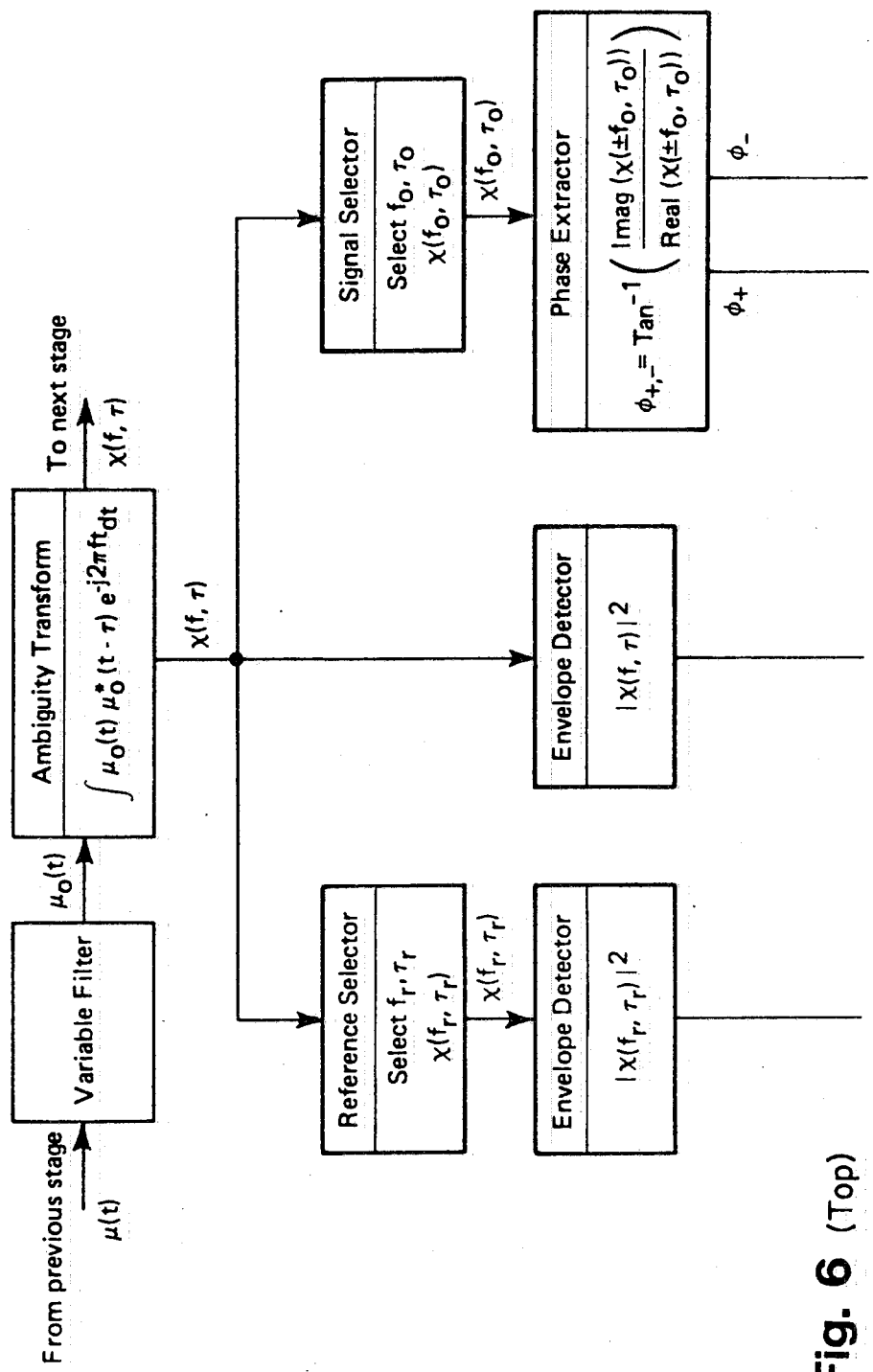
Fig. 6 (Top)

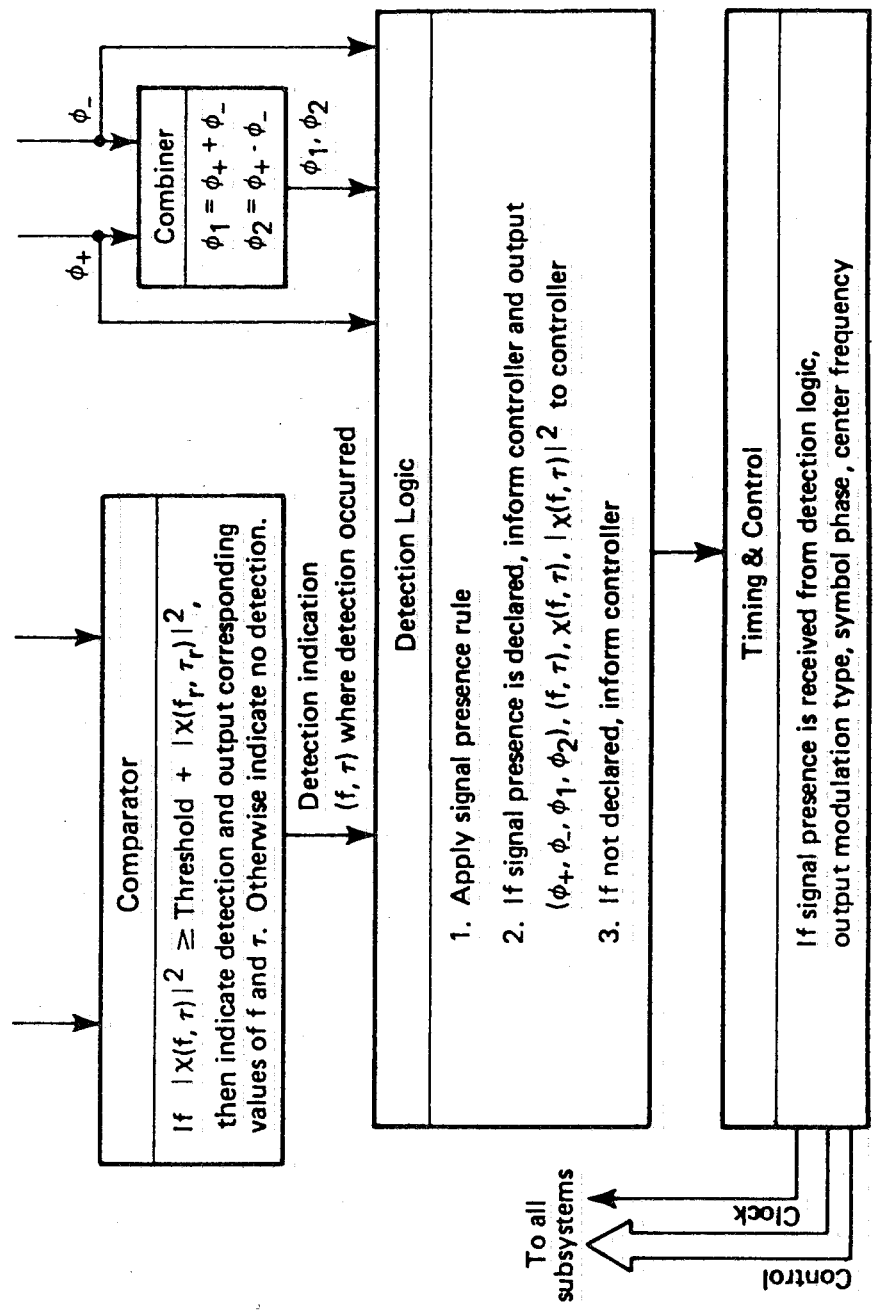
Fig. 6 (Bottom)

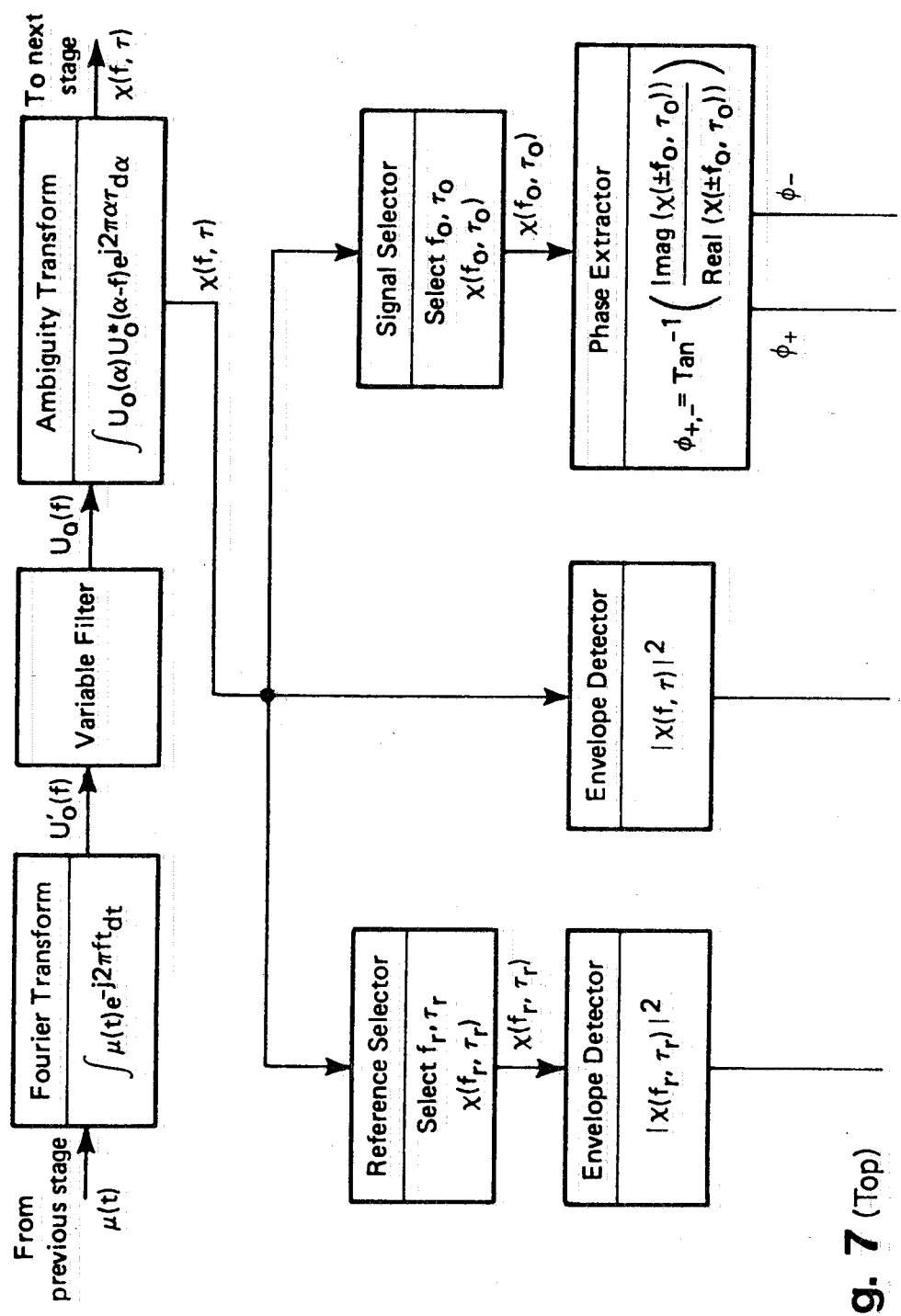
Fig. 7 (Top)

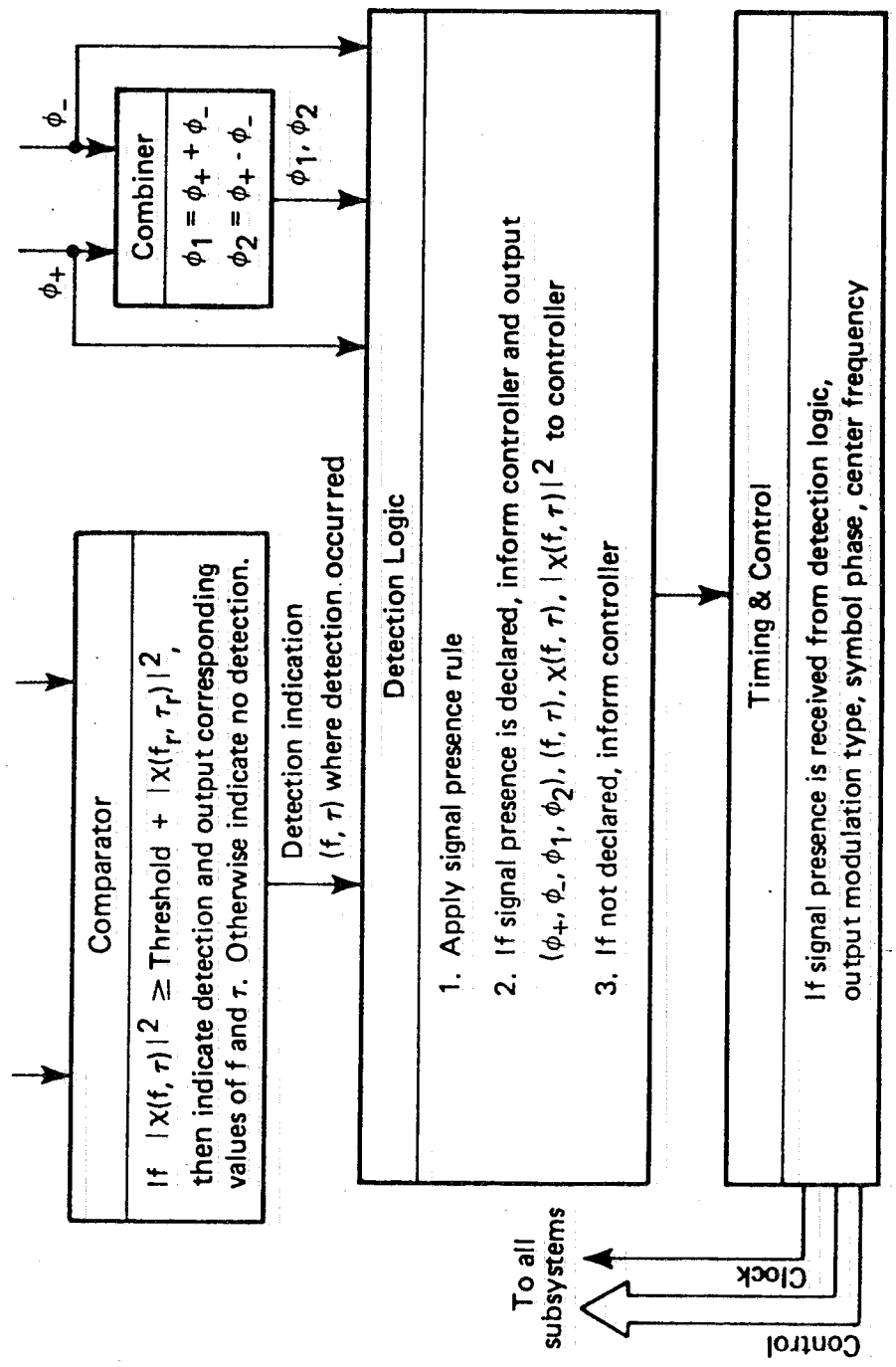
Fig. 7 (Bottom)

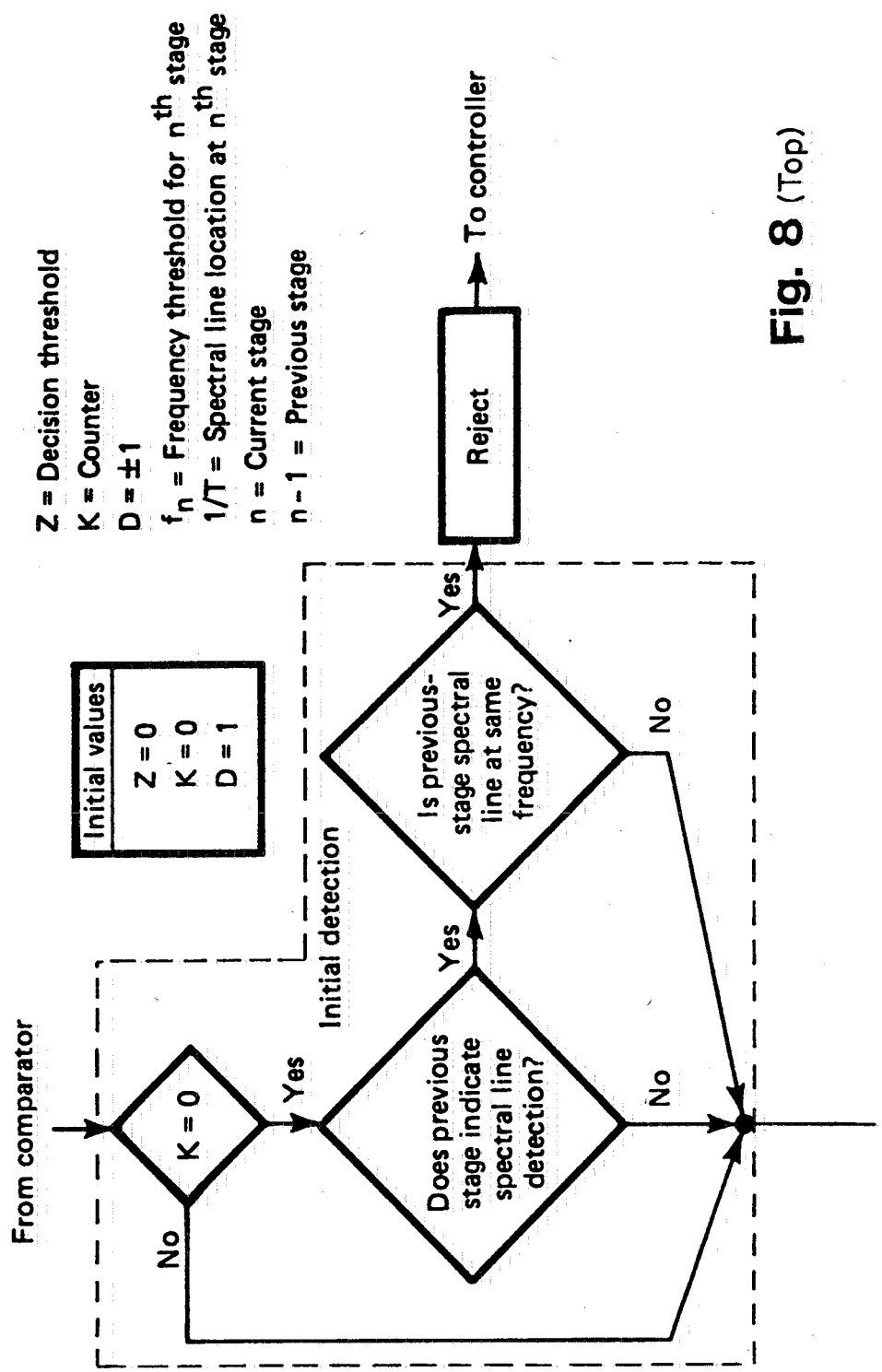
Fig. 8 (Top)

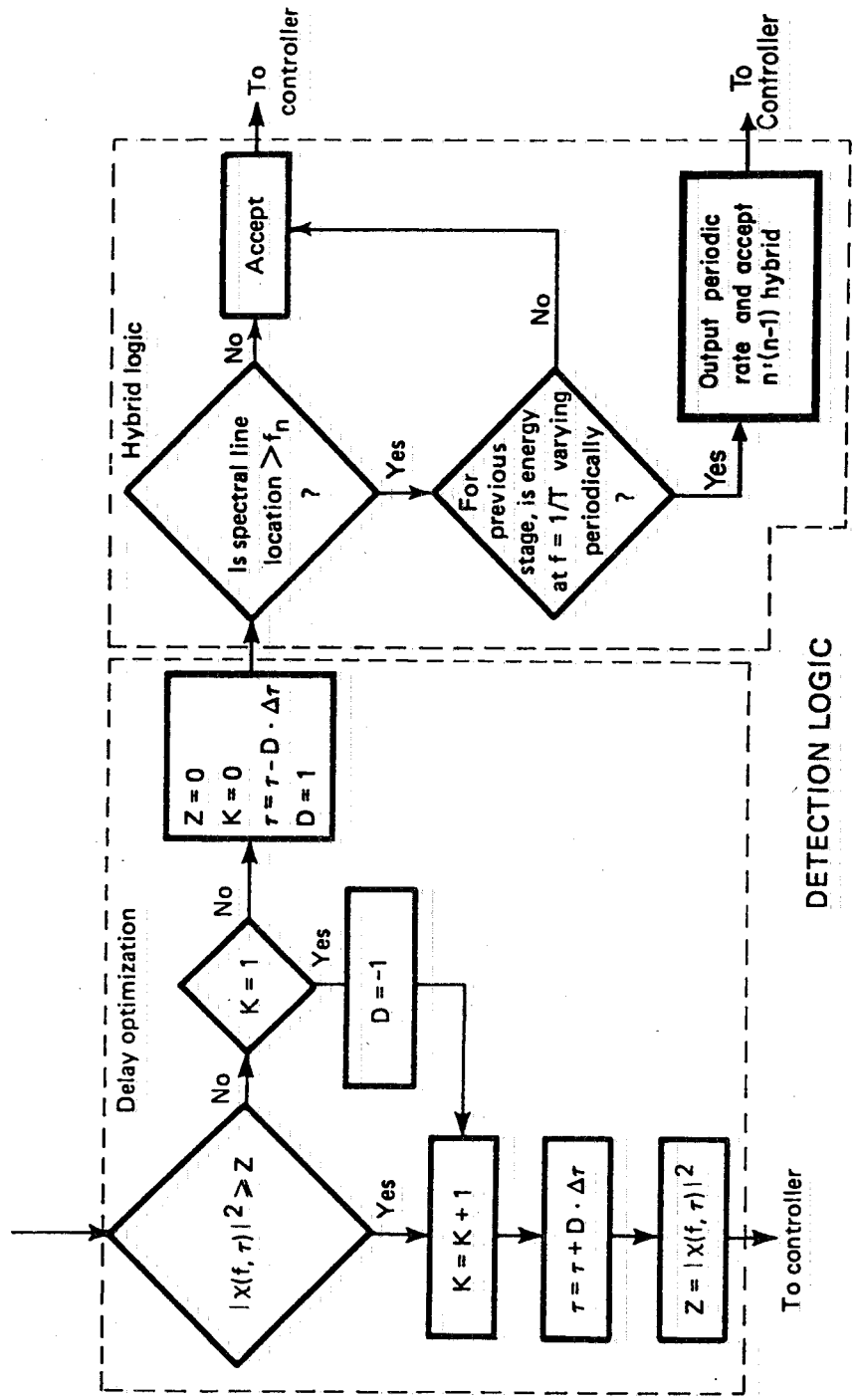
Fig. 8 (Bottom)

HYBRID PROCESSOR SUBSYSTEM

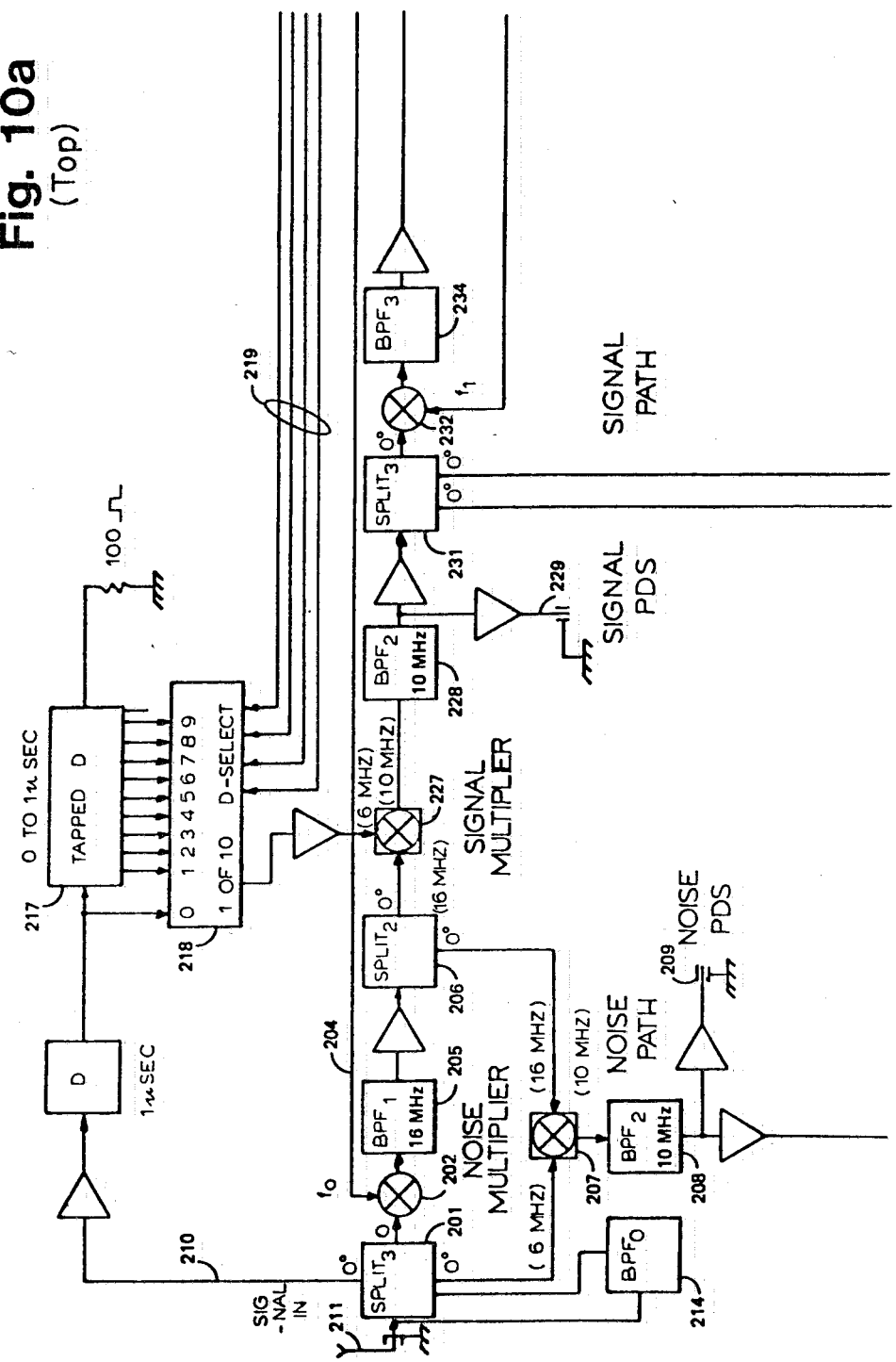
Fig. 10a (Top)

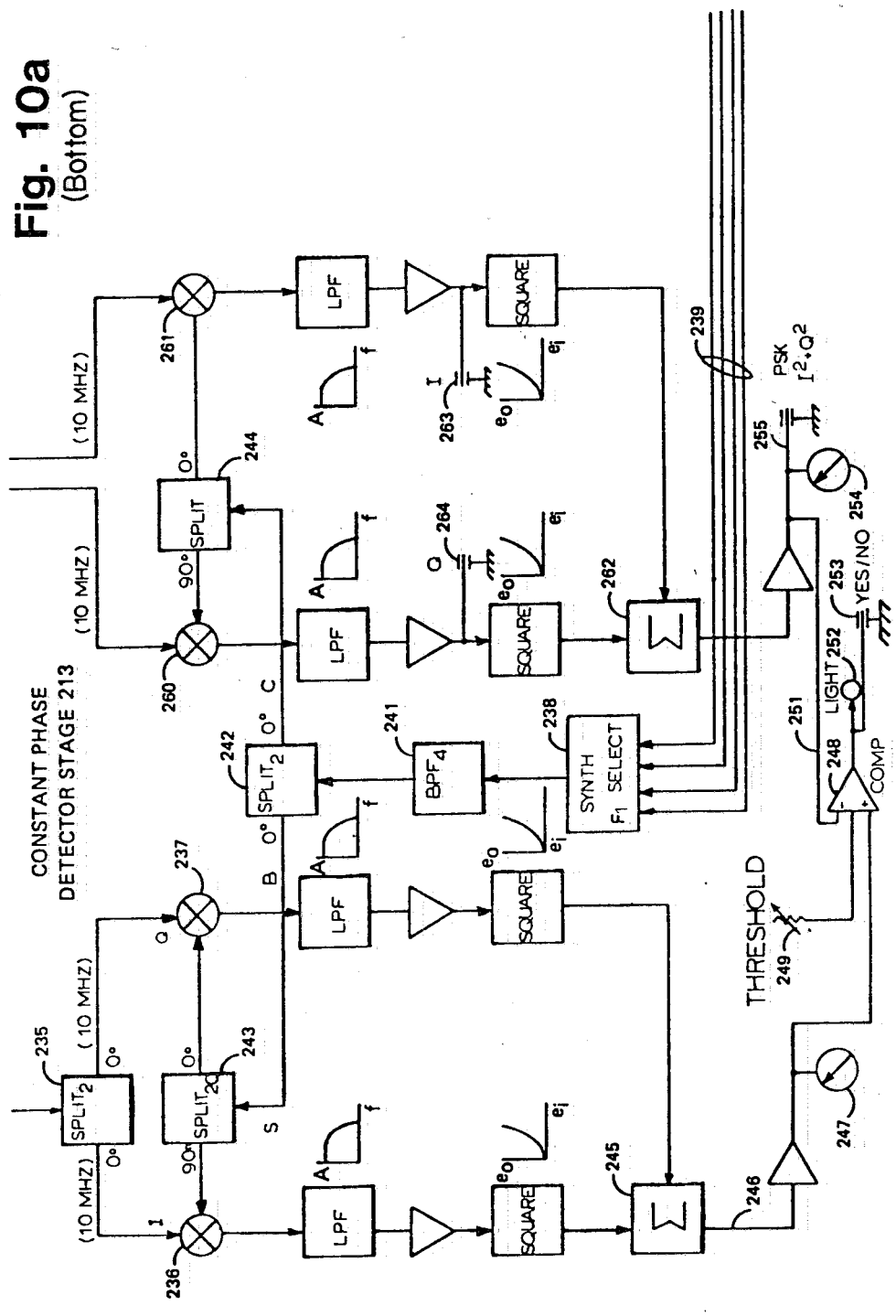
Fig. 10a (Bottom)

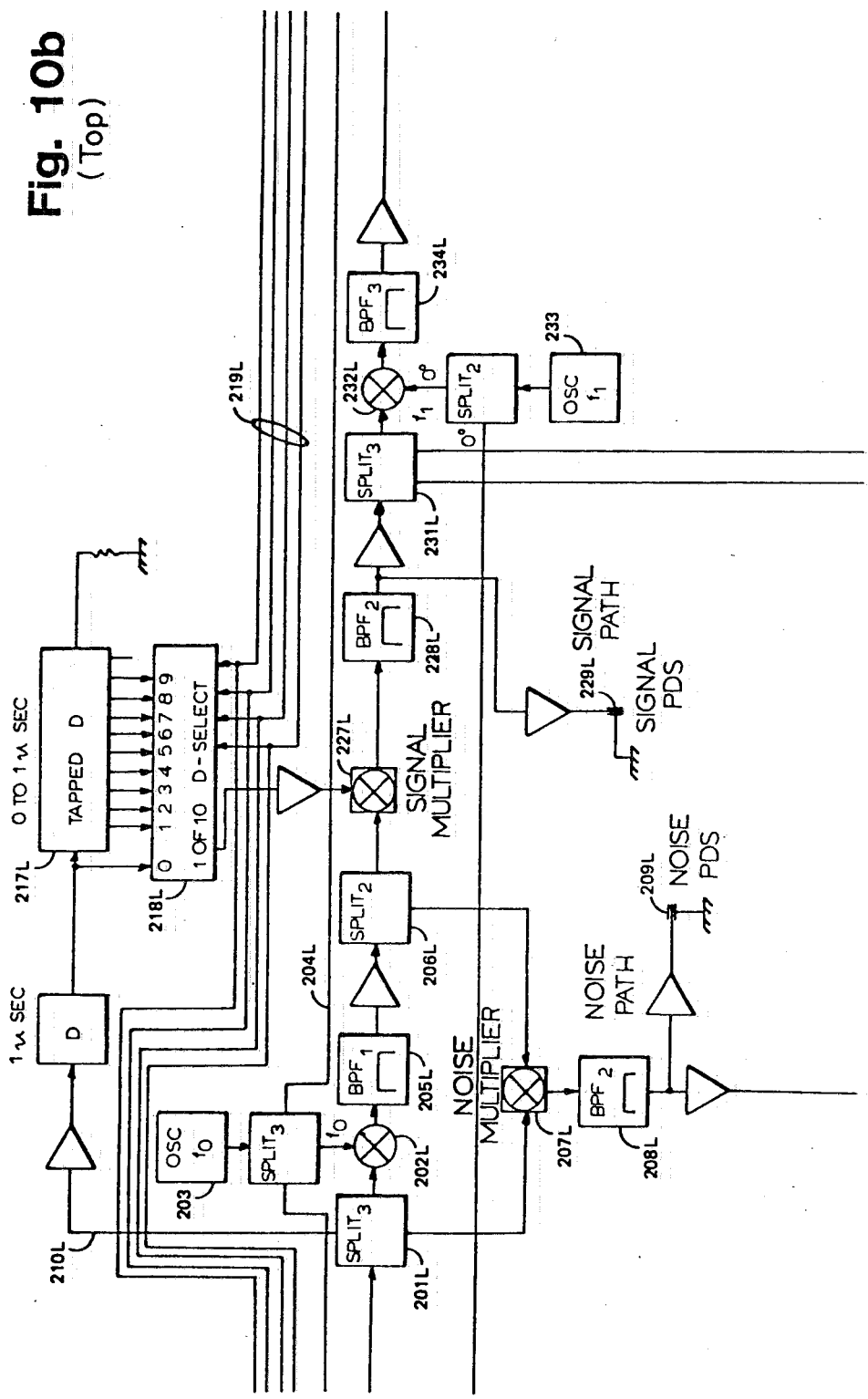
Fig. 10b (Top)

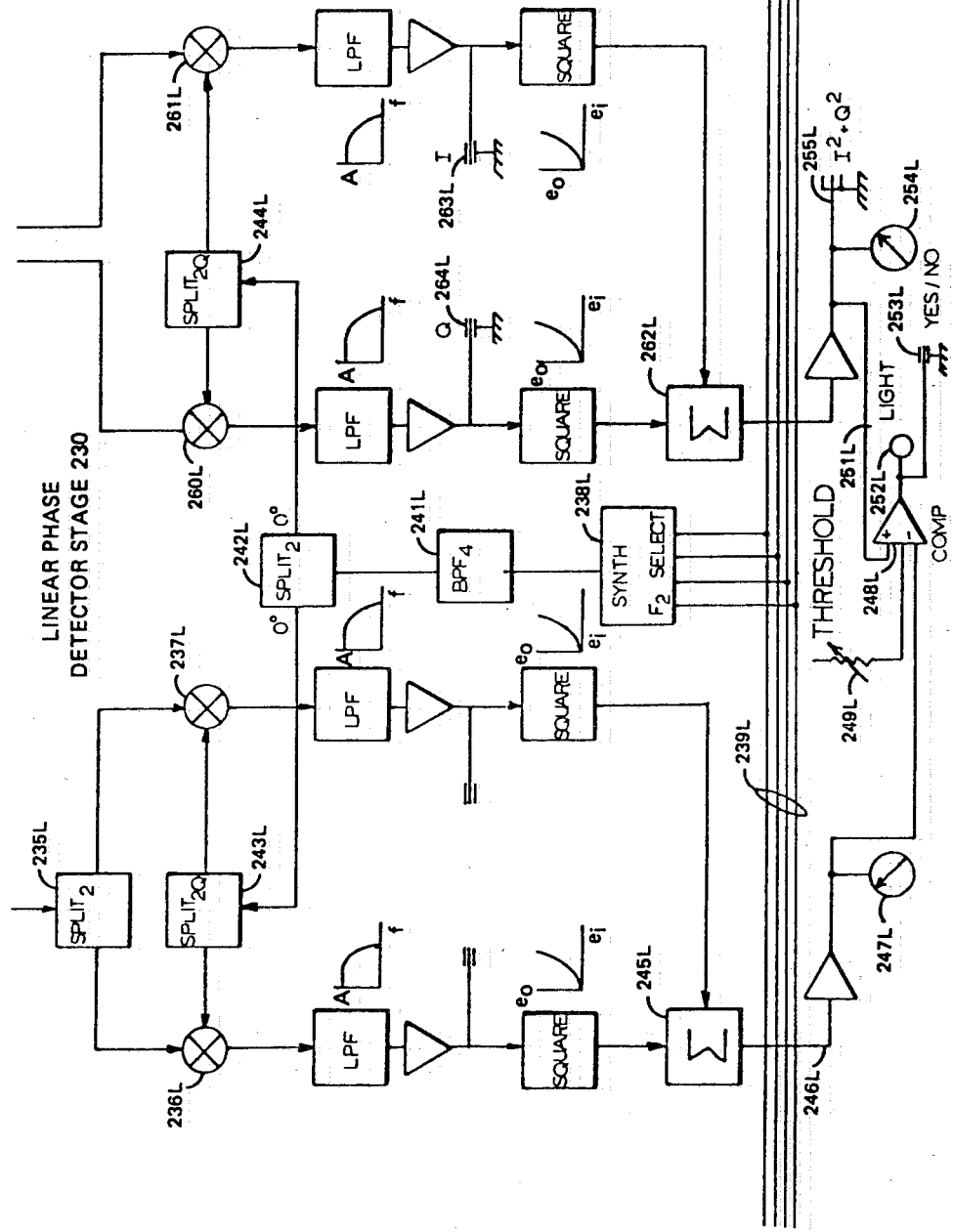

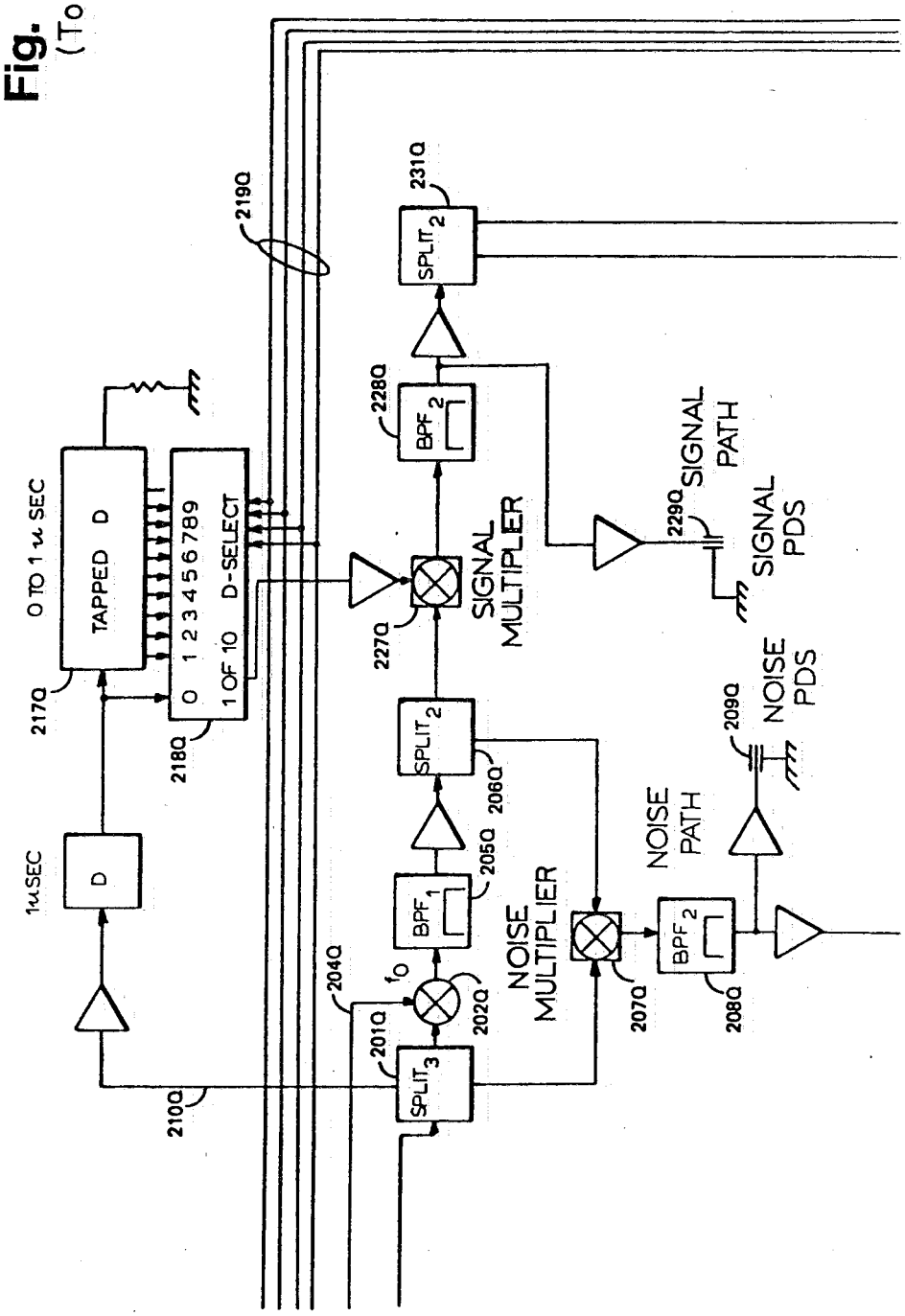
Fig. 10c (Top)

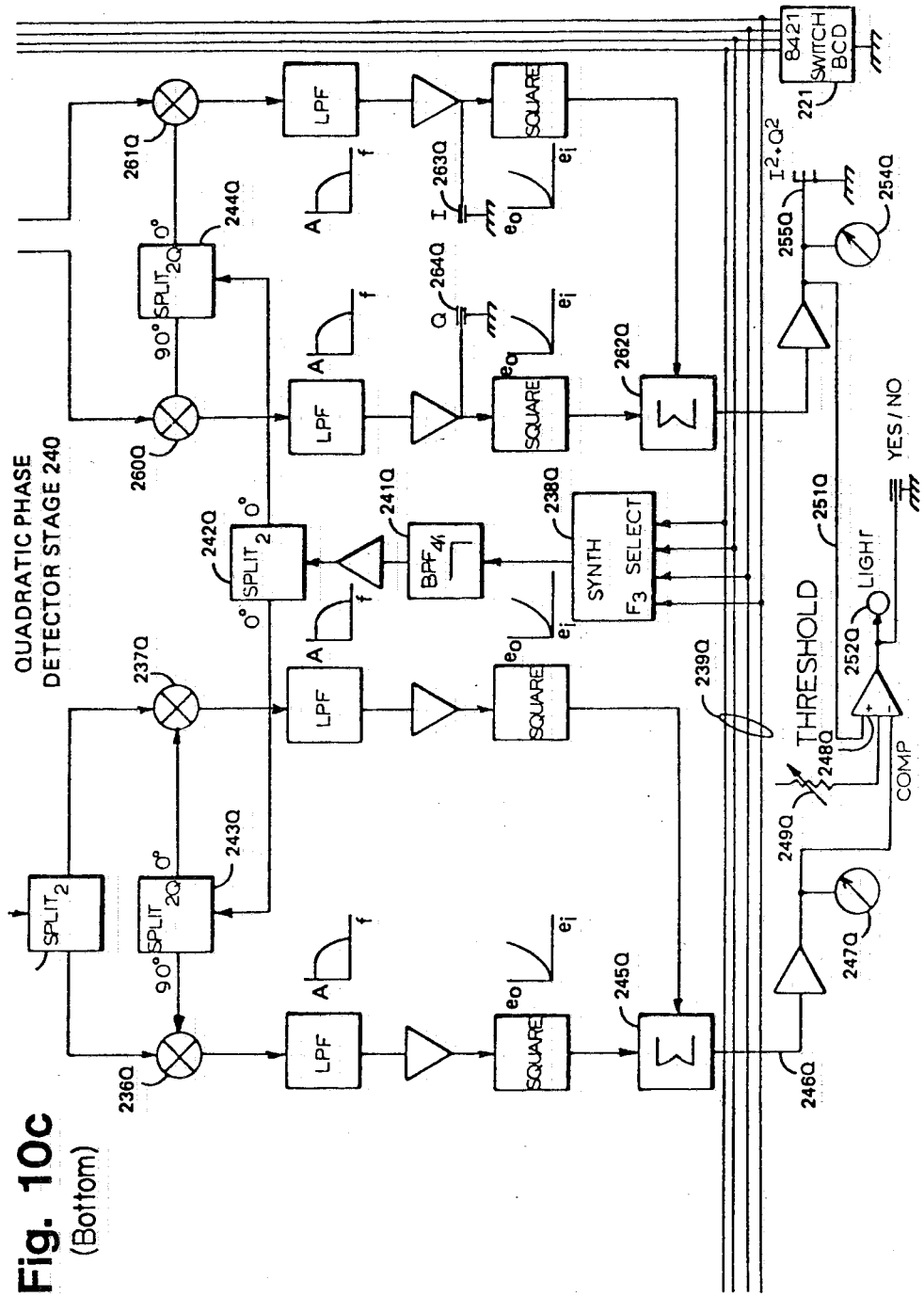
Fig. 10c (Bottom)

Fig. 11

| Fig. 1 | 1 LT | 1 LCT | 1 RCT | 1 RT |
|---|---|---|---|---|
|  | 1 LB | 1 LCB | 1 RCB | 1 RB |

Fig. 6

| 6 (T) |
|---|
| 6 (B) |

Fig. 7

| 7 (T) |
|---|
| 7 (B) |

Fig. 8

| 8 (T) |   | 8 (Cont.) |
|---|---|---|
| 8 (B) |   |  |

Fig. 10a,b,c

| 10a (T) | 10b (T) | 10c (T) |
|---|---|---|
| 10a (B) | 10b (B) | 10c (B) |

MODULATION DETECTOR AND CLASSIFIER

BACKGROUND OF THE INVENTION

The detection and classification of digitally modulated signals in a broad band without knowledge of their carrier frequency, modulation type, or modulation rate has long provided a difficult problem for receiver designers. Energy detection receivers such as crystal video detectors, scanning receivers, filter bank or channelized receivers, and spectrum analyzers have been the only practical type of receivers available for such use. However, they are severely limited in their ability to detect and classify specific modulation types and rates, and their performance degrades rapidly when more than one signal is present at the input.

The advantages of digital modulation in communication and radar have long been recognized. Now that the era of practical implementation and deployment of such systems has arrived, an effective detection and classification receiver is essential. Current receiving systems, designed for use against conventional signals, must be expanded to cope with digital modulation in order to maintain their effectiveness.

Until now, it has been virtually impossible to detect and classify a noncooperative or low-level digitally modulated transmission for which the key modulation parameters and center frequency are unknown. In detecting noncooperating transmitters, it is essential to a. Detect digital modulation embedded in dense RF backgrounds.

b. Classify the modulation format as Constant Phase (e.g., phase shift keying), Linear Phase (e.g., multifrequency shift keying), Quadratic Phase (e.g., linear FM or chirp), higher-order phase modulation, or their hybrids.

c. Discriminate against other transmissions, including those (1) coexisting at the same frequency and (2) having similar modulation formats and clock rates.

It is also important that any such receiver exhibit d. Significant immunity to narrowband interference.

e. High-signal-to-noise-ratio signal output.

f. High-signal-to-noise-ratio signal output that is fully coherent with the digital-modulation symbol transitions.

g. A real-time, adaptive detection threshold.

The state of the art in digital modulation techniques is best described in the following publications:

1. A. Viterbi and J. Omura, *Principles of Digital Communication and Coding*, McGraw-Hill, New York, 1979.
2. H. Van Trees, *Detection, Estimation, and Modulation Theory*, Wiley, New York, 1971.
3. R. C. Dixon, *Spread Spectrum Systems*, Wiley, New York, 1976.
4. C. E. Cook et al., "Special Issue on Spread Spectrum Communications," *IEEE Transactions on Communications*, Vol. COM-30, No. 5, May 1982.

The fundamental characteristic of all digital modulation techniques is the conversion of the original information into a unique set of discrete symbols drawn from a finite alphabet. The set of symbols is then used to modulate a carrier sequentially in time according to the transmitter clock, and with a well-defined symbol duration.

The state of the art in digital-modulation detection techniques (in which the receiver does not know one or more of the key characteristics of the transmitted signal) is best summarized in the following publications:

5. W. C. Lindsey and M. K. Simon, *Telecommunication Systems Engineering*, Prentice-Hall, Englewood Cliffs, N.J., 1973.
6. N. F. Krasner, "Optimal Detection of Digitally Modulated Signals," *IEEE Transactions on Communications*, Vol. COM-30, No. 5, May 1982.
7. C. W. Helstrum, *Statistical Theory of Signal Detection*, Pergamon, Long Island City, N.Y., 1975.

Other publications relevant to the following discussion are

8. M. Skolnik, *Introduction to Radar Systems*, 2d ed., McGraw-Hill, New York, 1980.
9. A. Papoulis, *The Fourier Integral and Its Applications*, McGraw-Hill, New York, 1962.

BRIEF DESCRIPTION OF THE INVENTION

The receiver design, in accordance with our invention, exploits the underlying event periodicity (e.g., clock) in all practical digital modulation techniques. For example, phase shift keying has a bit period, frequency shift keying has a tone period, and linear FM has a sweep period. Because there is no correlation between the sequential events (e.g., adjacent bits are uncorrelated), such periodicity is not immediately observable as spectral lines.

To exploit the underlying periodicity, we first recognize the implicit ability of multiple applications of a transformation, which we call the Ambiguity Transformation, to generate spectral lines at the event rate. These spectral lines are (1) unique to each digital modulation format, and (2) coherent with (contain the phase information of) the event clock. These spectral lines are used to detect and classify digitally modulated signals.

This principle is embodied in a radio receiver having cascaded stages, each of which includes the performance of an Ambiguity Transformation on the output of the previous stage.

The method of this invention involves selecting a frequency band of interest; optionally deriving the Fourier transformation of the frequency band; band-limiting, if desired; obtaining the Ambiguity Transformation of the remaining band of interest whereby a potential signal carrier frequency, symbol rate, and symbol phase are determined; comparing the relative levels of selected reference-signal and detected-signal parameters to decide whether a valid signal is present. If so, a valid signal presence is indicated, the modulation is identified, and values of center frequency, symbol rate, and symbol phase are used to select a signal of possible interest.

The method of this invention also includes selecting a predetermined signal, extracting phase information, and, if a valid signal presence has previously been registered, indicating the symbol phase and center frequency of the selected signal.

The method of this invention further includes the repetition of the same steps, at least once, on the results of the Ambiguity Transformation whereby any digitally modulated signals having linear phase deviations may be detected.

The method of this invention further includes the subsequent repetition of the same steps on the results of the previous Ambiguity Transformation whereby higher order digitally modulated signals of quadratic and higher-order phase may be detected.

In connection with the description following, the parameters are identified in Table 9 and defined on the pages set forth in Table 9.

BRIEF DESCRIPTION OF THE DRAWINGS

This invention may be more clearly understood from the following detailed description and by reference to the drawings, in which

FIG. 6 is a flow diagram of the method of this invention.

FIG. 7 is an alternative flow diagram of the method of this invention.

FIGS. 10a, 10b, and 10c constitute a block diagram of a physical embodiment of this invention.

FIG. 11 constitutes a block diagram showing the interconnections of FIGS. 1, 6, 7, 8, and 10a,b,c.

DETAILED DESCRIPTION OF THE INVENTION

Figure 1:
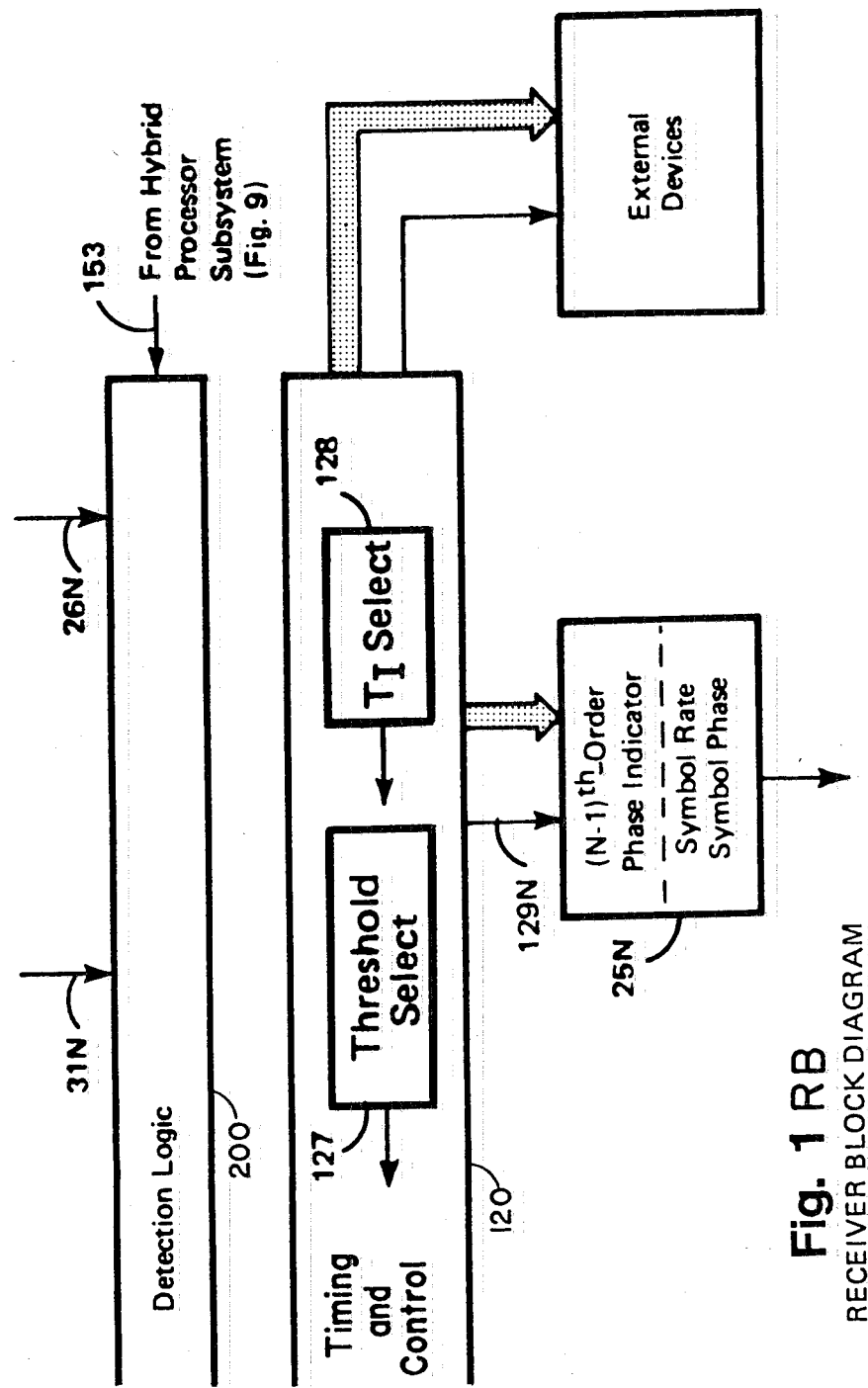
FIG. 1 is a block diagram of an embodiment of this invention.

A block diagram of the receiver of this invention is shown in FIG. 1. The signal band s(t) received by the antenna 11 is introduced into the Signal Conditioner 12. The Signal Conditioner 12 prepares the signal band for convenient processing by all subsequent blocks, and typically consists of a series of frequency translations, amplifications, and filtering common to the RF and IF stages of a conventional radio receiver. The Signal Conditioner 12 may also amplitude-limit or convert the representation of the received signal to another form, such as (1) from analog/continuous to digital/time-discrete, (2) from real to complex-analysis, or (3) combinations of the two. Although not explicitly shown in FIG. 1, these functions of the Signal Conditioner 12 may also be implemented at other locations within the receiver.

CONSTANT PHASE STAGE

The output of the Signal Conditioner 12 is fed into the Constant Phase Stage 13, where it is first filtered by controllable bandpass Filter 14. The variable bandwidth of Filter 14 is selected by the Timing and Control subsystem 120 described in connection with Table 5, and is usually a function of the desired signal-to-noise ratio, search bandwidth, processing gain, and anticipated received-signal bandwidth.

The output of Filter 14 is then input to the Ambiguity Transform circuit 15, described below and illustrated in several embodiments in FIGS. 2 through 5. In those embodiment, the output of the Ambiguity Transform circuit 15, designated $\chi_1(f, \tau_1)$, is simultaneously routed to the Reference Selector circuit 16, the Envelope Detector circuit 20, and the Signal Selector circuit 21; and then the same signal is output on lead 22 to the Linear Phase Stage 30.

The Reference Selector 16 of the Constant Phase Stage 13, by command from the Timing and Control subsystem 120, selects particular values of the Ambiguity Transform circuit 15 output to be used as adaptive noise references for signal detection. The output of the Reference Selector 16 is envelope-detected in the Envelope Detector 23 and introduced along with the output of Envelope Detector 20 into the Comparator 24.

The Comparator 24 evaluates the Envelope Detector output 20 relative to the Envelope Detector output 23. If the former exceeds the latter by an amount specified by the Detection Logic circuit 200, then Constant Phase spectral line detection is declared on lead 31. The corresponding values of f and $\tau_1$ for which detection is declared are routed to the Detection Logic circuit 200 on lead 31 and on to the Timing and Control subsystem 120 on lead 201 for analysis and use in the Signal Selector 21.

The Signal Selector 21 receives the Ambiguity Transform circuit 15 output on lead 27 and, by command from the Timing and Control subsystem 120 on leads 101 and 102, extracts the values of $\chi_1(f, \tau_1)$ at the specified values of f and $\tau_1$. Those values are input to the Phase Extractor 28, which generates an indication of the phase of its input with respect to the receiver clock reference of the Timing and Control circuit 120. The phase reference and signal symbol phase values are then input to the Combiner 29 to produce the center frequency and symbol phase for all detected Constant Phase signals.

LINEAR PHASE STAGE

The output of the Constant Phase Stage 13 on lead 22, designated $\chi_1(f, \tau_1)$, generally constitutes the input to the Linear Phase Stage 30 for Linear Phase signal detection and classification. This stage 30 is identical to the preceding stage 13, as is clear in FIG. 1, and identical elements are given the same reference numerals with an L suffix. The Comparator 24L again evaluates the Envelope Detector output 20L relative to the Envelope Detector output 23L. If the former exceeds the latter by an amount specified by the Detection Logic 200, then Linear Phase spectral line detection is declared on lead 31L. The corresponding values of f, $\tau_1$, and $\tau_2$ for which detection is declared are routed to the Detection Logic circuit 200 on lead 31L and on to the Timing and Control subsystem 120 on lead 201 for analysis and use in the Signal Selector 21L. As in the previous stage, the Combiner 29L produces the symbol phase for all Linear Phase signals.

QUADRATIC PHASE STAGE

The output of the Linear Phase Stage 30 on lead 22L generally constitutes the input to the Quadratic Phase Stage 40 for Quadratic Phase signal detection and classification. This stage 40 is identical to the preceding stages 13 and 30, as is clear in FIG. 1, and identical elements are given the same reference numerals with a Q suffix. Again, the Comparator 24Q declares spectral line detection when the specified threshold is exceeded, and the corresponding values of f, $\tau_1$, $\tau_2$, and $\tau_3$ are specified. The Combiner 29Q again produces the symbol phase for all detected Quadratic Phase signals.

EXTENSION TO HIGHER-ORDER PHASE STAGES

The receiver of this invention consists of N stages in series, as represented by stages 13 through N, shown in FIG. 1. The number of stages is determined by the desired order of modulation to be detected. These N stages are identical to the stages described above, as is clear in FIG. 1, and identical elements are given the same reference numerals with an N suffix.

TIMING AND CONTROL

Figure 8:
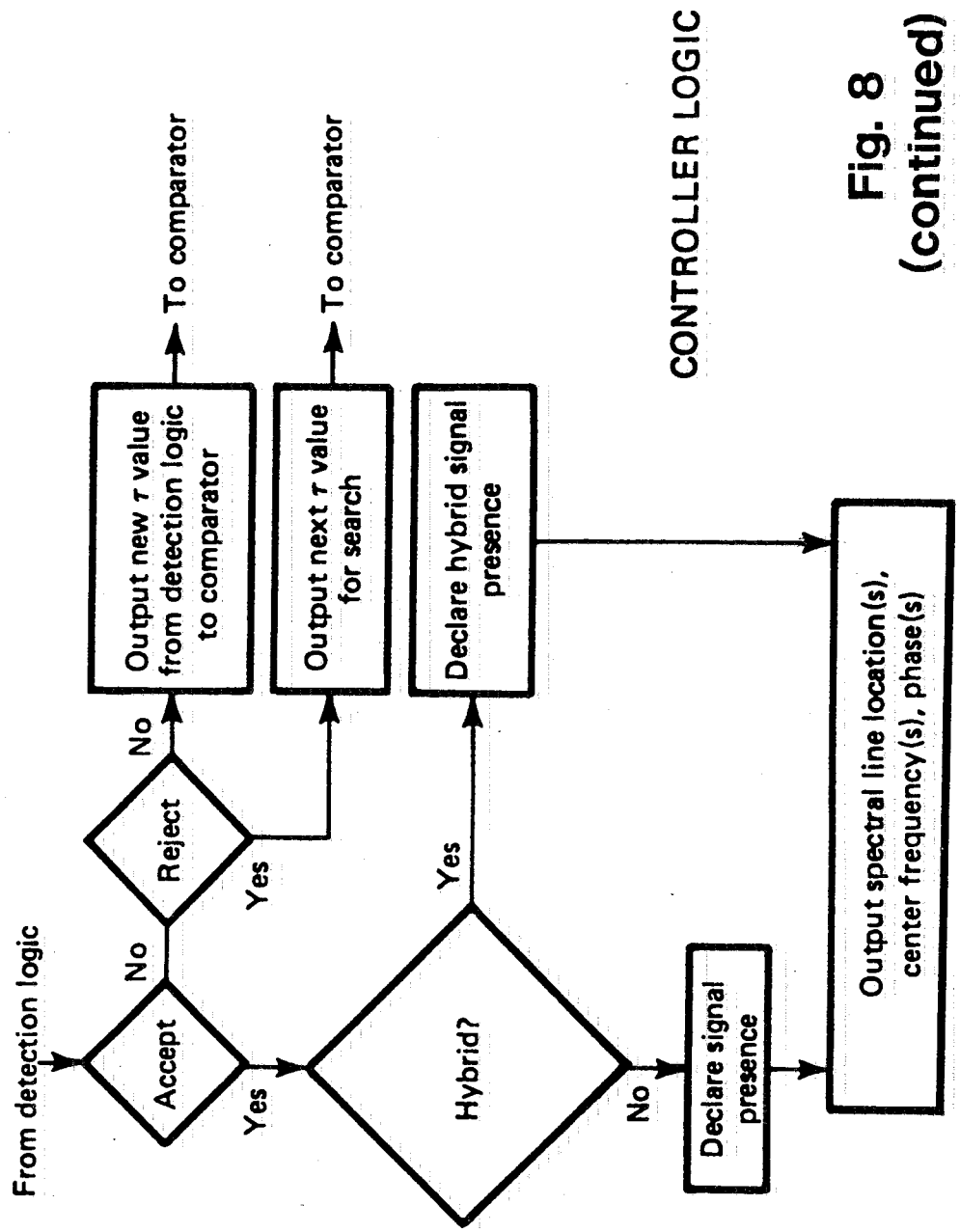
FIG. 8 is a logic flow diagram for the Detection Logic and Controller Logic of this invention.

The Timing and Control subsystem 120 provides timing and control for all the receiver processing blocks shown in FIG. 1. Each block is therefore synchronized with the same Clock 121. All block functions, including variable parameter values, are selected or commanded by elements of this subsystem, such as filter bandwidth by the Bandwidth Control 122; ambiguity transform delays by the Delay Control 123; Fourier transform parameters control by the Fourier Transform Control 124; delay selection by the $\tau$ Select 125; frequency selection for signal selectors 21 through 21N by the f Select 126; the detection threshold for Comparators 24 through 24N by the Threshold Select 127; and the integration time selection for the Ambiguity Transforms 15 through 15N by the $T_I$ Select 128. These may be manual controls with discrete values or they may be adaptive controls, as described below. The Timing and Control circuit 120 is also used to provide key receiver outputs, such as signal presence, modulation type, symbol rate, and symbol phase on leads 129 through 129N, to the Indicators 25 through 25N, as described below in connection with FIG. 1, FIG. 8, and FIG. 10.

DETECTION LOGIC

The Detection Logic subsystem 200 accepts the Comparator 24 through 24N outputs from all stages and decides if spectral line detection in a particular stage is a valid indication of signal presence for that stage (modulation type).

If a signal is declared present by a signal exceeding the threshold set in the Comparators 24 through 24N, the Detection Logic subsystem 200 feeds the following outputs to the Timing and Control circuit 120: signal phase information, signal frequency, symbol rate, and Ambiguity Transform delay $\tau$, all introduced into the Timing and Control circuit 120 for passage to the Indicators 25 through 25N. The Indicators 25 through 25N may include meters, digital displays, digital bit outputs, or indicator lamps.

DETECTION LOGIC DECISION RULES

It is possible for more than one stage of the receiver of this invention to detect spectral lines at the same time. This may occur under either or both of the following conditions:
1. Multiple digitally modulated signals are simultaneously present (e.g., a Linear Phase signal and a Constant Phase signal are both input to the receiver).
2. An (n−1)th-order phase signal is input to the receiver, but the (n+k)th-stage value of $$\sum_{i=1}^{n+k} \tau_i$$

is less than the signal's symbol duration T.

The first condition is typical of system operation. The second condition, however, requires the Detection Logic 200 to always apply the following rule when the nth-stage Comparator 24n indicates spectral line detection:

Signal presence is declared for the nth stage if one of the following criteria is satisfied:
1. Signal presence is not declared for the preceding (n−1)th stage.
2. Signal presence is declared for the preceding stage, but none of the spectral-line frequency locations equals that of the nth-stage candidate.

If neither of the above criteria is satisfied, no signal presence is declared for the candidate spectral line. The above rule is augmented to include hybrid signal detection, as discussed later and shown in FIG. 8.

HYBRID SYSTEM PROCESSOR

Figure 9:
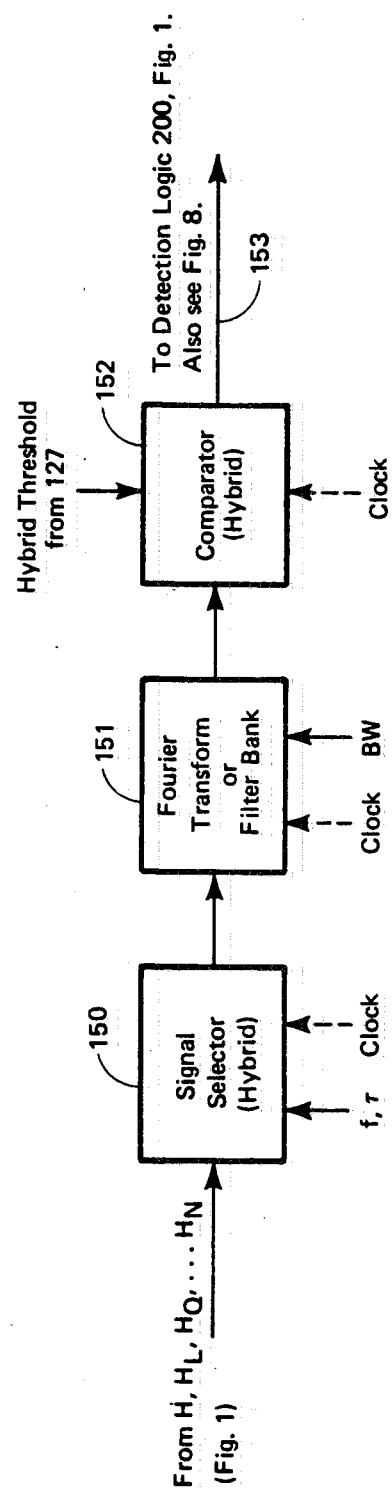
FIG. 9 is a block diagram of an embodiment of the Hybrid Processor Subsystem of this invention.

The outputs of the Envelope Detectors 20, 20L, 20Q, ..., 20N are also routed on leads H, $H_L$, $H_Q$, ..., $H_N$, respectively, to the Hybrid Processor Subsystem in FIG. 9. The operation of this subsystem is further described below. The output of the Hybrid Processor Subsystem is input on lead 153 to the Detector Logic circuit 200 in FIG. 1.

EXAMPLE OF RECEIVER OPERATION

Figure 1A:
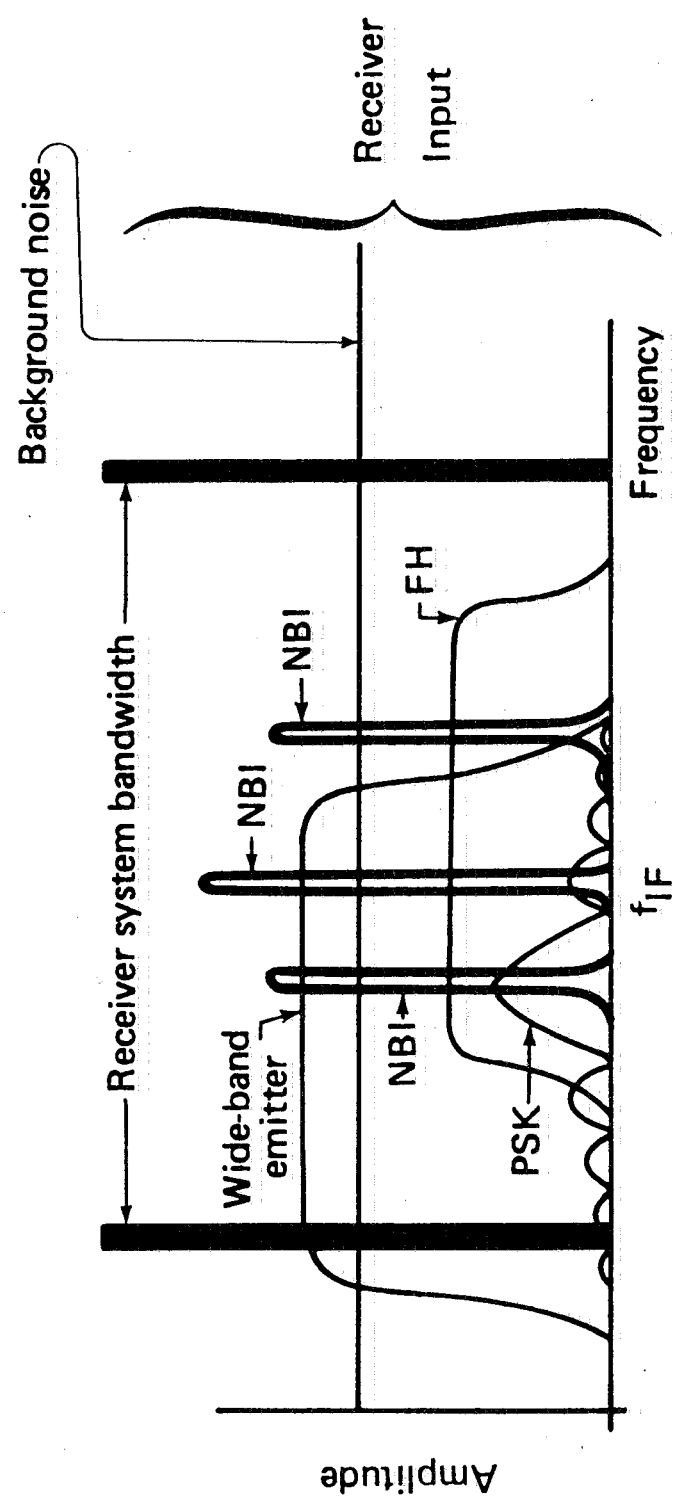
FIG. 1a is an example of a received signal.

FIGS. 1a through 1e present examples of the received signal as it passes through the first two receiver stages. In these examples, we assume the spectrum of the received signal at the antenna 11 is as shown in FIG. 1a. It consists of a wideband emitter, three narrowband interferers (NBIs), a phase shift keying (PSK) signal with symbol duration $T_1$, an M-ary frequency shift keying (MFSK) signal with symbol duration $T_2$, and background noise. The receiver bandwidth at the Signal Conditioner 12 (of FIG. 1) is as indicated, and signals falling outside this passband are therefore eliminated. The center frequencies of all signals in the receiver band in FIG. 1a are completely arbitrary, though we have specifically selected the frequency separations between the narrowband interferers such that they will contribute spectral energy at the PSK and MFSK symbol rates. This set of special NBI frequencies shows the capabilities of our receiver system under adverse conditions.

Figure 1B:
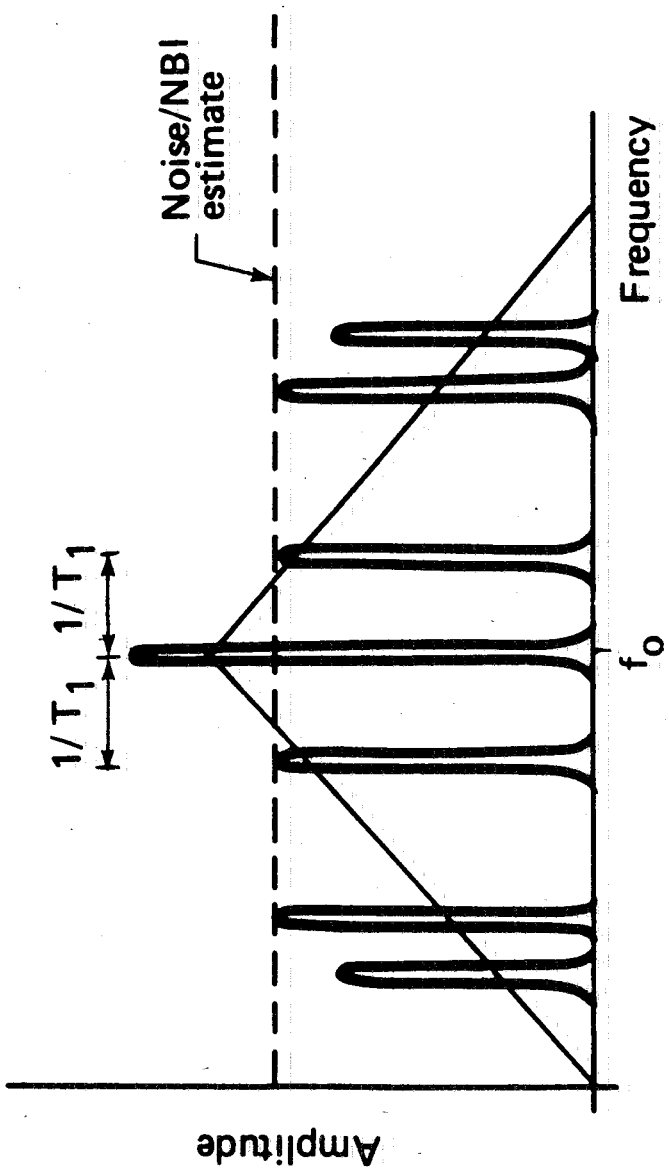
FIG. 1b is an example of the first-stage reference signal.
Figure 1C:
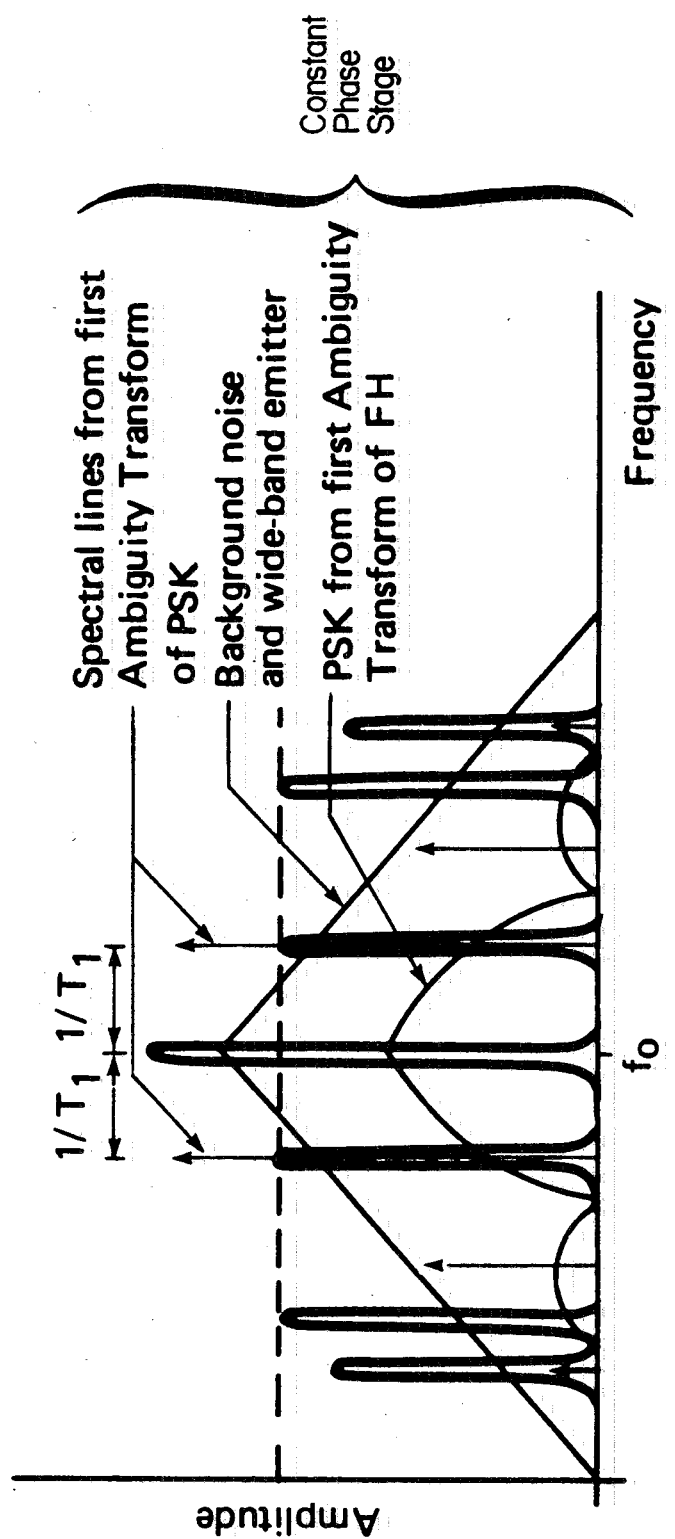
FIG. 1c is an example of the first-stage candidate signal.

FIG. 1b shows the signal output spectrum from the first-stage noise-path Envelope Detector 23, and the resulting threshold level (labeled Noise/NBI estimate) used by the Comparator 24. FIG. 1c shows the signal output spectrum from the first-stage signal-path Envelope Detector 20. As desired, both outputs contain similar signals derived from the NBI, background noise, and wideband emitter. However, only the signal path (FIG. 1c) contains spectral lines derived from the first-stage processing of the PSK, and a new PSK signal derived from the first-stage processing of the MFSK signal. Since the PSK-derived spectral lines are clearly above the indicated threshold, they are detected and the presence of PSK is declared. The frequency location of the spectral lines is $f_0 \pm 1/T_1$, and, since $f_0$ is a known receiver parameter, the PSK symbol rate is determined. The phase of the spectral lines is then computed in the Phase Extractor 28, and input to the Combiner 29 to generate the PSK Symbol phase.

Figure 1D:
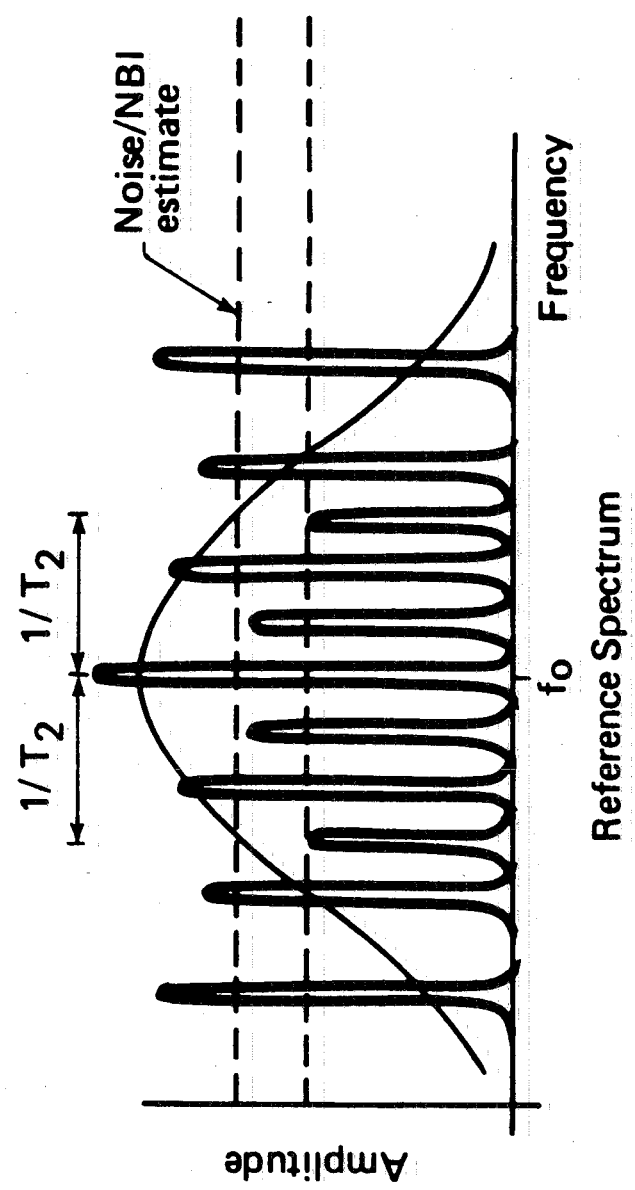
FIG. 1d is an example of the second-stage reference signal.
Figure 1E:
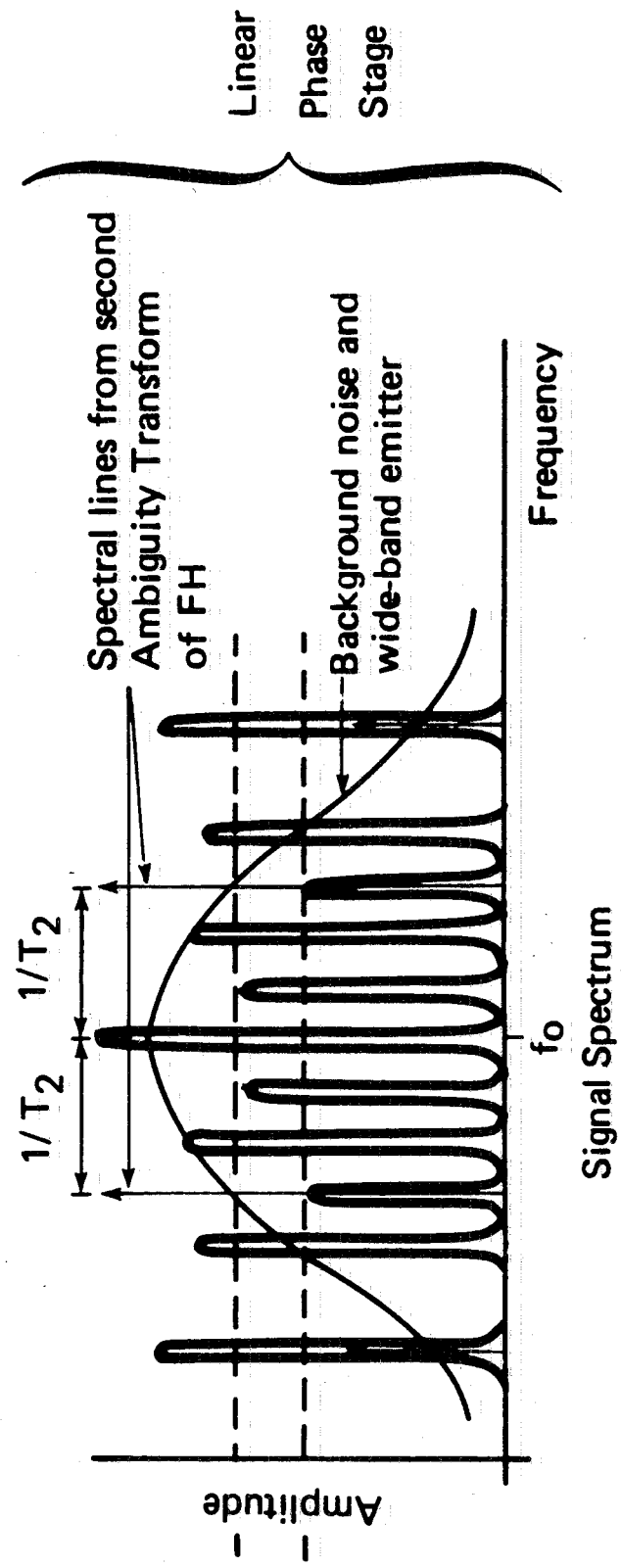
FIG. 1e is an example of the second-stage candidate signal.

FIG. 1d shows the signal output spectrum from the second-stage noise/path Envelope Detector 23L, and the resulting threshold level (labeled Noise/NBI estimate) used by the Comparator 24L. FIG. 1e shows the signal output spectrum from the second-stage signal-path Envelope Detector 20L. Again, both outputs contain similar signals derived from the NBI, background noise, and wideband emitter. However, only the signal path contains spectral lines derived from the two cascaded stages operating on the MFSK signal. Since these spectral lines are clearly above the indicated threshold, they are detected and the presence of MSFK is declared. As before, the symbol rate is determined to be $1/T_2$, and the symbol phase is computed.

CHARACTERIZATION OF SEVERAL DIGITAL MODULATION FORMATS

An understanding of the spectral line generation capability of the receiver of this invention first requires a description of a number of typical digital modulation formats. We begin with a generalized definition that includes both amplitude and phase modulation. In connection with the analysis of the operation of this invention and the following explanation, the definitions set forth in Table 9 apply.

Consider the real bandpass signal s(t) having center frequency $f_c$:

$$s(t) = x(t) \cos(2\pi f_c t) - y(t) \sin(2\pi f_c t). \qquad (1)$$

An analytic signal associated with s(t) is then $$\mu(t) = s(t) + j\hat{s}(t) = [x(t) + jy(t)]e^{j2\pi f_c t}, \qquad (2)$$

where $\hat{s}(t)$ is the Hilbert transform of s(t). By definition, the Fourier transform of $\mu(t)$ contains no negative frequency terms. The analytic signal may also be written in terms of the complex envelope e(t):

$$\mu(t) = e(t) e^{j2\pi f_c t}, \qquad (3)$$

where $$e(t) = \sqrt{x^2(t) + y^2(t)} \, \exp\left[ j \tan^{-1} \frac{y(t)}{x(t)} \right] \qquad (4)$$

and is a complex baseband signal containing the information transmitted as s(t).

$$\mu(t) = \sum_n a_n(t) \, e^{j\phi_n(t)} \, P_T(t - nT) \, e^{j(2\pi f_c t + \psi_c)}, \qquad (5)$$

where $\psi_c$ is the carrier phase, $a_n(t)$ is the amplitude modulation, $\phi_n(t)$ is the phase modulation, T is the symbol duration, and $P_T(t) = 1$ for $|t| \leq T/2$.

PHASE MODULATION: CONSTANT PHASE

There are currently four dominant methods of digital modulation involving only the phase term in Eq. (5) [i.e., $a_n(t) = A$]. The first is commonly called Phase Shift Keying (PSK), and 1/T is often called the bit rate. In this case, $$\{\phi_n(t)\} = \{\theta_n\}, \qquad (6)$$

where the braces indicate an ordered sequence and the $\theta_n$ are pseudo-random phase values. Note that $\phi_n(t)$ is constant over each symbol time and uncorrelated between symbols. We refer to this form of modulation as Constant Phase.

Equation (5) is then $$\text{Constant Phase: } \mu(t) = A \, e^{j(2\pi f_c t + \psi_c)} \sum_n e^{j\theta_n} P_T(t - nT). \qquad (7)$$

In general, $\{\theta_n\}$ can take on any set of values. However, 180 degree biphase PSK is quite common (e.g., $\{\theta_n\} = 0, \pi$). As will be discussed below, the receiver of this invention performs equally well against either format.

PHASE MODULATION: LINEAR PHASE

The second type of phase modulation will be referred to as Linear (during the symbol time) Phase. That is, $$\{\phi_n(t)\} = \{2\pi f_n t + \theta_n\}, \qquad (8)$$

where $\{f_n\}$ is a pseudo-random sequence of frequencies and $\theta_n$ is as previously defined. The case in which $\{\theta_n\} = \theta$ is termed Coherent Linear Phase. The common name for Linear Phase is M-ary Frequency Shift Keying (MFSK), since the instantaneous frequency of the transmitted signal is $f_c + f_n$. T is often called the carrier pulse time. For Linear Phase modulation, Eq. (5)

TABLE 9

| DEFINITION OF TERMS AND PAGE DEFINED | |
|---|---|
| $\{a_n\}$ = ordered sequence of variables (p. 15) | $B_N$ = noise bandwidth (p. 42) |
| T = symbol duration (p. 15) | M = number of delay blocks (p. 20) |
| n = receiver stage number (p. 10) | D = delay or shift means (p. 20) |
| s(t) = received signal (p. 13) | $\Delta f_1$ = frequency translation (p. 22) |
| $f_c$ = center frequency (p. 13) | $\Delta f_2$ = frequency translation (p. 22) |
| $\mu(t)$ = analytic signal (p. 13) | $\chi_1(f, \tau_1)$ = first Ambiguity Transform (p. 22) |
| $\hat{s}(t)$ = Hilbert transform of s(t) (p. 13) | $\chi_2(f, \tau_1, \tau_2)$ = second Ambiguity Transform (p. 23) |
| e(t) = complex envelope (p. 13) | $\chi_3(f, \tau_1, \tau_2, \tau_3)$ = third Ambiguity Transform (p. 24) |
| $\psi_c$ = carrier phase (p. 15) | $\chi_N(f, \tau_1, \ldots, \tau_N)$ = N-th Ambiguity Transform (p. 25) |
| $a_n(t)$ = amplitude modulation (p. 15) | A = constant signal amplitude (p. 15) |
| $\phi_n(t)$ = phase modulation (p. 15) | $\alpha$ = unknown delay (p. 27) |
| $P_T(t)$ = unit pulse (p. 15) | t = receiver time (p. 13) |
| $R_n$ = random chirp slope (p. 16) | $N_I$ = number of symbols within integration time $T_I$ (p. 28) |
| $\psi_k$ = random phase (p. 17) | |
| $T_I$ = integration time (p. 18) | l = symbol rate multiplier (l = 1, 2, ...) (p. 29) |
| B = bandwidth of $\mu(t)$ (p. 19) | |
| $U_0(f)$ = windowed Fourier transform of $\mu(t)$ (p. 19) | $\delta(t)$ = impulse function (p. 23) |
| f = frequency variable (p. 18) | (TW) = received-signal time-bandwidth product (p. 48) |
| $\tau$ = delay variable (p. 18) | |

Let the generalized spread-spectrum signal be the following amplitude- and phase-modulated analytic signal:

is then

Linear Phase: $\mu(t) = A\, e^{j(2\pi f_c t + \psi_c)} \sum_{n} e^{j(2\pi f_n t + \theta_n)} P_T(t - nT).$ (9)

PHASE MODULATION: QUADRATIC PHASE

The third type of modulation will be referred to as Quadratic (during the symbol time) Phase. That is, $$\{\phi_n(t)\} = \{\pi R_n t^2 + \theta_n\},\qquad (10)$$

where $\{R_n\}$ is a pseudo-random sequence of values. Here T is often called the chirp time. As before, the case in which $\{\theta_n\} = \theta$ is termed Coherent Quadratic Phase. For Quadratic Phase modulation, Eq. (5) is then Quadratic Phase: $\mu(t) = A\, e^{j(2\pi f_c t + \psi_c)} \sum_{n} e^{j(\pi R_n t^2 + \theta_n)} P_T(t - nT).$ (11)

Extension of the phase modulation definition to higher orders is clearly possible. However, the above three cover the most popular techniques in use today.

PHASE MODULATION: CONSTANT/LINEAR HYBRID

The fourth type of phase modulation is actually a combination of the first two, and will be referred to as the Constant/Linear Hybrid. For this type, $$\{\phi_n(t)\} = \left\{ 2\pi f_n t + \theta_n + \sum_{k} \psi_k P_{T'}(t - kT') \right\}, \qquad (12)$$

where $\{\theta_n\}$ and $\{\psi_k\}$ are random phase sequences and T' is the Constant Phase symbol duration. With the above definition, Eq. (5) becomes Constant/Linear Hybrid: $\mu(t) = A\, e^{j(2\pi f_c t + \psi_c)} \times$ (13)

$$\sum_n \exp\left( j\left[ 2\pi f_n t + \theta_n + \sum_k \times \psi_k P_{T'}(t - kT') \right] \right) P_T(t - nT)$$

$$= A\, e^{j(2\pi f_c t + \psi_c)} \sum_n \sum_k e^{j(2\pi f_n t + \theta_n + \psi_k)} \times$$

$$P_{T'}(t - kT') P_T(t - nT).$$

AMPLITUDE MODULATION

Here we include both the random amplitude and phase terms from Eq. (5) to form the hybrid signal:

Amplitude/
Phase Hybrid: $\mu(t) = A\, e^{j(2\pi f_c t + \psi_c)} \sum_{n} a_n e^{j\theta_n} P_T(t - nT),$ (14)

where $\{a_n(t)\} = \{a_n\}$, a random sequence, and $\{\theta_n\}$ is the random phase sequence considered earlier.

THE AMBIGUITY TRANSFORM

As described above and shown in FIG. 1, the receiver of this invention performs sequential ambiguity transformations by Ambiguity Transform circuits 15 through 15N, one at each receiver stage. We now define the Ambiguity Transform as an operation on the analytic signal $\mu(t)$:

$$AT[\mu(t)] = \int_{-T_I/2}^{T_I/2} \mu(t)\mu^*(t - \tau) e^{-j2\pi ft} dt \qquad (15)$$

$$= \chi(f, \tau),$$

where * indicates the complex conjugate and $T_I$ is the integration time. The term Ambiguity Transform is used because of the similarity of Eq. (15) to the ambiguity function used in radar waveform analysis as a measure of the one-pulse resolution capability for target velocity and range [7,8]. In radar waveform analysis, the ambiguity function is strictly an analytic tool and theoretical measure of radar pulse utility, is not sequentially applied, and does not contain phase information.

Parseval's theorem relates the conjugate product of two waveforms as $$\int_{-\infty}^{\infty} x(t) y^*(t)\, dt = \int_{-\infty}^{\infty} X^*(f) Y(f)\, df, \qquad (16)$$

where X(f) and Y(f) are the Fourier transforms of x(t) and y(t), respectively. Applying this theorem to the Ambiguity Transform defined in Eq. (15) gives $$\int_{-T_I/2}^{T_I/2} \mu(t)\mu^*(t - \tau) e^{-j2\pi ft} dt = \qquad (17)$$

$$e^{-j2\pi f\tau} \int_{f_c - B/2}^{f_c + B/2} U_0(\alpha) U^*(\alpha - f) e^{j2\pi \alpha \tau} d\alpha,$$

where B is the bandwidth of $\mu(t)$ and $U_O(f)$ is the windowed Fourier transform of $\mu(t)$, $$U_0(f) = \int_{-T_I/2}^{T_I/2} \mu(t) e^{-j2\pi ft} dt. \qquad (18)$$

For long integration times ($T_I \gg \tau$, 1/B), the above relationship becomes $$\int_{-T_I/2}^{T_I/2} \mu(t)\mu^*(t - \tau) e^{-j2\pi ft} dt = \qquad (19)$$

$$e^{-j2\pi f\tau} \int_{f_c - B/2}^{f_c + B/2} U_0(\alpha) U_0^*(\alpha - f) e^{j2\pi \alpha \tau} d\alpha.$$

Thus the same result is achieved by applying the Ambiguity Transform to either $\mu(t)$ or $U_O(f)$. There is, however, a reversal in the roles of f and $\tau$. That is, $\tau$ is the shift variable and f is the Fourier transform variable when the Ambiguity Transform is applied to $\mu(t)$, whereas the reverse is true when the Ambiguity Transform is applied to $U_O(f)$. We may then equate, subject to the reversal of $\tau$ and f, the following two operations:

$$\rightarrow \boxed{AT} \rightarrow\ =\ \rightarrow \boxed{FT} \rightarrow \boxed{AT} \rightarrow. \qquad (20)$$

Another expression for the Ambiguity Transform results from the bandpass nature of the received signal s(t) [and therefore $\mu(t)$]. With only the baseband terms retained, the Ambiguity Transform may be written as $$AT[\mu(t)] = 2 \int_{-T_I/2}^{T_I/2} \mu(t)s(t - \tau) e^{-j2\pi ft} dt. \quad (21)$$

AMBIGUITY TRANSFORM IMPLEMENTATION

The above relationships allow several configurations to be used for the Ambiguity Transform circuits 15 through 15N shown in FIG. 1. The first is derived from the left side of Eq. (19) and is presented in FIG. 2.

Figure 2:
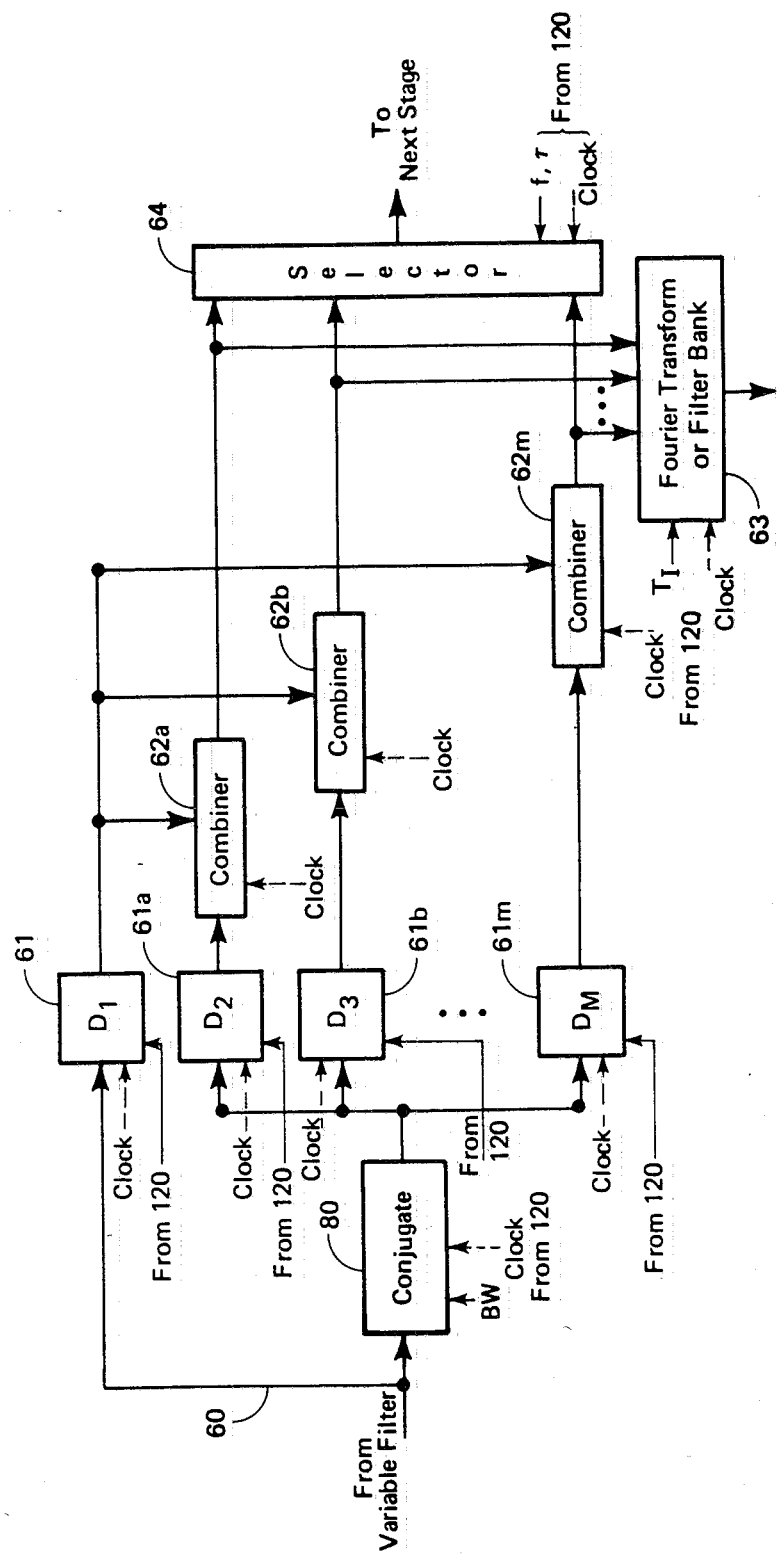
FIG. 2 is a block diagram of one embodiment of the Ambiguity Transform subsystem of this invention.

Now referring to FIG. 2, the band from the Variable Filter 14 of FIG. 1 is introduced on lead 60 into a delay standard 61, while its conjugate is derived in the Conjugate block 80 and the conjugate introduced into a plurality of discrete delays 61a through 61m.

In the embodiment of FIG. 2, there are M variable delays, each implemented by one of the M blocks labeled $D_1, \ldots, D_M$. Of these shifted outputs, (M−1) are then combined in respective Combiners 62a through 62m with a standard output (labeled $D_1$). In an analog signal receiver, the Combiners 62a through 62m may be mixers or multipliers, with the selected output being the difference frequency. In a digital embodiment, the Combiners 62a through 62m may be digital multipliers. The output of each Combiner 62a through 62m is individually fed into a filter bank or Fourier-transformed (for our purposes, the two are equivalent) in block 63, and forms each Ambiguity Transform output labeled "1" in FIG. 1. Each Combiner 62a through 62m output is also input to a Selector 64 in FIG. 2, which, by command from the Timing and Control subsystem 120 of FIG. 1, selects one or more of the Combiner 62a through 62m outputs to form each Ambiguity Transform output labeled "2" in FIG. 1.

Control and timing inputs to the elements of FIG. 2 and succeeding figures are indicated by incoming arrows—solid if present in each embodiment of the invention, and dashed if optional or present in a digital embodiment.

Second Embodiment of Ambiguity Transform

Figure 3:
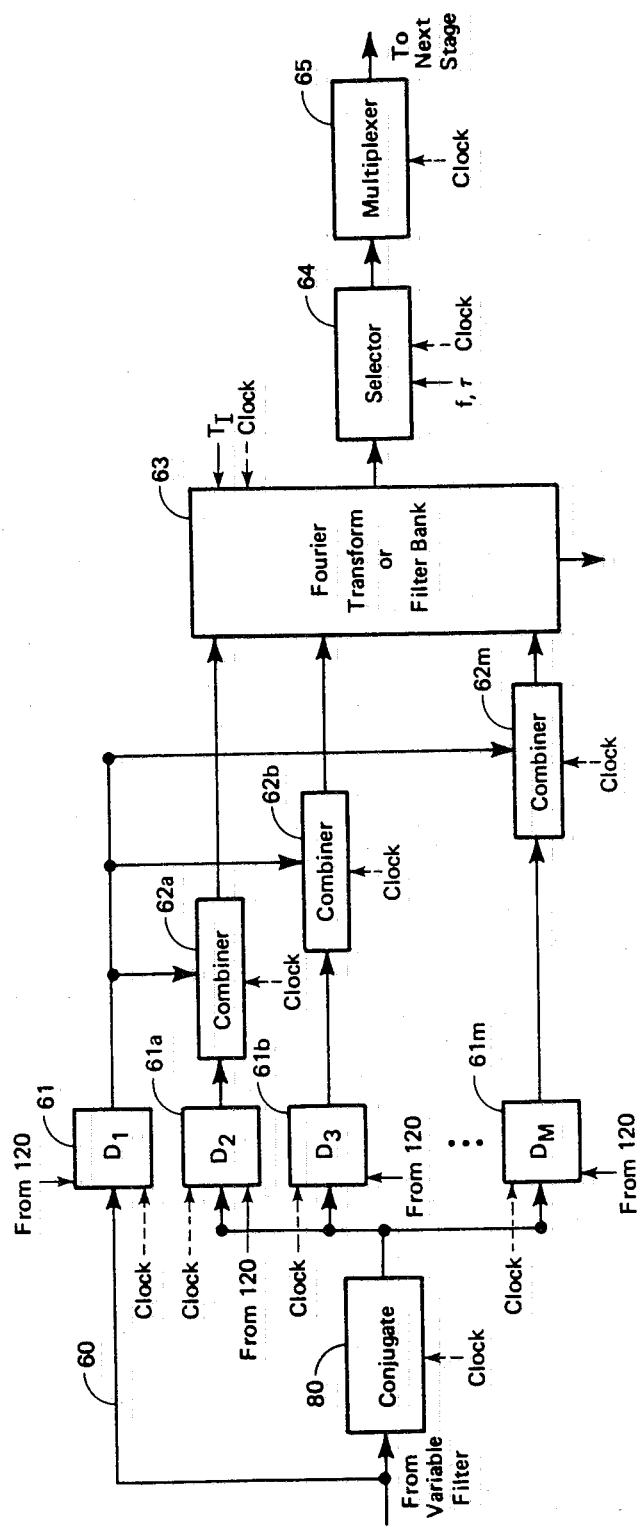
FIG. 3 is a block diagram of a second embodiment of the Ambiguity Transform subsystem of this invention.

The second configuration of the Ambiguity Transform is derived from the right side of Eq. (19), and is shown in FIG. 3, with identical elements bearing the same reference numerals. Here the frequency variable f is discrete since the shift again consists of M values, each implemented by the M delays labeled $D_1, \ldots, D_M$. Of these outputs, (M−1) are then combined with a standard output (labeled $D_1$). The output of each Combiner 62a through 62m is individually fed into a filter bank or Fourier-transformed in block 63 and forms each Ambiguity Transform output labeled "1" in FIG. 1. Each Fourier Transform 63 output is also input to a Selector 64, which, by command from the Timing and Control subsystem 120 of FIG. 1, selects none, one, or more ranges of the transform variable $\tau$ (recall the reversal of $\tau$ and f discussed above). Each Selector 64 output is then introduced into the Multiplexer 65, which converts the $\tau$-serial/f-parallel input to a $\tau$-parallel/f-serial output and forms each Ambiguity Transform output labeled "2" in FIG. 1.

Third Embodiment of Ambiguity Transform

Figure 4:
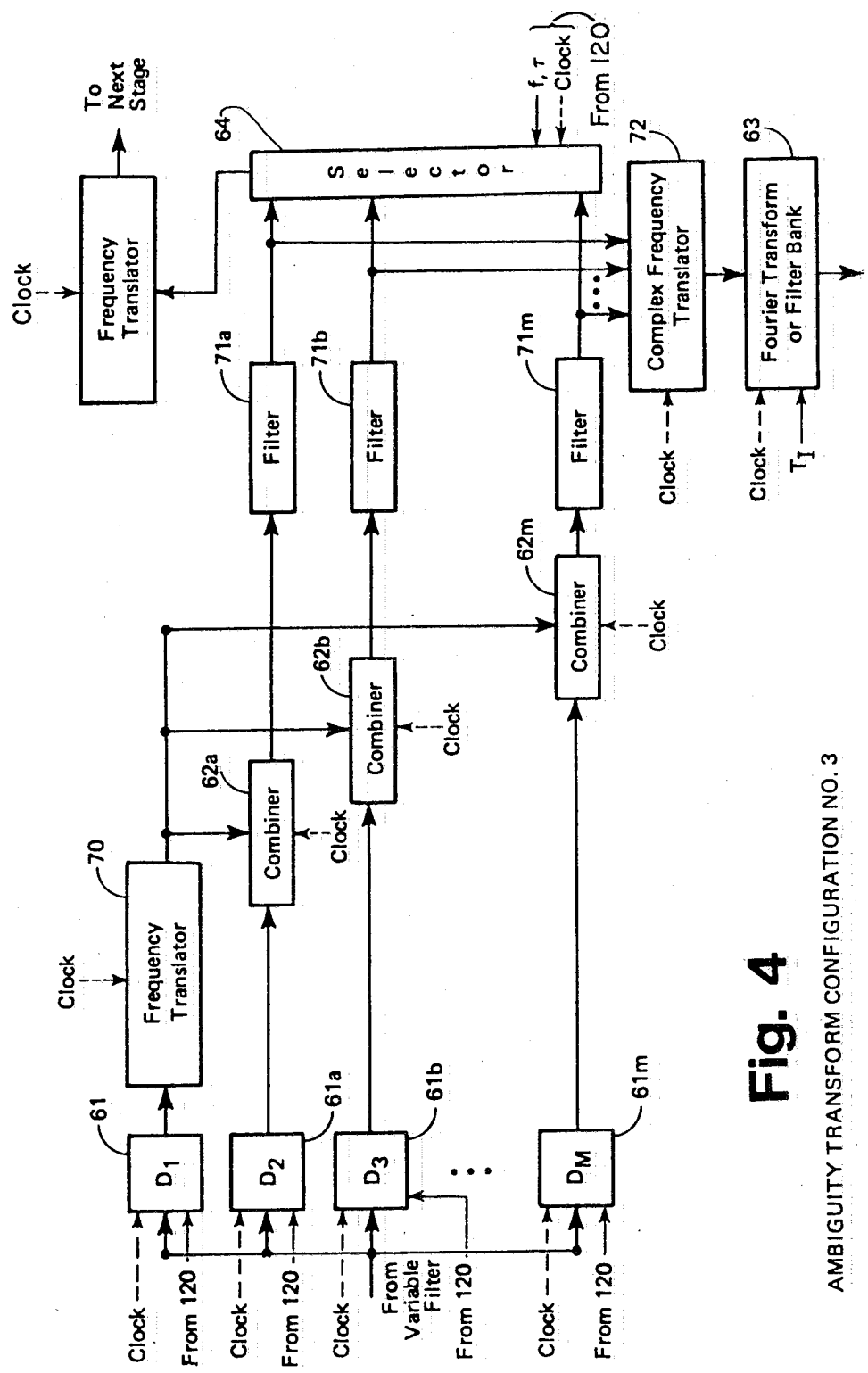
FIG. 4 is a block diagram of a third embodiment of the Ambiguity Transform subsystem of this invention.

As illustrated in FIG. 4, the third embodiment of the Ambiguity Transform employs M variable time delays 61 through 61m and receives the input signal in parallel. Again, the signal channel through delay 61 constitutes the standard and is introduced into the Frequency Translator 70 before being combined with each of the other channels in Combiners 62a through 62m. The combined outputs are each introduced into respective Filters 71a through 71m and, as in the embodiment of FIG. 2, are introduced as inputs to the Selector 64 and the Fourier Transform or Filter Bank 63, the latter after frequency translation in the Complex Frequency Translator 72.

The third configuration of the Ambiguity Transform is again based on the left side of Eq. (19), but develops the integrand through selected frequency translations and filtering. The input to all M shift delay blocks 61 through 61m is the real bandpass signal s(t) defined in Eq. (1). The delay standard block 61 output is then translated in frequency by $\Delta f_1$ in the Translator 70, as indicated in FIG. 4. The other (M−1) delay block 61a through 61m outputs are combined with the frequency-translated reference and filtered in bandpass Filters 71a through 71m to select the difference frequency term. Each of the Filter 71a through 71m outputs is then at a center frequency equal to $\Delta f_1$. The in-phase and quadrature components of the filter outputs are frequency-translated to baseband in the Translator 72, where they are individually fed into a filter bank or Fourier-transformed in block 63. This provides each Ambiguity Transform output labeled "1" in FIG. 1. The same Filter 71a through 71m outputs are also translated in frequency and input to the Selector 64. Here, by command from the Timing and Control subsystem 120 of FIG. 1, one or more of the frequency-translated signals is selected to form the Ambiguity Transform output labeled "2" in FIG. 1.

Fourth Embodiment of Ambiguity Transform

Figure 5:
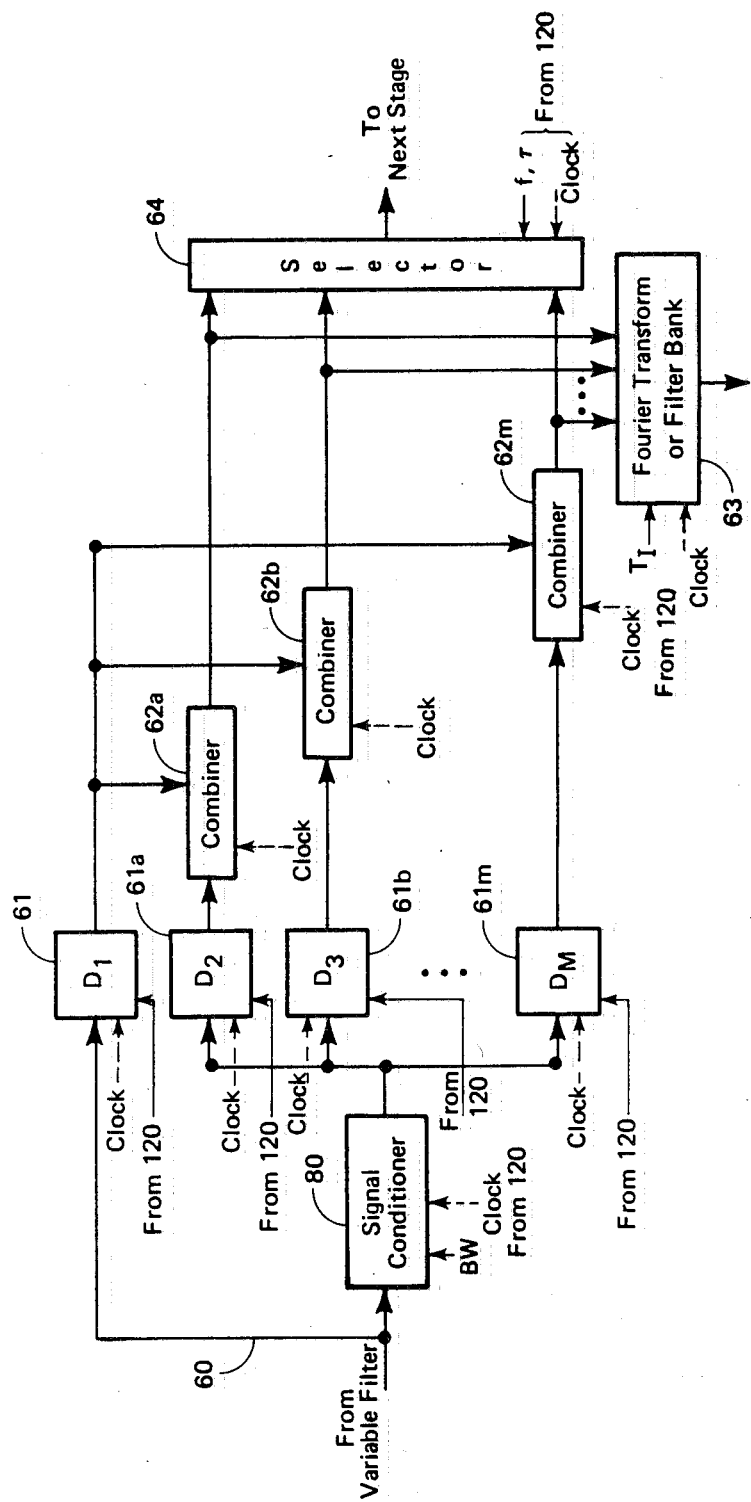
FIG. 5 is a block diagram of a fourth embodiment of the Ambiguity Transform subsystem of this invention.

The fourth configuration of the Ambiguity Transform is based on Eq. (21), and is shown in FIG. 5. It is similar to the first configuration (FIG. 2), with the exception of the substitution of Signal Conditioner 80 for the Conjugate deriver 80 of FIG. 2. This block forms the analytic signal representation [$\mu(t)$] of s(t), as required by Eq. (21). The operation of this fourth embodiment is as described for the first configuration (FIG. 2).

CASCADED AMBIGUITY TRANSFORMS

A key feature of this invention is the sequential application of the Ambiguity Transforms 15 through 15N, as shown in the system of FIG. 1. The first-stage 13 output (the Constant Phase Stage) is, from Eq. (15), $$\chi_1(f, \tau_1) = \int_{-T_I/2}^{T_I/2} \mu(t)\mu^*(t - \tau_1) e^{-j2\pi ft} dt. \quad (22)$$

The second-stage 30 output (the Linear Phase Stage) is then $$\chi_2(f,\tau_1,\tau_2) = e^{-j2\pi f\tau_2} \int_{-B}^{B} \chi_1(\alpha,\tau_1)\chi_1^*(\alpha-f,\tau_1)e^{j2\pi\alpha\tau_2}d\alpha \quad (23)$$

$$= e^{-j2\pi f\tau_2} \int_{-T_I/2}^{T_I/2} \int_{-T_I/2}^{T_I/2} \mu(t)\mu^*(t-\tau_1)\mu^*(\gamma)\mu(\gamma-\tau_1) \times \quad (24)$$

-continued
$$e^{-j2\pi f\gamma} \int_{-B}^{B} e^{-j2\pi\alpha(t-\gamma-\tau_2)} d\alpha\, dt\, d\gamma.$$

The last integral in Eq. (24) approaches the delta function as B becomes large relative to $(T_I+\tau_2)^{-1}$, or approximately $1/T_I$. That is, $$\underset{BT_I \to \infty}{\text{Lim}} \int_{-B}^{B} e^{-j2\pi\alpha(t-\gamma-\tau_2)} d\alpha = \quad (25)$$

$$\delta(t - \gamma - \tau_2), \quad -T_I/2 \leq \gamma, t \leq T_I/2.$$

Under this condition, Eq. (24) becomes $$\chi_2(f, \tau_1, \tau_2) = \int_{-T_I/2}^{T_I/2} \mu(t)\mu^*(t - \tau_1)\mu^*(t - \tau_2) \times \quad (26)$$

$$\mu(t - \tau_1 - \tau_2) e^{-j2\pi ft} dt.$$

Equation (26) is the output of the Linear Phase Stage in FIG. 1. Proceeding as above, the output of the third stage 40 is $$\chi_3(f, \tau_1, \tau_2, \tau_3) = \quad (27)$$

$$e^{-j2\pi f\tau_3} \int_{-2B}^{2B} \chi_2(\alpha, \tau_1, \tau_2)\chi_2^*(\alpha - f, \tau_1, \tau_2) e^{j2\pi\alpha\tau_3} d\alpha$$

$$= A^8 \int_{-T_I/2}^{T_I/2} \mu(t)\mu^*(t - \tau_1)\mu^*(t - \tau_2) \times$$

$$\mu^*(t - \tau_3)\mu(t - \tau_1 - \tau_2)\mu(t - \tau_1 - \tau_3) \times$$

$$\mu(t - \tau_2 - \tau_3)\mu^*(t - \tau_1 - \tau_2 - \tau_3) e^{-j2\pi ft} dt,$$

where we again assume large $BT_I$.

In general, the output of the Nth stage is $$\chi_N(f, \tau_1, \ldots, \tau_N) = A^{2N} \int_{-T_I/2}^{T_I/2} \mu(t) \prod_{n=1}^{N} \mu^*(t - \tau_n) \times \quad (28)$$

$$\prod_{k=1}^{N-1} \prod_{n=k+1}^{N} \mu(t - \tau_k - \tau_n) \prod_{l=1}^{N-2} \prod_{k=l+1}^{N-1} \prod_{n=k+1}^{N} \times$$

$$\mu^*(t - \tau_l - \tau_k - \tau_n) \ldots \mu\left(t - \sum_{n=1}^{N} \tau_n\right) e^{-j2\pi ft} dt,$$

where $\pi$ is the product notation:

$$\prod_{n=1}^{N} a_n = a_1 a_2 \ldots a_N.$$

Examination of Eq. (28) shows that each product has $\binom{N}{N_\tau}$ factors, where $N_\tau$ is the number of delay variables appearing in the argument of $\mu(t)$. Thus, the total number of factors is $2^N$.

SPECTRAL LINES AND THE AMBIGUITY TRANSFORM

It is now possible to explain how this invention can produce spectral lines when the input contains members of the class of digitally modulated signals described above. Further, we show the relationships, presented in Table 1, between modulation type and the required number of stages.

TABLE 1

| REQUIRED STAGES | |
|---|---|
| Modulation Type | Minimum Number of Stages |
| Constant Phase | 1 |
| Amplitude | 1 |
| Amplitude/Constant Phase Hybrid | 1 |
| Linear Phase | 2 |
| Linear/Constant Phase Hybrid | 2 |
| Quadratic Phase | 3 |
| . | . |
| . | . |
| . | . |
| (n − 1)th-Order Phase | n |

CONSTANT PHASE

First consider Constant Phase modulation as defined in Eq. (7). The output of the first Ambiguity Transform stage is, from Eqs. (7) and (22), $$\chi_1(f, \tau_1) = \int_{-T_I/2}^{T_I/2} A^2 e^{j[2\pi fc(t-\alpha)+\psi_c]} \sum_n e^{j\theta_n} P_T(t - nT - \alpha) \times \quad (29)$$

$$e^{-j[2\pi fc(t-\alpha-\tau_1)t+\psi_c]} \sum_k e^{-j\theta_k} \times P_T(t - kT - \alpha - \tau_1) e^{-j2\pi ft} dt.$$

where we have introduced the unknown delay $\alpha$ to include the relative discrepancy between the system and the timing function of circuit 120 (of FIG. 1) and the remote transmitter clock.

Changing variables under the integral and collecting terms, we have $$\chi_1(f, \tau_1) = A^2 e^{j2\pi fc\tau_1} e^{-j2\pi f\alpha} \sum_n \sum_k e^{j(\theta_n - \theta_k)} e^{-j2\pi fnT} \times \quad (30)$$

$$\int_{-T/2}^{T/2} P_T[t + (n - k)T - \tau_1] e^{-j2\pi ft} dt.$$

We now consider the shift variable $\tau_1$ in the range $0 \leq \tau_1 \leq T$. The above integral is then nonzero only for $n=k$ and $n=k+1$. Thus Eq. (30) becomes $$\chi_1(f, \tau_1) = \quad (31)$$

$$A^2 e^{j2\pi fc\tau_1} e^{-j2\pi f\alpha} \sum_{n=-N_I/2}^{N_I/2} e^{-j2\pi fnT} \left[ \int_{-T/2 + \tau_1}^{T/2} e^{-j2\pi ft} dt + \right.$$

$$\left. \int_{-T/2}^{-T/2 + \tau_1} e^{j(\theta_n - \theta_{n-1})} e^{-j2\pi ft} dt \right], \quad 0 \leq \tau_1 \leq T,$$

where $N_I$ is the number of symbols within the integration time $T_I$. (Since we assume $T_I >> T$, we ignore the fractional part of $T_I/T$.) Carrying out the indicated integration, we have $$\chi_1(f, \tau_1) = \quad (32)$$

$$A^2 e^{j2\pi fc\tau_1} e^{-j2\pi f(\tau_1/2 + \alpha)} \left[ \frac{\sin \pi f(T - \tau_1)}{\pi f} \sum_{n=-N_I/2}^{N_I/2} e^{-j2\pi fnT} + \right.$$

-continued $$e^{j2\pi f T/2}\left(\frac{\sin \pi f \tau_1}{\pi f}\right) \sum_{n=-N_I/2}^{N_I/2} e^{-j2\pi fnT}e^{j(\theta_n-\theta_{n-1})}\Bigg]$$

$$= A^2 e^{j2\pi f c \tau_1} e^{-j2\pi f(\tau_1/2+\alpha)}[G_1(f, \tau_1) + G_2(f, \tau_1)], \quad 0 \leq \tau_1 \leq T.$$

The Ambiguity Transform of a Linear Phase digitally modulated signal with $\tau_1$ less than the symbol duration T is therefore the sum of two terms.

The first is of primary interest and is a deterministic function of the Fourier series kernel:

$$\sum_{n=-N_I/2}^{N_I/2} e^{-j2\pi fnT} = \frac{\sin (N_I + 1)\pi fT}{\sin (\pi fT)} \quad (33)$$

$$\approx \frac{\sin \pi fN_IT}{\sin \pi fT}, \quad N_I \gg 1.$$

This term is clearly periodic in f with period 1/T, the maximum value in each period being $N_I$. It is well known in accordance with Ref. 9 that Eq. (33) approaches a sequence of delta functions (spectral lines) as $N_I$ becomes large. That is, $$\lim_{N_I\to\infty} \sum_{n=-N_I/2}^{N_I/2} e^{-j2\pi fnT} = \frac{1}{T} \sum_{n=-\infty}^{\infty} \delta(f - n/T). \quad (34)$$

For large integration times, $G_1(f, \tau_1)$ therefore becomes a sequence of spectral lines at integer multiples of the symbol rate (1/T). Detection of one or more of these lines indicates (1) the presence of Constant Phase digital modulation, and (2) the corresponding symbol (clock) rate.

At multiples of the symbol rate, $|G_1(f, \tau_1)|^2$ becomes $$|G_1(l/T, \tau_1)|^2 = \left(\frac{T_I}{\pi l}\right)^2 [\sin \pi l(1 - \tau_1/T)]^2. \quad (35)$$

The amplitude is then dependent not only on the Ambiguity Transform integration time, but also on the ratio $\tau_1/T$. In fact, the amplitude is sinusoidally dependent and is maximized for $\tau_1/T = 1 - \frac{1}{2}l$. The first spectral line ($f = \pm 1/T$) is maximum when $\tau_1 = T/2$—or one-half the symbol duration. Because of the sinusoidal dependence, the $-3$ dB power range is $\frac{1}{4} \leq \tau_1/T \leq \frac{3}{4}$—a rather large allowable deviation.

The second term in Eq. (32) is a function of the random variable $\theta_n - \theta_{n-1}$, and is the Fourier transform of a Constant Phase signal as defined in Eq. (7). Since the $\{\theta_n\}$ are uncorrelated, the expected value of $G_2(f, \tau_1)$ is $$G_2(f, \tau_1) = 0 \quad (36)$$

and its variance $$\overline{|G_2(f, \tau_1)|^2} = \frac{T_I}{T}\left(\frac{\sin \pi f \tau_1}{\pi f}\right)^2. \quad (37)$$

With $f=1/T$ (i.e., at the spectral line locations), the ratio of the power in the spectral line to that in the second term is $$\frac{|G_1(l/T, \tau_1)|^2}{|G_2(l/T, \tau_1)|^2} = T_I/T. \quad (38)$$

For large values of $T_I/T$, we may therefore ignore the second term in Eq. (32) and the first-stage Ambiguity Transform output becomes $$\chi_1(l/T, \tau_1) = \quad (39)$$

$$A^2 e^{j2\pi fc\tau_1}e^{-j2\pi(l/T)(\alpha+\tau_1/2)}\left(\frac{T_I}{\pi l}\right)\sin \pi l(1 - \tau_1/T).$$

The magnitude of $\chi_1(l/T, \tau_1)$ is then $$|\chi_1(l/T, \tau_1)|^2 = A^4\left(\frac{T_I}{\pi l}\right)^2 \sin^2[\pi l(1 - \tau_1/T)], \quad (40)$$

and the phase $$\angle \chi_1(l/T, \tau_1) = 2\pi[(f_c - l/2T)\tau_1 - l\alpha/T]. \quad (41)$$

Examination of the phase shows that, since $\tau_1$ and 1/T are both known, the carrier frequency ($f_c$) and group delay ($\alpha$) of the detected Constant Phase signal may be determined (modulo $2\pi$). That is, $$f_c = \frac{1}{4\pi\tau_1}[\angle\chi_1(l/T, \tau_1) + \angle\chi_1(-l/T, \tau_1)] \quad (42)$$

with ambiguity $\pm n/\tau_1$, n=0, 1, ..., and $$\alpha = \frac{T}{4\pi l}[\angle\chi_1(-l/T, \tau_1) - \angle\chi_1(l/T, \tau_1)] - \frac{\tau_1}{2} \quad (43)$$

with ambiguity $\pm nT/l$, n=0, 1, .... The clock phase is of course $2\pi\alpha/T$.

In summary, the detection of a spectral line in the first-stage Ambiguity Transform output indicates (1) the presence of a Constant Phase (digitally modulated) signal, (2) the symbol rate (clock rate), (3) the relative group delay of the received signal, (4) the phase of the clock, and (5) the received-signal center frequency.

LINEAR PHASE

Proceeding as above, we substitute the Linear Phase signal from Eq. (9) into the expression for two cascaded Ambiguity Transforms given by Eq. (26). After some manipulation, we have $$\chi_2(f, \tau_1, \tau_2) = \quad (44)$$

$$A^4 e^{-j2\pi f\alpha} \sum_n \sum_{l_1} \sum_{l_2} \sum_{l_3} e^{-j2\pi fnT}e^{j2\pi[f_1\tau_1+f_2\tau_2-f_3(\tau_1+\tau_2)]} \times$$

$$e^{j(\theta_n-\theta_{l_1}-\theta_{l_2}+\theta_{l_3})} \int_{-T/2}^{T/2} P_T[t - (l_1 - n)T - \tau_1]P_T[t -$$

$$(l_2 - n)T - \tau_2] \times P_T[t - (l_3 - n)T - \tau_1 -$$

$$\tau_2]e^{j2\pi(f_n-f_{l_1}-f_{l_2}-f_{l_3})t}e^{-j2\pi f t}dt,$$

where $\tau_2 \geq \tau_1$. We consider values of $\tau_1$ and $\tau_2$ such that $$0 < \tau_1 + \tau_2 < T. \tag{45}$$

Over this range, the above integral is nonzero only for the combinations shown in Table 2.

TABLE 2
VALID INDEX COMBINATIONS - LINEAR PHASE

| Index Combination | | | | | |
|---|---|---|---|---|---|
| n | $l_1$ | $l_2$ | $l_3$ | Result | Bandwidth |
| n | n | n | n | Spectral Lines | $1/T_I$ |
| n | n | n | n-1 | Random Linear Phase | $(\tau_1)^{-1}$ |
| n | n | n-1 | n-1 | Random Constant Phase | $(\tau_2 - \tau_1)^{-1}$ |
| n | n-1 | n-1 | n-1 | Random Linear Phase | $(\tau_1)^{-1}$ |

Equation (45) is thus composed of four terms corresponding to the four valid combinations of the summation indices. After performing the four integrations, we have $$\chi_2(f, \tau_1, \tau_2) = A^4 \Bigg\{ e^{-j2\pi f[(\tau_1+\tau_2)/2+\alpha]} \left[ \frac{\sin\pi f(T-\tau_1-\tau_2)}{\pi f} \right] \left( \frac{\sin\pi fN_I T}{\sin\pi fT} \right) + \tag{46}$$

$$e^{-j2\pi f[(T-\tau_1)/2+\alpha]} \sum_{n=-N_I/2}^{N_I/2} e^{-j2\pi f_n T} e^{j2\pi (f_n-f_{n-1})\tau_1/2} e^{-j(\theta_n-\theta_{n-1})} \left[ \frac{\sin\pi (f+f_n-f_{n-1})\tau_1}{\pi(f+f_n-f_{n-1})} \right] +$$

$$e^{-j2\pi f[(T-\tau_1-\tau_2)/2+\alpha]} \left[ \frac{\sin\pi f(\tau_2-\tau_1)}{\pi f} \right] \sum_{n=-N_I/2}^{N_I/2} e^{-j2\pi f_n T} e^{j2\pi (f_n-f_{n-1})\tau_1} +$$

$$e^{-j2\pi f[(T-\tau_1)/2+\alpha]} \sum_{n=-N_I/2}^{N_I/2} e^{-j2\pi f_n T} e^{-j2\pi (f_n-f_{n-1})[(T-\tau_1)/2]} e^{j(\theta_n-\theta_{n-1})} \left[ \frac{\sin\pi (f-f_n+f_{n-1})\tau_1}{\pi(f-f_n+f_{n-1})} \right] \Bigg\}.$$

Like Constant Phase signals through one Ambiguity Transform, Linear Phase signals through two Ambiguity Transforms have a deterministic first term composed of spectral lines at multiples of the symbol rate $f=1/T$. That is, for long integration times ($T_I >> T$), the first term in Eq. (46) becomes $$G_1(l/T, \tau_1, \tau_2) = \tag{47}$$

$$e^{-j2\pi l/T[(\tau_1+\tau_2)/2+\alpha]} \left( \frac{T_I}{\pi l} \right) \sin\pi l \left( 1 - \frac{\tau_1+\tau_2}{T} \right).$$

The magnitude of the spectral lines is thus dependent on the integration time and sinusoidally dependent on $(\tau_1+\tau_2)/T$, and is maximized when $(\tau_1+\tau_2)/T = 1 - \frac{1}{2}l$. The first line ($l=\pm 1$) is therefore maximum when $(\tau_1+\tau_2)=T/2$. The $-3$ dB power range is again $\frac{1}{4} \leq (\tau_1+\tau_2)/T \leq \frac{3}{4}$.

The second, third, and fourth terms are random in either $f_n$ or $\theta_n$, or both. The second and fourth terms are the Fourier transforms of Linear Phase signals with random frequencies $\pm(f_n-f_{n-1})$, and the third term is the Fourier transform of a random Constant Phase signal. Therefore, the last three terms contain no spectral lines and are negligible for $T_I >> T$. Thus we have $$\chi_2(l/T, \tau_1, \tau_2) = \tag{48}$$

$$A^4 \left( \frac{T_I}{\pi l} \right) e^{-j2\pi(l/T)[(\tau_1+\tau_2)/2+\alpha]} \sin\pi l \left( 1 - \frac{\tau_1+\tau_2}{T} \right).$$

Upon detection of spectral lines at $1/T$, all the variables in the above expression are known with the exception of $\alpha$, the received-signal group delay. Thus $$\alpha = -\left( \frac{\tau_1+\tau_2}{2} \right) - \frac{T}{2\pi l} \angle \chi(l/T, \tau_1, \tau_2) \tag{49}$$

with the received clock phase$=2\pi\alpha/T$.

Detection of one or more spectral lines at the output of the second Ambiguity Transform stage therefore indicates, subject to acceptance by the Detection Logic, (1) the presence of a Linear Phase digitally modulated signal, (2) the symbol rate (1/T), and (3) the received-signal group delay and clock phase.

QUADRATIC PHASE

Proceeding as before, we substitute the Quadratic Phase signal from Eq. (11) into the expression for the third Ambiguity Transform stage output given in Eq. (27). After considerable manipulation, we have $$\chi_3(f, \tau_1, \tau_2, \tau_3) = A^8 \sum_n \sum_{l_1} \ldots \sum_{l_7} e^{j\psi_1} e^{-j\psi_2(R,\tau_2)} \times \tag{50}$$

$$\int_{-T/2}^{T/2} e^{-j\psi_3(R,\tau)(t+nT+\alpha)} e^{j\psi_4(R)(t+nT+\alpha)^2} \times$$

$$e^{-j2\pi f(t+nT+\alpha)} P_T[t - (l_1-n)T - \tau_1] \times$$
$$P_T[t - (l_2-n)T - \tau_2] P_T[t - (l_3-n)T - \tau_3] \times$$
$$P_T[t - (l_4-n)T - \tau_1 - \tau_2] P_T[t - (l_5-n)T - \tau_1 - \tau_3] \times$$
$$P_T[t - (l_6-n)T - \tau_2 - \tau_3] \times P_T[t - (l_7-n)T - \tau_1 - \tau_2 - \tau_3] dt,$$

where $$\psi_1 = \theta_n - \theta_{l_1} - \theta_{l_2} + \theta_{l_3} - \theta_{l_4} + \theta_{l_5} + \theta_{l_6} - \theta_{l_7}, \tag{51}$$

$$\psi_2(R, \tau) = \pi[(R_{l_1} - R_{l_3} - R_{l_5} + R_{l_7})\tau_1^2 + \tag{52}$$
$$(R_{l_2} - R_{l_3} - R_{l_6} + R_{l_7})\tau_2^2 + (R_{l_4} - R_{l_5} - R_{l_6} + R_{l_7})\tau_3^2 +$$
$$2(R_{l_7} - R_{l_3})\tau_1\tau_2 + 2(R_{l_7} - R_{l_5})\tau_1\tau_3 + 2(R_{l_7} - R_{l_6})\tau_2\tau_3],$$

$$\psi_3(R, \tau) = 2\pi[R_{l_1} - R_{l_3} - R_{l_5} + R_{l_7})\tau_1 + \tag{53}$$
$$(R_{l_2} - R_{l_3} - R_{l_6} + R_{l_7})\tau_2 + (R_{l_4} - R_{l_5} - R_{l_6} + R_{l_7})\tau_3],$$

and $$\psi_4(R) = \pi(R_n - R_{l_1} - R_{l_2} + R_{l_3} - R_{l_4} + R_{l_5} + R_{l_6} - R_{l_7}). \tag{54}$$

Since the above expression is cumbersome, we only summarize the integration results. We again are interested in $0 < \tau_1 + \tau_2 + \tau_3 < T$ with $\tau_1 \leq \tau_2 \leq \tau_3$. Under these conditions, the integral is nonzero only for the eight index combinations listed in Table 3.

The third Ambiguity Transform stage output is therefore the sum of eight terms, only the first of which is deterministic. For large $T_I$, we may ignore the remaining seven random terms, and Eq. (50) becomes $$\chi_3(f, \tau_1, \tau_2, \tau_3) = A^8 e^{-j2\pi f[(\tau_1+\tau_2+\tau_3)/2+\alpha]} \times \quad (55)$$

$$\left[ \frac{\sin\pi f(T - \tau_1 - \tau_2 - \tau_3)}{\pi f} \right] \left( \frac{\sin\pi f N_I T}{\sin\pi f T} \right).$$

Again we have spectral lines at integer multiples of the symbol rate $f=1/T$:

TABLE 3
VALID INDEX COMBINATIONS - QUADRATIC PHASE

| Index Combination | | | | | | | | Result | Bandwidth |
|---|---|---|---|---|---|---|---|---|---|
| n | l₁ | l₂ | l₃ | l₄ | l₅ | l₆ | l₇ | | |
| n | n | n | n | n | n | n | n | Spectral Lines | $(T_I)^{-1}$ |
| n | n | n | n | n | n | n | n-1 | Random Q-Phase | $(\tau_1)^{-1}$ |
| n | n | n | n | n | n | n-1 | n-1 | Random L-Phase | $(\tau_2 - \tau_1)^{-1}$ |
| n | n | n | n | n | n-1 | n-1 | n-1 | Random Q-Phase | $(\tau_1)^{-1}$ |
| n | n | n | n | n-1 | n-1 | n-1 | n-1 | Random C-Phase | $(\tau_3 - \tau_1 - \tau_2)^{-1}$ |
| n | n | n | n-1 | n-1 | n-1 | n-1 | n-1 | Random Q-Phase | $(\tau_1)^{-1}$ |
| n | n | n-1 | n-1 | n-1 | n-1 | n-1 | n-1 | Random L-Phase | $(\tau_2 - \tau_1)^{-1}$ |
| n | n-1 | n-1 | n-1 | n-1 | n-1 | n-1 | n-1 | Random Q-Phase | $(\tau_1)^{-1}$ |

$$\chi_3(l/T, \tau_1, \tau_2, \tau_3) = A^8 e^{-j2\pi(l/T)[(\tau_1+\tau_2+\tau_3)/2+\alpha]} \times \quad (56)$$

$$\left( \frac{T_I}{\pi l} \right) \sin\pi l \left( 1 - \frac{\tau_1 + \tau_2 + \tau_3}{T} \right).$$

The magnitude is dependent on the integration time and sinusoidally dependent on $(\tau_1+\tau_2+\tau_3)/T$, and is maximized when $(\tau_1+\tau_2+\tau_3)/T=1-\frac{1}{2}l$. The first spectral line $(l=\pm 1)$ is therefore maximum when $(\tau_1+\tau_2+\tau_3)=T/2$. The −3 dB power range is again $\frac{1}{4} \leq (\tau_1+\tau_2+\tau_3)/T \leq \frac{3}{4}$.

Upon detection of spectral lines at 1/T, all the variables in the above equation are known with the exception of $\alpha$, the received-signal group delay. Then $$\alpha = -\left( \frac{\tau_1 + \tau_2 + \tau_3}{2} + \frac{T}{2\pi l} \angle \chi_3(l/T, \tau_1, \tau_2, \tau_3) \right) \quad (57)$$

with the received clock phase $=2\pi\alpha/T$.

Detection of one or more spectral lines at the output of the third Ambiguity Transform stage therefore indicates, subject to acceptance by the Detection Logic 200, (1) the presence of a Quadratic Phase digitally modulated signal, (2) the symbol rate (1/T), and (3) the received-signal group delay and transmitter clock phase.

EXTENSION TO HIGHER-ORDER PHASES

The results derived thus far, combined with the general expression for the Nth Ambiguity Transform stage output given in Eq. (28), clearly show that, with (N−1)th-order phase input to the receiver of this invention, (1) spectral lines are present at the Nth-stage Ambiguity Transform output when $$0 < \sum_{i=1}^{N} \tau_i < T,$$

(2) the lines are located at the symbol rate $f=1/T$, and (3) the phase of the received signal clock is contained in the phase of the spectral lines.

CONSTANT/LINEAR HYBRID

Referring to the expression for the Constant Phase/Linear Phase hybrid digitally modulated signal [Eq. (13)], and substituting in the equation for the second Ambiguity Transform stage output [Eq. (26)], we have an expression containing eight summations. These may be treated similarly to the eight summations encountered in the Quadratic Phase analysis, but here the result is that only four index combinations are valid. We order the indices such that the first four (n, l₁, l₂, l₃) represent the Constant Phase terms in Eq. (13), and the last four the Linear Phase terms. We also assume the Linear Phase symbol duration (T) is greater than that for the Constant Phase (T'). If the opposite is true, we simply have the noncoherent Linear Phase signal considered earlier. The valid index combinations are shown in Table 4.

TABLE 4
VALID INDEX COMBINATIONS - CONSTANT/LINEAR HYBRID

| Index Combination | | | | | | | | Result | Bandwidth |
|---|---|---|---|---|---|---|---|---|---|
| n | l₁ | l₂ | l₃ | l₄ | l₅ | l₆ | l₇ | | |
| n | n | n | n | n | n | n | n | Spectral Lines | $(T_I)^{-1}$ |
| n | n | n | n-1 | n | n | n | n-1 | Random C/L Hybrid | $(\tau_1)^{-1}$ |
| n | n | n-1 | n-1 | n | n | n-1 | n-1 | Random C Phase | $(\tau_2 - \tau_1)^{-1}$ |
| n | n-1 | n-1 | n-1 | n | n-1 | n-1 | n-1 | Random C/L Hybrid | $(\tau_1)^{-1}$ |

The resulting four terms in the second-stage Ambiguity Transform output are similar to those given in Eq. (46) for a Linear Phase input. However, here the symbol time T' is that of the Constant Phase modulation. That is, with the Constant/Linear hybrid input, $0<\tau_1+\tau_2<T'$, and $T'<T$, we have spectral lines at multiples of the symbol rate $f=1/T'$:

$$\chi_2(l/T', \tau_1, \tau_2) = \quad (58)$$

$$A^4 e^{-j2\pi(l/T')[(\tau_1+\tau_2)/2+\alpha]} \left( \frac{T_I}{\pi l} \right) \sin \pi l \left( 1 - \frac{\tau_1 + \tau_2}{T'} \right).$$

The magnitude of the spectral lines is dependent on the integration time and sinusoidally dependent on $(\tau_1+\tau_2)/T'$. The latter dependency is maximized when $(\tau_1+\tau_2)/T'=1-\frac{1}{2}l$, and the first line $(f=\pm 1/T')$ is maximized when $\tau_1+\tau_2 T'/2$.

The above results show that the second Ambiguity Transform stage output contains spectral lines when either a Linear Phase signal or a Constant/Linear hybrid signal is present at the system input. However, two important characteristics distinguish these two signals. First, the Constant Phase symbol duration T' is typically much shorter than that for the Linear Phase (e.g., T'/T≦10$^{-2}$) owing to the practical difficulties encountered with frequency sources able to rapidly tune to many different values. Thus, detection of a spectral line in the second Ambiguity Transform stage output at a frequency much greater than that normally associated with the Linear Phase is a valid indication of the hybrid.

The second distinguishing characteristic is found at the output of the first Ambiguity Transform stage when the integration time is specifically set to be less than T but greater than T'. Since the integration time is less than the Linear Phase symbol time, spectral energy will be concentrated at f=1/T', but modulated in amplitude by the integrator at a 1/T rate.

These two characteristics, individually or together, distinguish the Constant/Linear hybrid from simple Linear Phase modulation. Thus, detection of spectral lines with the above characteristics indicates (1) the presence of the hybrid, (2) the symbol rates (1/T and 1/T'), and (3) the relative group delay $\alpha$.

AMPLITUDE/PHASE HYBRID

So far we have examined several random phase modulations with $a_n(t)$, the amplitude term, constant [i.e., $a_n(t) = A$]. Here we consider the amplitude/phase hybrid:

$$\mu(t) = A\, e^{j(2\pi f_c t + \psi_c)} \sum_n a_n e^{j\theta_n} P_T(t - nT - \alpha), \quad (59)$$

where $\{a_n\}$ and $\{\theta_n\}$ are the random amplitude and phase sequences, respectively. Referring to Eq. (22) for the first Ambiguity Transform stage output, we have $$\chi_1(f,\tau_1) = A^2 e^{j2\pi f c \tau_1} \sum_{n=-N_I/2}^{N_I/2} \left( a_n^2 \int_{-T/2+\tau_1}^{T/2} e^{-j2\pi ft}dt + a_n a_{n-1} \times e^{j(\theta_n - \theta_{n-1})} \int_{-T/2}^{-T/2+\tau_1} e^{-j2\pi ft}dt \right) \quad (60)$$

$$= A^2 e^{j2\pi f c \tau_1} e^{-j2\pi f(\tau_1/2 + \alpha)} \left\{ \left[\frac{\sin\pi f(T-\tau_1)}{\pi f}\right] \sum_{n=-N_I/2}^{N_I/2} a_n^2 e^{-j2\pi fnT} + e^{j2\pi fT/2}\left(\frac{\sin\pi f\tau_1}{\pi f}\right) \sum_{n=-N_I/2}^{N_I/2} a_n a_{n-1} e^{j(\theta_n - \theta_{n-1})} e^{-j2\pi fnT} \right\}$$

for $0 < \tau_1 < T$. The first term in the braces is a function of the random variable $a_n^2$. Let the expected value be $$\overline{a_n^2} = u \quad (61)$$

and define $$a_n^2 = u + c_n, \quad (62)$$

where $c_n$ is therefore a zero mean random variable. Clearly, $u \geq 0$.

The first term in Eq. (60) becomes $$G_1(f,\tau_1) = \left[\frac{\sin\pi f(T-\tau_1)}{\pi f}\right] \left( u \sum_{n=-N_I/2}^{N_I/2} e^{-j2\pi fnT} + \sum_{n=-N_I/2}^{N_I/2} c_n e^{-j2\pi fnT} \right), \quad (63)$$

which is the sum of a deterministic and a random term. We have already shown that for the deterministic term $$\sum_{n=-N_I/2}^{N_I/2} e^{-j2\pi fnT} = \frac{\sin\pi fN_I T}{\sin\pi f} \quad (64)$$

for large $N_I$, and that Eq. (64) is periodic in f with period 1/T. Thus we have spectral lines at the output of the first-stage Ambiguity Transform located at multiples of the symbol rate f=1/T. For large integration times and f=1/T, Eq. (60) becomes $$\chi_1(l/T, \tau_1) = \quad (65)$$

$$A^2 u e^{j2\pi f c\tau_1} e^{-j2\pi(l/T)(\tau_1/2+\alpha)} \left(\frac{T_I}{\pi l}\right) \sin\pi l(1 - \tau_1/T).$$

The carrier frequency and signal group delay may be computed using Eqs. (42) and (43), respectively.

THE RECEIVER WITH INPUT NOISE

We now examine the receiver response to band-limited noise. Consistent with the previous definitions, including the analytic representation of input signals, let n(t) be the analytic signal representation of the noise at the system input. The output of the first-stage Ambiguity Transform is then $$\chi_1(f,\tau_1) = \int_{-T_I/2}^{T_I/2} n(t)n^*(t-\tau)e^{-j2\pi ft}dt. \quad (66)$$

Next assume that $1/\tau_1$ is small relative to the noise bandwidth $B_N$ ($\tau_1 \gg 1/B_N$). Then $\overline{n(t)n(t-\tau_1)}=0$ and the variance of the Ambiguity Transform output is $$\overline{|\chi_1(f,\tau_1)|^2} = \quad (67)$$

$$\int_{-T_I/2}^{T_I/2} \int_{-T_I/2}^{T_I/2} \overline{n_1(t)n_1^*(\alpha)n_2(t)n_2^*(\alpha)}\, e^{-j2\pi f(t-\alpha)}dt\, d\alpha.$$

where $n_2(t) = n_1(t-\tau_1)$. With stationary statistics, $\overline{n_1(t)n_1^*(\alpha)} = R_n(t-\alpha)$, the noise autocorrelation function. Thus Eq. (67) becomes $$\overline{|\chi_1(f,\tau_1)|^2} = \int_{-T_I/2}^{T_I/2} \int_{-T_I/2}^{T_I/2} |R_n(t-\alpha)|^2 e^{-j2\pi f(t-\alpha)}dt\, d\alpha \quad (68)$$

$$= T_I[N(f)*N(f)], \quad \tau_1 \gg 1/B_N,$$

where N(f) is the power spectrum of n(t) and we have assumed $T_I \gg 1/B_N$. With the above constraint on $\tau_1$, we see that the envelope-detected output of the first Ambiguity Transform stage is independent of $\tau_1$.

Extension of the above result of the Nth Ambiguity Transform stage is straightforward:

$$\overline{|\chi_N(f, \tau_1, \ldots, \tau_N)|^2} = T_I[N(f)^*N(f)^* \ldots *N(f)], \quad (69)$$

where there are $2^N$ terms within the brackets. This result shows the general $\tau$-independence of the envelope-detected Ambiguity Transform output.

We next examine the case $\tau_N = 0$. Let $n(t)$ and $N(f)$ now be the $(N-1)$th Ambiguity Transform stage noise output. For the Nth stage, we have $$\chi_N(f, \tau_1, \tau_2, \ldots, 0) = \int_{-T_I/2}^{T_I/2} |n(t)|^2 e^{-j2\pi f t} dt \quad (70)$$

and $$\overline{|\chi_N(f, \tau_1, \tau_2, \ldots, 0)|^2} = \quad (71)$$

$$\int_{-T_I/2}^{T_I/2} \int_{-T_I/2}^{T_I/2} \overline{|n(t)|^2 |n(\alpha)|^2} \, e^{-j2\pi f(t-\alpha)} dt \, d\alpha$$

$$= \begin{cases} T_I[R_n^2(0) + N(f)^*N(f)], & f = 0, \\ T_I[N(f)^*N(f)], & f > 1/T_I, \end{cases}$$

where we again assume $T_I >> 1/B_N$. The Nth-stage output consists of a term at $f=0$ (which is usually ignored by the system processors) and a convolution term similar to that for $\tau >> 1/B_N$ [Eq. (68)].

NARROWBAND INTERFERENCE

The above $\tau$-independence also exists for noise composed of several uncorrelated narrowband signals whose individual bandwidths $B_I$ are much smaller than $1/\tau$. This type of noise is commonly called narrowband interference. We define such interference as $$n(t) = \sum_k n_k(t) e^{j2\pi f_k t}. \quad (72)$$

With the above assumptions, we have approximately $$n(t)n^*(t-\tau_1) = \sum_k \sum_l n_k(t)n_l^*(t) e^{j2\pi(f_k-f_l)t} e^{-j2\pi f_l \tau_1} \quad (73)$$

and the Ambiguity Transform output becomes $$\chi_1(f, \tau_1) = \sum_k \sum_l e^{-j2\pi f_l \tau_1} \int_{-T_I/2}^{T_I/2} n_k(t)n_l^*(t) e^{-j2\pi(f+f_l-f_k)t} dt. \quad (74)$$

Thus, the Ambiguity Transform output is composed of narrow spectra at $f=0$ ($l=k$), and at all the possible difference frequencies $f=(f_k-f_l)$. Since one of these difference frequencies could be at the same frequency (say, $f_0$) as a true spectral line due to a Constant Phase digitally modulated signal, we examine Eq. (74) near $f = \pm f_0$:

$$\chi_1(\pm f_0, \tau_1) = \sum_{k=1}^{\eta} e^{-j2\pi f_k \tau_1} \int_{-T_I/2}^{T_I/2} d_k(t) dt, \quad (75)$$

where $\eta$ is the number of terms for which $$d_k(t) = \{n_k(t)n_l^*(t)\} \text{ such that } f_0 = f_k - f_l. \quad (76)$$

The interference noise power at $f_0$ is then $$\overline{|\chi(\pm f_0, \tau_1)|^2} = \sum_{k=1}^{\eta} \int_{-T_I/2}^{T_I/2} \int_{-T_I/2}^{T_I/2} \overline{d_k(t)d_k^*(\alpha)} \, dt \, d\alpha \quad (77)$$

$$\approx T_I = \sum_{k=1}^{\eta} \frac{P_k^2}{2}, \quad \tau_1 << 1/B_I,$$

where $P_k$ is the power in the kth narrowband interferer. Note that this result also applies to $\tau_1 = 0$.

The noise power is again independent of $\tau$. This result, combined with that derived for the wideband noise, permits the effective background noise estimation technique used in the receiver of this invention.

NOISE/INTERFERENCE POWER ESTIMATION

We have shown that there exist variations in $\tau$ to which the noise power is essentially insensitive, but to which the power in the receiver-generated spectral lines, due to appropriate signal presence, is very sensitive. This effect is exploited as follows.

The Ambiguity Transform output is generated at each stage for two (or more) values of $\{\tau_i\}$. The Reference Selectors 16 through 16N in FIG. 1 extract that output at values of $\{\tau_i\}$ which are designated not in the range that produces spectral lines if the appropriate signal is present (e.g., $\{\tau_i\} = 0$). The envelope-detected Reference Selector output is then compared with the envelope-detected Ambiguity Transform output at values of $\{\tau_i\}$ which are designated in that range $$\left( \text{e.g.}, \tfrac{1}{4}T \leq \sum_{i=1}^{N} \tau_i \leq \tfrac{3}{4}T \right).$$

Since the noise power is independent of $\{\tau_i\}$, the latter output will be larger by an amount equal to the power in the signal-derived spectral lines. If this difference exceeds a specified threshold, the Comparators 24 through 24N in FIG. 1 declare spectral line detection. If no signal is presented (only noise), both inputs to the Comparators will be the same and no detection is indicated.

The above process clearly tracks fluctuations in the noise and therefore results in a real-time, adaptive detection technique.

POSTINTEGRATION SIGNAL-TO-NOISE RATIOS AND INTERSTAGE FILTERING

Significant improvement in the postintegration signal-to-noise ratio at each receiver stage is obtained by band-limiting between stages, as shown in FIG. 1 by the presence of Variable Filters 14 through 14N. Of course, the first-stage bandwidth must not be significantly less than the anticipated received-signal bandwidth if the signal center frequency is known. If the center frequency is not known (the general case), the first-stage bandwidth should be larger.

Preceding sections have shown that, after the first stage, all terms involving the signal center frequency $f_c$ are eliminated. Thus, center frequency uncertainty is no longer a consideration and the bandwidth between any two stages may be significantly reduced. Table 5 shows the approximate allowable bandwidth reduction in terms of the signal bandwidth ($B_s$) and $\tau$ that preserves the spectral line power to within $-3$ dB.

TABLE 5

| Stage Input | INTERSTAGE BANDWIDTH Minimum Bandwidth | | |
|---|---|---|---|
| | C-Phase | L-Phase | Q-Phase |
| 1 | $\geq B_s$ | $\geq B_s$ | $\geq B_s$ |
| 2 | — | $\geq \dfrac{6}{\tau_1 + 4\tau_2}$ | $\geq \max\{R_n\tau_1\} + \dfrac{3}{\tau_1 + 4(\tau_2 + \tau_3)}$ |
| 3 | — | — | $\geq \dfrac{6}{\tau_1 + \tau_2 + 4\tau_3}$ |

In general, then, the interstage bandwidth may be changed as a function of the estimated signal bandwidth, the selected $\{\tau_i\}$, and the maximum anticipated value of the Quadratic Phase slope R.

For example, with $\tau_1 = \tau_2 = 0.1$ μsec and $\tau_3 = 0.8$ μsec, and a receiver input [s(t) in FIG. 1)] bandwidth of 20 MHz or more, the third-stage Variable Filter (14Q in FIG. 1) may have a bandwidth of only 1.8 MHz—that is, approximately one-tenth that of the receiver input bandwidth. In addition, with $R_n = 50$ MHz/μsec the second-stage Variable Filter (14L in FIG. 1) may have a bandwidth of only 5.2 MHz—that is, approximately one-fourth that of the receiver input bandwidth.

With band-limited white noise (power density $N_0$, bandwidth $B_N$) plus signal at the receiver input and interstage filtering, we may compute the postintegration signal-to-noise ratio ($SNR_O$) at each stage using the results from Table 5 and Eqs. (28), (40), (48), (56), and (69). These signal-to-noise ratios are shown in Table 6.

In Table 6, the term (TW) is the time-bandwidth product of the received signal, and the term ($SNR_{in}$) is the signal-to-noise ratio at the input to the first Ambiguity Transform stage:

$$(SNR_{in}) = \frac{A^2}{B_N N_0}. \tag{78}$$

The results presented in Table 6 show that the postintegration signal-to-noise ratio is proportional to the $2^n$ power of the input signal-to-noise ratio, the receiver processing gain $$(B_N T_I) \frac{(B_N T)^{2n-1-1}}{(TW)^{2n-1-2}},$$

and the ratio $$1/T \sum_{k=1}^{n} \tau_k.$$

Thus, long integration times and proper selection of the shift variables increase the detection signal-to-noise ratio.

TABLE 6

POSTINTEGRATION SIGNAL-TO-NOISE RATIO FOR EACH RECEIVER STAGE

| Stage | Modulation | $SNR_O$ |
|---|---|---|
| 1 | Constant Phase | $\dfrac{B_N T_I}{\pi^2} (SNR_{in})^2 \sin^2 \pi(1 - \tau_1/T)$ |
| 2 | Linear Phase | $\dfrac{3}{2} \left( \dfrac{B_N T_I}{\pi^2} \right) (B_N T)(SNR_{in})^4 \sin^2 \pi \left( 1 - \dfrac{\tau_1 + \tau_2}{T} \right)$ |
| 3 | Quadratic Phase | $2.1 \left( \dfrac{B_N T_I}{\pi^2} \right) \dfrac{(B_N T)^3}{(TW)^2} (SNR_{in})^8 \sin^2 \pi \left( 1 - \dfrac{\tau_1 + \tau_2 + \tau_3}{T} \right)$ |
| ⋮ | | |
| n | (n − 1)th-Order Phase | $\left( \dfrac{2^{2n-1}}{2^n} \right) \left[ \sum_{k=0}^{2^{n-1}-1} \dfrac{(-1)^k (2^n - 2k)^{2n-1}}{k!(2^n - k)!} \right]^{-1} \left( \dfrac{B_N T_I}{\pi^2} \right) \dfrac{(B_N T)^{2n-1-1}}{(TW)^{2n-1-2}} (SNR_{in})^{2n} \times \sin^2 \pi \left( 1 - \dfrac{\sum_{k=1}^{n} \tau_k}{T} \right) =$ $2^{(n-1)/2} \left( \dfrac{B_N T_I}{\pi^2} \right) \dfrac{(B_N T)^{2n-1-1}}{(TW)^{2n-1-2}} (SNR_{in})^{2n} \sin^2 \pi \left( 1 - \dfrac{\sum_{k=1}^{n} \tau_k}{T} \right)$ |

RECEIVER SEARCH TIME

Detection and classification of digitally modulated signals with the receiver of this invention involves a search in the sum $$\tau = \sum_{i=1}^{N} \tau_i.$$

This variable has been shown above to be related to the symbol rate (1/T) of the received signal, since the resulting spectral line power is a function of $\tau/T$. Specifically, spectral lines exist for $0 \leq \tau/T \leq 1$ and are maximum for $\tau/T = \frac{1}{2}$. The −3 dB power range is $\frac{1}{4} \leq \tau/T \leq \frac{3}{4}$. Therefore, for a selected value of $\tau$—say, $\tau_0$—the $-3$ dB range of possible spectral line locations is $$\frac{1}{4}(1/\tau_0) \leq f \leq \frac{3}{4}(1/\tau_0). \quad (79)$$

If the search in $\tau$ is conducted sequentially, then, to ensure complete coverage of spectral line locations, the sequential values of $\tau$ and corresponding spectral-line search ranges should be as shown in Table 7.

TABLE 7
SEQUENTIAL $\tau$-VALUES AND FREQUENCY RANGES

| Step | $\tau$-Value | Frequency Range | Bandwidth |
|---|---|---|---|
| 1 | $\tau_0$ | $(\frac{1}{4})(1/\tau_0) \leq f \leq 3(\frac{1}{4})(1/\tau_0)$ | $(\frac{1}{2})(1/\tau_0)$ |
| 2 | $3\tau_0$ | $3^{-1}(\frac{1}{4})(1/\tau_0) \leq f \leq (\frac{1}{4})(1/\tau_0)$ | $3^{-1}(\frac{1}{2})(1/\tau_0)$ |
| 3 | $9\tau_0$ | $3^{-2}(\frac{1}{4})(1/\tau_0) \leq f \leq 3^{-1}(\frac{1}{4})(1/\tau_0)$ | $3^{-2}(\frac{1}{2})(1/\tau_0)$ |
| . | | | |
| . | | | |
| n | $3^{n-1}\tau_0$ | $3^{-(n-1)}(\frac{1}{4})(1/\tau_0) \leq f \leq 3^{-(n-2)}(\frac{1}{4})(1/\tau_0)$ | $3^{-(n-1)}(\frac{1}{2})(1/\tau_0)$ |

From the above table, it is clear that the spectral-line search bandwidth decreases exponentially with each step in $\tau$. If the range of values (uncertainty) for the symbol rate is specified as $T_{min} \leq T \leq T_{max}$, then $\tau_{max}/\tau_{min} = T_{max}/T_{min}$ and the number of steps ($N_s$) in $\tau$ required to completely cover all possible values is $$N_s = 1 + \log_3\left(\frac{T_{max}}{T_{min}}\right). \quad (80)$$

The maximum search bandwidth is then $1/T_{min}$, whereas the minimum is $3^{-(N_s-1)}(1/T_{min})$.

Equation (80) shows a logarithmic relationship between the number of required steps in $\tau$ and the signal uncertainty. This allows relatively few steps for large $T_{max}/T_{min}$. For example, an uncertainty of 1 ns to 1 $\mu$s requires only eight steps (1 ns, 3 ns, ..., 729 ns, 2.19 $\mu$s). For a given integration time $T_I$, the total sequential search time $T_s$ is $N_s T_I$:

$$T_s = T_I\left[1 + \log_3\left(\frac{T_{max}}{T_{min}}\right)\right]. \quad (81)$$

Using Eq. (81) and Table 6, we may derive the required sequential search time for each receiver stage. The results are listed in Table 8.

TABLE 8
SEQUENTIAL SEARCH TIME FOR EACH RECEIVER STAGE

| Stage | Modulation | Sequential Search Time |
|---|---|---|
| 1 | Constant Phase | $\left[1 + \log_3\left(\frac{T_{max}}{T_{min}}\right)\right]\left(\frac{SNR_0}{SNR_{in}^2}\right)\left(\frac{\pi^2}{B_N}\right)$ |
| 2 | Linear Phase | $2/3\left[1 + \log_3\left(\frac{T_{max}}{T_{min}}\right)\right]\left(\frac{SNR_0}{SNR_{in}^4}\right)\left(\frac{\pi^2}{B_N}\right)\left(\frac{1}{B_N T}\right)$ |
| 3 | Quadratic Phase | $1/2\left[1 + \log_3\left(\frac{T_{max}}{T_{min}}\right)\right]\left(\frac{SNR_0}{SNR_{in}^8}\right)\left(\frac{\pi^2}{B_N}\right)\frac{(TW)^2}{(B_N T)^3}$ |
| . | | |
| . | | |
| n | (n − 1)th-Order Phase | $2^{(1-n)/2}\left[1 + \log_3\left(\frac{T_{max}}{T_{min}}\right)\right]\left(\frac{SNR_0}{SNR_{in}^{2n}}\right)\left(\frac{\pi^2}{B_N}\right)\frac{(TW)^{2n-1-2}}{(B_N T)^{2n-1-1}}$ |

NOTE: $SNR_0$ is the postintegration SNR.

HYBRID PROCESSOR SUBSYSTEM

The detection of the presence of hybrid signals, such as Constant/Linear Hybrid and Amplitude/Phase Hybrid signals, is possible employing this invention. Such detection is accomplished by the processing of the signal path in the circuitry of FIG. 9 following envelope detection in Detectors 20 through 20N (of FIG. 1).

Referring now to FIG. 9, it may be seen that the envelope-detected signals from FIG. 1 are introduced into a hybrid Signal Selector 150 in which the desired f and $\tau$ have been selected. The output of the Signal Selector 150 is Fourier-transformed in Fourier Transform or Filter Bank 151 and next compared with a threshold level in hybrid Comparator 152. If the Fourier-transformed hybrid signal contents exceed the threshold set, the presence of hybrid modulation is indicated and introduced into the Detection Logic circuit 200 to be verified in accordance with the logic flow diagram of FIG. 8.

AN OPERATIONAL SYSTEM EMBODIMENT

FIGS. 10a, 10b, and 10c show the block diagram of an operational system in accordance with this invention. Each of the three drawings depicts a respective stage 213, 230, and 240 corresponding to stages 13, 30, and 40 of FIG. 1. In this case, the band of frequencies to be examined for the presence of signals is introduced at the input port 211 comparable to the antenna 11 of FIG. 1. Where other comparable elements of the system are found in FIGS. 10a, 10b, and 10c, they bear reference numerals corresponding to FIG. 1 but in the 200 series.

In the case of FIG. 10, the band of frequencies to be examined is conditioned to have a center frequency corresponding to the center frequency of the Bandpass Filter 214, e.g., 6 MHz. Referring to FIG. 10a, the band is thereafter introduced into the three-output port 0° phaseshift signal Splitter 201. The band from one port is mixed in Mixer 202 with a reference frequency $f_0$ from a local Oscillator 203 of FIG. 10b over line 204, filtered in Bandpass Filter 205, amplified, and split into signal and noise paths by 0° signal Splitter 206.

The incoming signal from Splitter 201 and its frequency shifted counterpart from Splitter 206 are multiplied in Noise Multiplier 207 to provide the noise reference in the noise path through Bandpass Filter 208. This signal is available at Noise PDS jack 209.

The third path on lead 210 from Splitter 201 is amplified, fixed-delayed, and introduced into a tapped Delay line 217 having a number (e.g., 10) of taps from 0 to 1 $\mu$sec. A delay selector switch 218 includes a "1 of 10" output port and four BCD control input lines 219 from the selector signal and delay Selector Switch 221 of FIG. 10c. The Selector Switch 218 acts like a rotary switch to select the appropriate delay for the signal path as selected by the BCD code on leads 219.

The incoming signal at the selected delay from tapped delay line 217 is amplified and multiplied in Signal Multiplier 227, filtered in Bandpass Filter 228, and available at the signal jack 229. The signal from the Filter 228 is split in three-output port 0° Splitter 231 where, after mixing in Mixer 232 with frequency $f_1$ from local Oscillator 233 of FIG. 10b, it is introduced into the succeeding stage 230 via Bandpass Filter 234.

Referring again to the noise path of FIG. 10a, the noise reference is amplified, split in Splitter 235, and mixed in two mixers (the I and Q Mixers 236 and 237, respectively), where the noise reference is mixed with a selected frequency from a Frequency Synthesizer 238 under the control of a front-panel frequency-select switch and represented by Switch 221 over leads 239. The selected frequency, designated $F_1$, is furnished to both the noise reference channel and the signal channel via Bandpass Filter 241, Splitter 242, and respective signal Splitters 243 and 244, each including one port shifted 90° with respect to the other port to allow the derivation of the in-phase I and quadrature Q components of the signal channel content.

The noise reference, after mixing in each of the I and Q channels, is low-pass filtered, amplified, and squared, then combined in summer 245 to provide a composite noise reference on lead 246. The level of this reference may be read on meter 247 and is introduced into Comparator 248, which has an adjustable threshold under the threshold Select Control 249.

Signal information, after processing in an identical manner in the signal channel by mixing in Mixers 260 and 261, is low-pass filtered, and squared, then combined in summer 262. The I and Q components of the signal channel are available at jacks 263 and 264, respectively.

The Comparator 248 includes an additional input from the signal channel over lead 251. If the signal on lead 251 exceeds the reference signal on lead 246 by the amount of the threshold selected, an indicator lamp 252 is illuminated and a YES/NO signal indicates that condition is present at jack 253. The magnitude of the signal—i.e., the $I^2+Q^2$ level of Constant Phase signal content in the band of received frequencies—is indicated on Meter 254 and available at jack 255.

The Linear Phase Detector Stage 230 of FIG. 10b is virtually identical with the Constant Phase Detector Stage 213 described above, and comparable elements carry the same reference numerals with a suffix L, similar to FIG. 1. The Synthesizer 238L of the Stage 230 is switchable to frequency F2, which may be different from the frequency F1 of the Stage 213. In operation, the Indicator Lamp 252L will be illuminated whenever the Stage 230 detects the presence of Linear Phase modulation and the magnitude $I^2+Q^2$ is indicated on Meter 254L and available at jack 255L.

The Quadratic Phase Detector Stage 240 of FIG. 10c is virtually identical with the previous stages except that it is missing the last frequency converter comparable to Mixers 232 and 232L of the previous stages. The Stage 240 detects the presence of Quadratic Phase modulation, which is indicated by the illumination of lamp 252Q and is displayed in magnitude on Meter 254Q and available at jack 255Q.

The input and output frequencies of each stage are the same, allowing the stages to be cascaded and to simultaneously search the input band for different types of modulation.

METHOD OF THIS INVENTION

The method of this invention is illustrated not only in the equations set forth above but also in FIGS. 6 and 7, which show the signal-band processing steps that ensure detection and classification of signals. FIGS. 6 and 7 show the transformations carried out in each of the cascaded stages as well as the signal form within each stage.

We have therefore demonstrated that, by employing our new receiver and method, it is possible to detect and classify signals in a frequency band without advance knowledge of their carrier frequency, modulation type, or modulation rate. After detection, one or many signals in the band may be classified. The method of this invention is carried out through the presence of a novel reference and signal Ambiguity Transform subsystem and the cascading of sections, each of which detects different forms of modulation. The invention is described generally in terms of analog functions; however, the processing of signals in digital form in accordance with this teaching is contemplated and fully within the concept of this invention.

The foregoing embodiments are merely illustrative of this invention and are not to be considered limiting. Rather, this invention is defined by reference to the following claims, including their equivalents.

We claim:

1. A signal detector comprising a plurality of cascaded stages;
   the first of said stages including means for detecting the presence of constant phase modulation in a received band of frequencies;

at least one additional stage of said cascaded stages including means for detecting a higher order of phase modulation, e.g. linear, quadratic—n order modulation; and means associated with said stages for indicating the presence and order of phase modulation present in the received band of frequencies.

2. The combination in accordance with claim 1 includng n stages wherein n is a positive integer including means for detecting signals of (n−1)th order phase modulation.

3. The combination in accordance with claim 1 wherein said additional stage includes means for detecting signals of linear phase.

4. The combination in accordance with claim 1 including means responsive to the failure to detect a signal in one stage for enabling the next succeeding stage.

5. A signal detector comprising a plurality of cascaded stages;

the first of said stages including means for detecting the presence of constant phase modulation in a received band of frequencies;

at least one additional stage of said cascaded stages including means for detecting a higher order of phase modulation, e.g. linear, quadratic—n order modulation; and means associated with said stages for indicating the presence and order of phase modulation present in the received band of frequencies;

wherein said detecting means includes ambiguity transforming means for (a) processing the received band of frequencies through a plurality of paths having different delays, (b) combining pairs of differently delayed bands of frequencies, and (c) Fourier transforming the combined pairs, to provide an output which includes an indication of the frequency and phase of discrete signal content in the band of frequencies.

6. A signal detector comprising a plurality of cascaded stages;

the first of said stages including means for detecting the presence of constant phase modulation in a received band of frequencies;

at least one additional stage of said cascaded stages including means for detecting a higher order of phase modulation, e.g. linear, quadratic—n order modulation; and means associated with said stages for indicating the presence and order of phase modulation present in the received band of frequencies;

wherein said detecting means includes ambiguity transforming means for (a) processing the received band of frequencies through a plurality of paths having different delays, (b) combining pairs of differently delayed bands of frequencies, and (c) Fourier transforming the combined pairs, to provide an output which includes an indication of the frequency and phase of discrete signal content in the band of frequencies;

including a third stage including means for detecting signals of quadratic phase.

7. A signal detector comprising a plurality of cascaded stages;

the first of said stages including means for detecting the presence of constant phase modulation in a received band of frequencies;

at least one additional stage of said cascaded stages including means for detecting a higher order of phase modulation, e.g. linear, quadratic—n order modulation; and means associated with said stages for indicating the presence and order of phase modulation present in the received band of frequencies;

wherein said detecting means includes ambiguity transforming means for (a) processing the received band of frequencies through a plurality of paths having different delays, (b) combining pairs of differently delayed bands of frequencies, and (c) Fourier transforming the combined pairs, to provide an output which includes an indication of the frequency and phase of discrete signal content in the band of frequencies;

wherein said ambiguity transforming means includes means for producing the conjugate of the band of frequencies and for delaying by different amounts the conjugate of said band of frequencies prior to combining the Fourier transforming, and including means for combining said delayed band of frequencies with one of said delayed conjugate band of frequencies prior to Fourier transforming as a reference.

8. The combination in accordance with claim 7 including selecting means coupled to the output of said combining means for allowing the introduction of said combined variable delayed band of frequencies into a subsequent stage.

9. The combination in accordance with claim 7 including selecting means coupled to the output of said Fourier transforming means for allowing the introduction of said combined variable delayed band of frequencies into a subsequent stage.

10. A signal detector comprising a plurality of cascaded stages;

the first of said stages including means for detecting the presence of constant phase modulation in a received band of frequencies;

at least one additional stage of said cascaded stages including means for detecting a higher order of phase modulation, e.g. linear, quadratic—n order modulation; and means associated with said stages for indicating the presence and order of phase modulation present in the received band of frequencies;

wherein said detecting means includes ambiguity transforming means for (a) processing the received band of frequencies through a plurality of paths having different delays, (b) combining pairs of differently delayed bands of frequencies, and (c) Fourier transforming the combined pairs, to provide an output which includes an indication of the frequency and phase of discrete signal content in the band of frequencies;

wherein said ambiguity transforming means comprises means defining a plurality of parallel paths for transmission of a band of frequencies;

at least two of said parallel paths having different delays;

means in one of said paths for frequency-translating the band of frequencies in said path to a preselected frequency band;

means for combining pairs of the outputs of said paths;

means for filtering the output of said combining means to restrict their output to a preselected band of frequencies;

means for complex frequency translation of the output of said fiters to provide a composite of said variably delayed and combined frequency bands; and means for Fourier transforming the output of said complex frequency translating means to produce an indication of at least one of the following: signal frequency, symbol rate, or symbol phase of signals present in the original band of frequencies.

11. The combination in accordance with claim 10 including selecting means coupled to the output of said combining means for allowing the introduction of the output of said combining means into a subsequent stage.

12. A signal detector comprising a plurality of cascaded stages;

the first of said stages including means for detecting the presence of constant phase modulation in a received band of frequencies;

at least one additional stage of said cascaded stages including means for detecting a higher order of phase modulation, e.g. linear, quadratic—n order modulation; and means associated with said stages for indicating the presence and order of phase modulation present in the received band of frequencies;

wherein said detecting means includes ambiguity transforming means for (a) processing the received band of frequencies through a plurality of paths having different delays, (b) combining pairs of differently delayed bands of frequencies, and (c) Fourier transforming the combined pairs, to provide an output which includes an indication of the frequency and phase of discrete signal content in the band of frequencies;

wherein said ambiguity transforming means comprises means for conditioning an incoming signal to produce the analytic function $\mu(t)$ thereof;

means for processing the conditioned signal from said conditioning means through a plurality of paths of different delays;

means for processing the unconditioned signal through path of different delay;

means for combining respective pairs of the signal from said paths of different delays; and a filter bank coupled to the outputs of said combining means.

13. A signal detector comprising a plurality of cascaded stages;

the first of said stages including means for detecting the presence of constant phase modulation in a received band of frequencies;

at least one additional stage of said cascaded stages including means for detecting a higher order of phase modulation, e.g. linear, quadratic—n order modulation; and means associated with said stages for indicating the presence and order of phase modulation present in the received band of frequencies;

wherein said detecting means includes ambiguity transforming means for (a) processing the received band of frequencies through a plurality of paths having different delays, (b) combining pairs of differently delayed bands of frequencies, and (c) Fourier transforming the combined pairs, to provide an output which includes an indication of the frequency and phase of discrete signal content in the band of frequencies;

wherein said ambiguity transforming means comprises means for conditioning an incoming signal to produce the analytic function $\mu(t)$ thereof;

means for processing the conditioned signal from said conditioning means through a plurality of paths of different delays;

means for processing the unconditioned signal through a path of different delay;

means for combining respective pairs of the signal from said paths of different delays; and means for developing the Fourier transform of the outputs of said combining means.

14. The method of detecting and classifying modulation in a band of frequencies comprising the steps of:

(A) processing the band of frequencies for which the type and characteristics of modulation present are sought to be detected and classified in at least three different paths, each having different delay;

(B) combining pairs of the results of the band of frequencies at the different delays;

(C) measuring the frequency content of the combined results;

(D) selecting one of the combined pairs as a reference; and (E) comparing the energy content of the combined pairs with the reference to indicate the presence of constant phase modulation when the results of the combining steps of any other than the reference exceed the reference in level.

15. The method in accordance with claim 14 wherein the conjugate of the band of frequencies is developed for each delay except that selected as the reference.

16. The method in accordance with claim 14 wherein the step of measuring the frequency content of the combined results is done by developing the Fourier transform thereof.

17. The method of detecting and classifying modulation in a band of frequencies comprising the steps of:

(A) processing the band of frequencies for which the type and characteristics of modulation present are sought to be detected and classified in at least three different paths, each path having different delay;

(B) combining pairs of the results of the band of frequencies at the different delays;

(C) measuring the frequency content of the combined results;

(D) selecting one of the combined pairs as a reference; and (E) comparing the energy content of the combined pairs with the reference to indicate the presence of constant phase modulation when the results of the combining steps of any other than the reference exceed the reference in level; and (F) repeating the steps (A), (B), (C), (D) and (E) with the combined output of step (B) and thereby deriving an indication of the presence of linear phase modulation in the band of frequencies.

18. The method in accordance with claim 17 including the steps of repeating the steps (A), (B), (C), (D) and (E) of claim 14 with the combined output of the step (B) of claim 17 and thereby deriving an indication of the presence of quadratic phase modulation in the band of frequencies.

19. The method in accordance with claim 18 including the steps of repeating the steps (A), (B), (C), (D) and (E) of claim 14 with the combined output of step (B) of claim 18 and thereby deriving an indication of the presence of a higher order than quadratic phase modulation.

20. The method in accordance with claims 17, 18 or 19 including the step of repeating the steps (A), (B), (C) (D) and (E) only when the preceeding steps (A), (B), (C), (D) and (E) do not produce an indication of the presence of modulation of the class detected by that combination.

21. The method in accordance with claim 14 including the step of frequency-translating the band of frequencies at the delay used as a reference prior to combining with the band at another delay and similarly frequency-translating the combined results of the band at other delays.

22. A signal detector comprising
means for receiving a band of frequencies to be examined for signal content;
a stage for simultaneously passing said band of frequencies through different paths, each path having a different delay;
means for combining at least one pair of outputs of said paths having different delays;
means for producing a representation of the energy content of said combined pair of outputs;
means for producing a representation of the energy content of the band of frequencies including the band passing through a path of different delay to constitute a reference; and
means for comparing the relative energy content of said combined pair of outputs with the energy content of said reference to produce an output constituting an indication of the presence of constant phase modulation in said band of frequencies as received.

23. The combination in accordance with claim 22 including:
a second stage for introducing the results of said combining means into a plurality of paths of different delay;
said second stage comprising;
means for combining at least one pair of the outputs of said last plurality of paths;
means for producing a representation of the energy of said combined pair of the outputs of said last combining means;
means for producing a representation of the energy content of the input band of frequencies to the second stage including the band passing through a path of different delay to constitute a reference; and
means for comparing the relative energy content of said last combined pair of outputs with the energy content of said reference to produce an output constituting an indication of the presence of linear phase modulation in said band of frequencies as received.

24. The combination in accordance with claim 23 including:
a third stage for introducing the results of said last combining means into a plurality of paths of different delay;
said third stage comprising;
means for combining at least one pair of the outputs of said last plurality of paths;
means for producing a representation of the energy content of said combined pair of the outputs of said last combining means;
means for producing a representation of the energy content of the input band of frequencies to the third stage including the band passing through a path of different delay to constitute a reference; and
means for comparing the relative energy content of said last combined pair of outputs with the energy content of said reference to produce an output constituting an indication of the presence of quadratic phase modulation in said band of frequencies as received.

25. The combination in accordance with claim 22 including an Nth stage where N is an integer greater than 3 for introducing the results of the last previous combining means into a plurality of paths of different delay;
said Nth stage comprising;
means for combining at least one pair of the outputs of said last plurality of paths;
means for producing a representation of the energy content of said combined pair of the outputs of said last combining means;
means for producing a representation of the energy content of the input band of frequencies of the Nth state including the band passing through one of said paths of different delay to constitute a reference; and
means for comparing the relative energy content of said last combined pair of outputs with the energy content of said reference to produce an output constituting an indication of the presence of (N−1)th order phase modulation in said band of frequencies as received.

26. The combination in accordance with claims 22, 23, 24, or 25 wherein said means for producing a representation of the energy content comprises means for performing a Fourier transform.

27. The combination in accordance with claims 22, 23, 24, or 25 wherein said means for producing a representation of the energy content includes a bank of filters.

28. The combination in accordance with claims 22, 23, 24, or 25 including means for combining the output of the path constituting the reference with the output of a path of different delay prior to producing a representation thereof.

29. The combination in accordance with claims 22, 23, 24, or 25 including means for deriving the symbol rate of signal energy content in said band.

30. The combination in accordance with claims 22, 23, 24, or 25 including means in which at least two of said signal paths for deriving the conjugate of the signal band and said conjugates are combined.

31. The combination in accordance with claims 22, 23, 24, or 25 including means for selecting particular ranges of values of f and τ from the output of said representation-producing means;

means for extracting phase information with respect to a time reference of said signal detector from any signals having the selected parameters; and means for combining the output of said phase-extracting means to provide indications of the symbol phase of signal energy content in said band.

32. The combination in accordance with claims 22, 23, 24, or 25 including means for controlling the delay in said paths.

33. The combination in accordance with claim 32 wherein said means for controlling the delay in said paths includes means for selecting a series of delays encompassing the range of possible symbol durations of modulation in the band of frequencies examined for signal content.

34. The combination in accordance with claim 32 wherein said means for controlling the delay in said paths includes means for selecting a series of delays encompassing the range of modulation rates of possible modulation in the band of frequencies examined for signal content.

35. The combination in accordance with claims 22, 23, 24, or 25 wherein said stages include means for selecting particular ranges of values of frequency from the output of said representation-producing means constituting a reference;

threshold means for said selecting means;

means for comparing the output of said selecting means with the output of said representation-producing means from said combining means; and means responsive to an output of said comparing means wherein the signal level from said selecting means exceeds the output of said representation-producing means from said combining means by an amount above said threshold, whereby a valid modulation signal is deemed present with the parameters selected by said selecting means.

36. The combination in accordance with claim 35 including means for envelope-detecting the output of said representation-producing means of said combining means and said selecting means prior to comparing in said comparing means.

37. The combination in accordance with claim 36 wherein said time reference constitutes the signal detector clock.

38. The combination in accordance with claim 25 including logic means for enabling said stages in sequence responsive to the failure of detection of a coherent signal by the previous stage.

39. The combination in accordance with claim 22 including means for frequency-translating the frequency band in at least one of said paths prior to combination;

bandpass filter means coupled to the output of said combiners to restrict the band to about the difference frequency of the inputs to said combining means;

means for frequency-translating said combined filtered signals to a predetermined base band; and means for producing a representation of the energy content at different frequencies of the filtered combined outputs.

40. The combination in accordance with claim 22 including means for deriving the frequency of signal energy content in said band.

41. The combination in accordance with claim 22 including means for selecting the bandwidth of the band of frequencies introduced into said stages.

42. The combination in accordance with claim 22 including means for selecting a threshold for said reference path whereby the presence or absence of a valid signal is determined by reference to said selected threshold level.

43. A signal detector comprising means for delaying a band of frequencies to be examined for signal content;

means for frequency-shifting said band of frequencies;

first means for multiplying said frequency-shifted band of frequencies with the band of frequencies to obtain the product thereof;

means for developing a signal indicative of the energy content of said product as a reference;

second means for multiplying said frequency-shifted band of frequencies with the delayed band of frequencies from said delaying means to obtain the product thereof;

means for developing a signal indicative of the energy content of said product of the last means; and means for comparing the levels of energy of said signals wherein greater energy in said latter signal is indicative of the presence of constant phase modulation in the band of frequencies examined.

44. The combination in accordance with claim 43 including a second stage duplicating said detector of claim 43 coupled to said means for multiplying the frequency-shifted band of frequencies with the delayed band of frequencies whereby the presence of linear phase modulation in said band of frequencies is detected.

45. The combination in accordance with claim 44 including a successive stage duplicating said last stage for detecting the presence of higher-order modulation in said band of frequencies.

46. The combination in accordance with claim 43 wherein said reference-signal-developing means comprises means for developing the in-phase and quadrature components of the product of said multiplying means; and means for combining said in-phase and quadrature means.

47. The combination in accordance with claim 43 wherein said means for developing a signal indicative of the energy content of said last means comprises means for developing the in-phase and quadrature components of the product of said second multiplying means; and means for combining said in-phase and quadrature components.

48. The combination in accordance with claims 46 or 47 wherein said combining means comprises an adder.

49. The combination in accordance with claim 43 wherein said delay means comprises a tapped delay line.

50. The combination in accordance with claim 49 including switch means for selecting a delay of said tapped delay line for delaying said band of frequencies by a predetermined amount.

51. The combination in accordance with claim 43 including a local frequency source;

means for mixing both said reference signal and said second signal prior to comparing; and means for changing said local frequency source to produce a summed signal at different frequencies.

52. The combination in accordance with claim 43 including threshold means for said comparing means for establishing a threshold for said second signal above the level of said first signal before a valid signal indication is indicated.

53. The combination in accordance with claim 43 including means coupled to the output of said second-signal-developing means as an indication of the magnitude and symbol duration of signals detected.

54. A signal detector comprising
means for variably delaying a band of frequencies including the range in which signals are sought to be detected;
means for multiplying said band of frequencies at different delays to obtain the product thereof;
means for comparing the energy content of the products of multiplication at different delays;
means for selecting one of said products as a reference; and
means for indicating the presence of signals when one of said products at said comparing means exceeds the level of said reference.

55. A signal detector for detecting hybrid modulation comprising
means for receiving a band of frequencies to be examined for signal content;
a stage for simultaneously passing said band of frequencies through different paths, each path having a different delay;
means for combining at least one pair of outputs of said paths having different delays;
first means for producing a representation of the energy content of said combined pair of outputs;
second means for producing a representation of the energy content of the band of frequencies including the band passing through a path having a different delay to constitute a reference;
means for comparing the relative energy content of said combined pair of outputs with the energy content of said reference to produce an output constituting an indication of the presence of a first modulation in said band of frequencies as received; and
third means for producing a representation of the energy content of the output of said first means to produce an indication of the presence of a second modulation.

56. The combination in accordance with claim 55 wherein said third means comprises a Fourier transform.

57. The combination in accordance with claim 55 wherein said third means comprises a filter bank.

58. The combination in accordance with claim 55 including
means defining a threshold for defining a level above which a valid second modulation is indicated; and
comparator means for indicating second modulation presence when the energy content from said third means exceeds the level set by said threshold-defining means.

59. The combination in accordance with claim 55 including signal selector means for selecting at least one of f and τ for a desired signal prior to introduction into said third means whereby second modulation of said desired signal may be detected.

60. The combination in accordance with claims 1, 3, 6, 2, 23, 25, 44 or 45 including interstage filters therebetween having decreasing bandwidth for succeeding stages.

61. The combination in accordance with claims 1, 3, 6, 2, 23, 25, 44 or 45 including interstage filters therebetween having for each stage a bandwidth varying inversely with the sum of the stage delay of the preceding and resent stage.

62. The combination in accordance with claims 1, 3, 6, 2, 23, 25, 44 or 45 including a narrow-bandwidth filter haing bandwidth of the order of 1/10 or narrower than the bandwdth of said band of frequencies.

* * * * *